United States Patent
Okada et al.

(10) Patent No.: US 7,953,956 B2
(45) Date of Patent: May 31, 2011

(54) RECONFIGURABLE CIRCUIT WITH A LIMITATION ON CONNECTION AND METHOD OF DETERMINING FUNCTIONS OF LOGIC CIRCUITS IN THE RECONFIGURABLE CIRCUIT

(75) Inventors: Makoto Okada, Daito (JP); Tatsuo Hiramatsu, Kadoma (JP); Hiroshi Nakajima, Kyoto (JP); Makoto Ozone, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 545 days.

(21) Appl. No.: 11/016,904

(22) Filed: Dec. 21, 2004

(65) Prior Publication Data

US 2005/0134308 A1   Jun. 23, 2005

(30) Foreign Application Priority Data

Dec. 22, 2003   (JP) .................. 2003-425657

(51) Int. Cl.
  *G06F 15/76*   (2006.01)
(52) U.S. Cl. .......................... 712/11; 712/10
(58) Field of Classification Search .............. 712/10, 712/11, 15, 18, 226
  See application file for complete search history.

(56) References Cited

U.S. PATENT DOCUMENTS

| | | | | |
|---|---|---|---|---|
| 5,872,944 A | * | 2/1999 | Goldrian et al. | 710/305 |
| 5,892,962 A | * | 4/1999 | Cloutier | 712/16 |
| 6,356,993 B1 | * | 3/2002 | Jackson | 712/11 |
| 6,360,355 B1 | * | 3/2002 | Nishida et al. | 716/18 |
| 2004/0019765 A1 | * | 1/2004 | Klein, Jr. | 712/15 |

FOREIGN PATENT DOCUMENTS

| | | |
|---|---|---|
| JP | 09-185865 | 7/1997 |
| JP | 9-294069 | 11/1997 |
| JP | 10-256383 | 9/1998 |

OTHER PUBLICATIONS

The Garp architecture and C compiler Callahan, T.J.; Hauser, J.R.; Wawrzynek, J. Computer, vol. 33, Iss.4, Apr. 2000 pp. 62-69.*

A design space evaluation of grid processor architectures Nagarajan, R.; Sankaralingam, K.; Burger, D.; Keckler, S.W. Microarchitecture, 2001. MICRO-34. Proceedings. 34th ACM/IEEE International Symposium on, vol. Iss., Dec. 1-5, 2001 pp. 40-51.*

(Continued)

*Primary Examiner* — Jacob Petranek
(74) *Attorney, Agent, or Firm* — McDermott Will & Emery LLP

(57) ABSTRACT

A reconfigurable circuit of reduced circuit scale. The reconfigurable circuit of the present invention comprises a plurality of ALUs capable of changing functions. The plurality of ALUs are arranged in a matrix. At least one connection unit capable of establishing connection between the ALUs selectively is provided between the stages of the ALUs. This connection unit is not intended to allow connection between all the logic circuits in adjoining stages, but is configured so that the logic circuits are each connectable with only some of the logic circuits pertaining to the other stages. The connection limitation allows a reduction in circuit scale.

3 Claims, 44 Drawing Sheets

OTHER PUBLICATIONS

Callahan, T. J., Chong, P., DeHon, A., and Wawrzynek, J. 1998. Fast module mapping and placement for datapaths in FPGAs. In Proceedings of the 1998 ACM/SIGDA Sixth international Symposium on Field Programmable Gate Arrays (Monterey, California, United States, Feb. 22-25, 1998). FPGA '98. ACM Press, New York, NY, 123-132. DOI= http://doi.acm.o.*

Mendelson, B. and Silberman, G. M. 1987. Mapping data flow programs on a VLSI array of processors. In Proceedings of the 14th Annual international Symposium on Computer Architecture (Pittsburgh, Pennsylvania, United States, Jun. 2-5, 1987). D. St. Clair, Ed. ISCA '87. ACM Press, New York, NY, 72-80. DOI= http://doi.acm.org/10.1145/30350.30359.*

SOP: a reconfigurable massively parallel system and its control-dataflow based compiling method Yamauchi, T.; Nakaya, S.; Kajihara, N. FPGAs for Custom Computing Machines, 1996. Proceedings. IEEE Symposium on, vol. Iss., Apr. 17-19, 1996 pp. 148-156.*

Temporal partitioning and scheduling data flow graphs for reconfigurable computers Puma, K.M.G.; Bhatia, D. Computers, IEEE Transactions on, vol. 48, Iss.6, Jun. 1999 pp. 579-590.*

Saito et al. "Control signal sharing using data-path delay information at control data flow graph descriptions" Proceedings of the ninth international symposium on asynchronous circuits and systems, May 2003, pp. 184-193.*

Japanese Office Action, with English translation, issued in Japanese Patent Application No. JP 2003-425657, mailed Oct. 30, 2007.

European Search Report, issued in corresponding European Patent Application No. 04106526.9-1243, dated on Nov. 19, 2007.

Cadambi et al. "Efficient Place and Route for Pipeline Reconfigurable Architectures" International Conference on Computer Design, 2000, IEEE Sep. 2000, pp. 423-429.

Budiu et al. "Fast Compilation for Pipelined Reconfigurable Fabrics", International Symposium on Field Programmable Gate Arrays, FPGA, Feb. 1999, pp. 195-205.

Goldstein et al., "PipeRench: a Coprocessor for Streaming Multimedia Acceleration", Computer Architecture News, ACM, vol. 27, No. 2 May 1999, pp. 28-39.

European Office Action issued in European Patent Application No. EP 04106526.9-1243, dated May 14, 2008.

Japanese Notification of Reasons for Refusal, with English Translation, issued in Japanese Patent Application No. 2007-337374, dated Dec. 22, 2009.

Naoya Hattori et al., "Preliminary Evaluation on a Code Generation System for VLDP3," IPSJ SIG Notes (Technical Report in Information Processing Society of Japan), Jan. 2003, vol. 2003, No. 10, pp. 55-60.

Chinese Rejection Decision, w/ English translation thereof, issued in Chinese Patent Application No. CN 200410097945.6 dated Mar. 18, 2010.

* cited by examiner

```
int main(int a, int b) {
    int x = 2 * a;
    int y = 5 * b;
    return (x + y);
}
```

FIG.16

```
int main(int a, int b) {
    int r1, r2, r3, r4, tmp;
    tmp = -a;
    r1 = tmp + 1;
    r2 = tmp + b;
    r3 = tmp - 1;
    r4 = tmp - b;
    return (r1 + r2) + (r3 + r4);
}
```

```
int main(int a, int b) {
  int x, y;
  if(a > 1)  x = a + 1;
  else       x = a - 1;
  if(b > 1)  y = b + 1;
  else       y = b - 1;
  return x + y;
}
```

RECONFIGURABLE CIRCUIT WITH A LIMITATION ON CONNECTION AND METHOD OF DETERMINING FUNCTIONS OF LOGIC CIRCUITS IN THE RECONFIGURABLE CIRCUIT

BACKGROUND OF THE INVENTION

1. Field of the Invention

The invention relates to integrated circuit technologies, and more particularly to a processor having a reconfigurable circuit, and the like.

2. Description of the Related Art

Recently, reconfigurable processors capable of changing their hardware operations depending on applications have been under development. Among the architectures for realizing reconfigurable processors are ones using digital signal processors (DSPs) and field programmable gate arrays (FPGAs).

With FPGAs (Field Programmable Gate Arrays), circuit configurations can be designed relatively freely by writing circuit data after the fabrication of the large-scale integration (LSI). FPGAs are used for designing dedicated hardware. An FPGA includes basic cells and programmable wiring resources for linking the basic cells. The basic cells each have a look-up table (LUT) for storing a truth table of the logic circuit, and a flip-flop for output. With FPGAs, intended logic operations can be realized by writing both the data to be stored into the LUTs and wiring data. LSIs designed by using FPGAs, however, have extremely large packaging areas and high costs as compared to when designed by using application specific ICs (ASICs). Then, there has been proposed a method in which an FPGA is dynamically reconfigured to reuse the circuit configuration (for example, see Japanese Patent Laid-Open Publication No. Hei 10-256383).

FPGAs are high in the design flexibility of the circuit configuration and thus have high versatility. Nevertheless, they must include a large number of switches and a control circuit for controlling on/off the switches in order to allow connections among all the basic cells. The control circuit thus inevitably increases the packaging area. Moreover, the connections among the basic cells tend to require a complicated wiring pattern with greater wiring lengths, even with a number of switches connected to each of the wires. Longer delays thus develop from this structure. On that account, FPGA-based LSIs often remain in prototyping and experimental uses, and are unsuitable for mass production in view of packaging efficiency, performance, cost, etc. In addition, FPGAs require that configuration information be transmitted to a number of basic cells of LUT type. It thus consumes considerable time to configure the circuits. Consequently, FPGAs are not suited to applications where circuit configuration need to be switched instantaneously.

To solve the foregoing problems, studies have recently been made of ALU arrays in which multifunction devices having basic arithmetic functions, called arithmetic logic units (ALUs), are arranged in a number of stages. ALU arrays require no horizontal wiring since the processing runs in one direction from top down. Incidentally, as with FPGAs, each single ALU may be connected with all the other ALUs. In this case, however, the capability of passing data to any of the ALUs requires enormous numbers of wires and connection switches, contributing to an increase in circuit scale.

SUMMARY OF THE INVENTION

To solve the foregoing problems, one of the aspects of the present invention provides a reconfigurable circuit comprising: a plurality of groups of logic circuits capable of changing functions; and at least one connection unit arranged between the groups, being capable of establishing connection between the logic circuits of the groups selectively. In this reconfigurable circuit, the connection unit is formed so that the logic circuit of one of the groups is connectable with only some of the logic circuits included in another group. When the connection unit thus imposes a limitation on the connection between the logic circuits, it is possible to reduce the number of wires of the connection unit in terms of hardware and reduce such components as switches. This can reduce the circuit scale and achieve power saving advantageously even from an economical viewpoint.

Another aspect of the present invention provides a processor comprising: a reconfigurable circuit capable of changing functions; a setting unit which supplies the reconfigurable circuit with configuration information for configuring a desired circuit; and a control unit which controls the setting unit to supply the reconfigurable circuit with configuration information on a plurality of circuits capable of simultaneous execution. According to this processor, circuits capable of parallel processing can be formed on the reconfigurable circuit simultaneously. This allows a reduction in processing time.

Still another aspect of the present invention provides a processor comprising: a DFG generating unit which generates a data flow graph expressing functions of logic circuits as nodes and the flow of data from input data to output data as connections of the nodes; a configuration information generating unit which generates configuration information based on the data flow graph generated; a reconfigurable circuit capable of changing functions; and a setting unit which supplies the reconfigurable circuit with configuration information for configuring a desired circuit. In this processor, when a node has outputs more than the number of logic circuits possible for the corresponding logic circuit to be connected with, the DFG generating unit may distribute the outputs of the node by duplicating the node into ones having the same inputs in the data flow graph. Consequently, even if nodes cannot be mapped directly on the connection-limited reconfigurable circuit because of an excessive number of connections, the nodes can be duplicated to distribute node outputs, thereby configuring a circuit equivalent to the desired circuit on the reconfigurable circuit.

Still another aspect of the present invention provides a processor comprising: a DFG generating unit which generates a data flow graph expressing functions of logic circuits as nodes and the flow of data from input data to output data as connections of the nodes; a configuration information generating unit which generates configuration information based on the data flow graph generated; a reconfigurable circuit capable of changing functions; and a setting unit which supplies the reconfigurable circuit with configuration information for configuring a desired circuit. In this processor, when a node has outputs more than the number of logic circuits possible for the corresponding logic circuit to be connected with, the DFG generating unit may distribute the outputs of the node by adding a non-operating through node so as to be in connection with the outputs of the nodes aside from some of output nodes of the node, and arranging the rest of the output nodes after the through node. Consequently, even if nodes cannot be mapped directly on the connection-limited reconfigurable circuit because of an excessive number of connections, through nodes can be arranged to distribute the node outputs, thereby configuring a circuit equivalent to the desired circuit on the reconfigurable circuit.

Still another aspect of the present invention provides a method of determining functions of logic circuits in a reconfigurable circuit including: a plurality of groups of logic circuits capable of changing their functions; and at least one connection unit arranged between the groups, being capable of establishing connection between the logic circuits selectively under a predetermined limitation. This method of determining functions may comprise: DFG rendering by generating a data flow graph expressing the functions of the logic circuits as nodes and the flow of data from input data to output data as connections of the nodes; and mapping processing by associating the individual nodes of the data flow graph with logic circuits of the reconfigurable circuit.

Still another aspect of the present invention provides a method of generating a circuit for determining functions and arrangement of a plurality of circuit elements to generate a desired circuit, the method comprising: DFG rendering by generating a data flow graph expressing the functions of the circuit elements as nodes and the flow of data from input data to output data as connections of the nodes; and mapping processing by associating the individual nodes of the data flow graph with positions of arrangement of the circuit elements of the circuit to be generated. Still another aspect of the present invention provides a circuit generated by: generating a data flow graph expressing functions of circuit elements as nodes and the flow of data from input data to output data as connections of the nodes; associating the individual nodes of the data flow graph with positions of arrangement of the circuit elements of the circuit to be generated; and forming the circuit elements represented by the nodes at the positions of arrangement.

Incidentally, any combinations of the foregoing components, and the expressions of the present invention converted among methods, apparatuses, systems, recording media, computer programs, and the like are also intended to constitute applicable aspects of the present invention.

According to the present invention, it is possible to provide a reconfigurable circuit of reduced circuit scale, and peripheral technologies thereof.

BRIEF DESCRIPTION OF THE DRAWINGS

FIG. 16 is a diagram showing an example of a C program;

DETAILED DESCRIPTION OF THE INVENTION

Embodiments of the present invention will provide a reconfigurable circuit and peripheral technologies thereof which contribute to a reduction in circuit scale.

First Embodiment

Figures 1, 2:
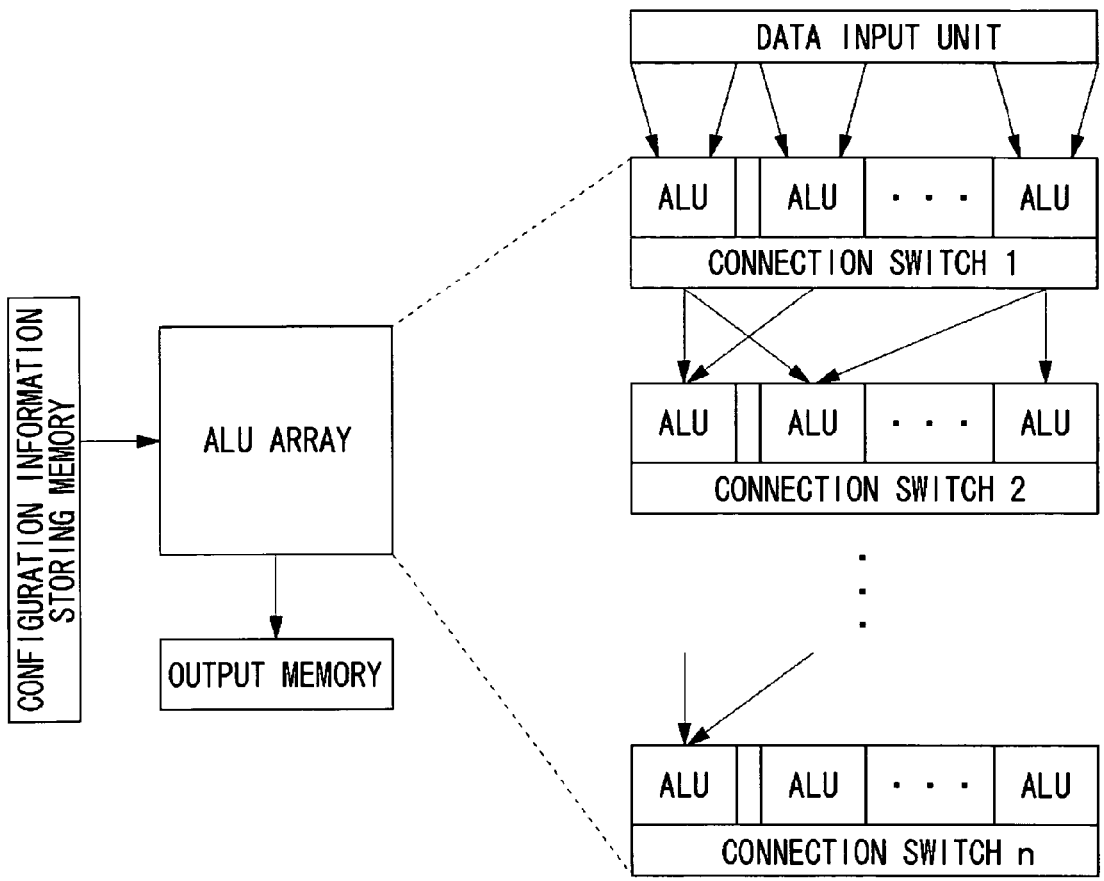
FIG. 1 is a block diagram showing a reconfigurable processor using an ALU array.
FIG. 2 is a diagram showing an example of a C language program.

FIG. 1 is a block diagram showing a reconfigurable processor using an ALU array. As shown in FIG. 1, an instruction set for controlling the functions of ALUs and a connection data set for controlling the connection destinations among the ALUs (hereinafter, referred to as "configuration information") are initially set to the ALU array from a configuration information storing memory. The ALU array has a plurality of stages, in each of which a plurality of ALUs are arranged. The ALUs have a plurality of arithmetic circuits implemented in advance. Which operations to perform are selected depending on the instruction set. To pass data from ALUs in upper stages to ones in lower stages, connection switches for switching connection among the ALUs are set to the connection data set, whereby which ALUs in the lower stages to pass the data to are determined. During operation, arithmetic processing is performed in accordance with the configuration information, and the results are output.

Figure 3:
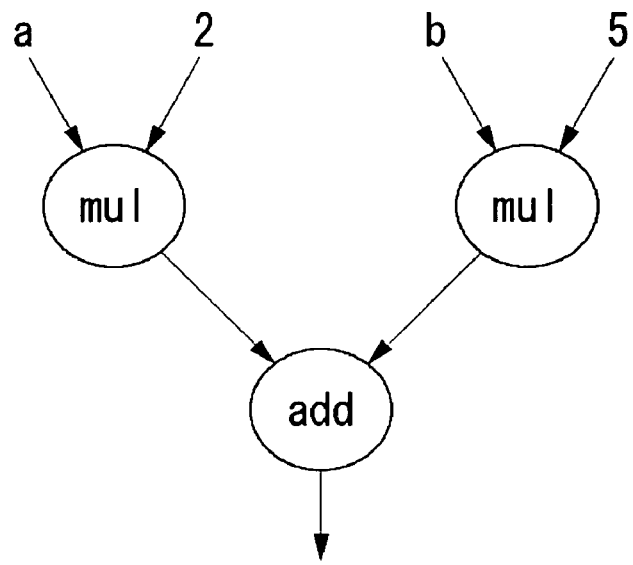
FIG. 3 is a diagram showing a DFG corresponding to the program shown in FIG. 2.
Figure 4:
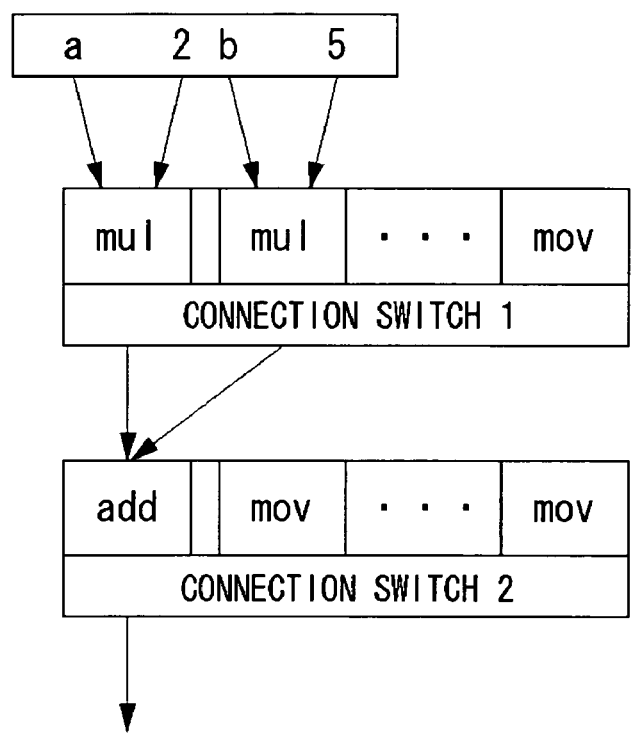
FIG. 4 is a block diagram for situations where configuration information based on the DFG of FIG. 3 is assigned to the ALU array.

The configuration information is created from a program which is typically written in a high-level language such as C language. The C program is converted into a data flow graph called DFG by a conversion tool. FIG. 2 shows an example of the C language program. FIG. 3 shows a DFG corresponding to the program shown in FIG. 2. In FIG. 3, mul represents a multiplication, and add an addition. The program shows the function of multiplying the values input to variables a and b by two and five, respectively, and adding the results of multiplication. In rendering this into a DFG, the two multiplications are performed in the first stage since the two equations for determining x and y can be processed in parallel. An addition is performed in the second stage with the results of multiplication as respective inputs. From this DFG, the conversion tool determines the instructions of respective ALUs on the ALU array and the connections between the ALUs, and converts the information into a data set to be input to the hardware, or configuration information. FIG. 4 is a block diagram for situations where the configuration information based on the DFG of FIG. 3 is assigned to the ALU array. Here, mov indicates that the input(s) to that ALU is/are simply passed through to the lower stage.

Figure 5:
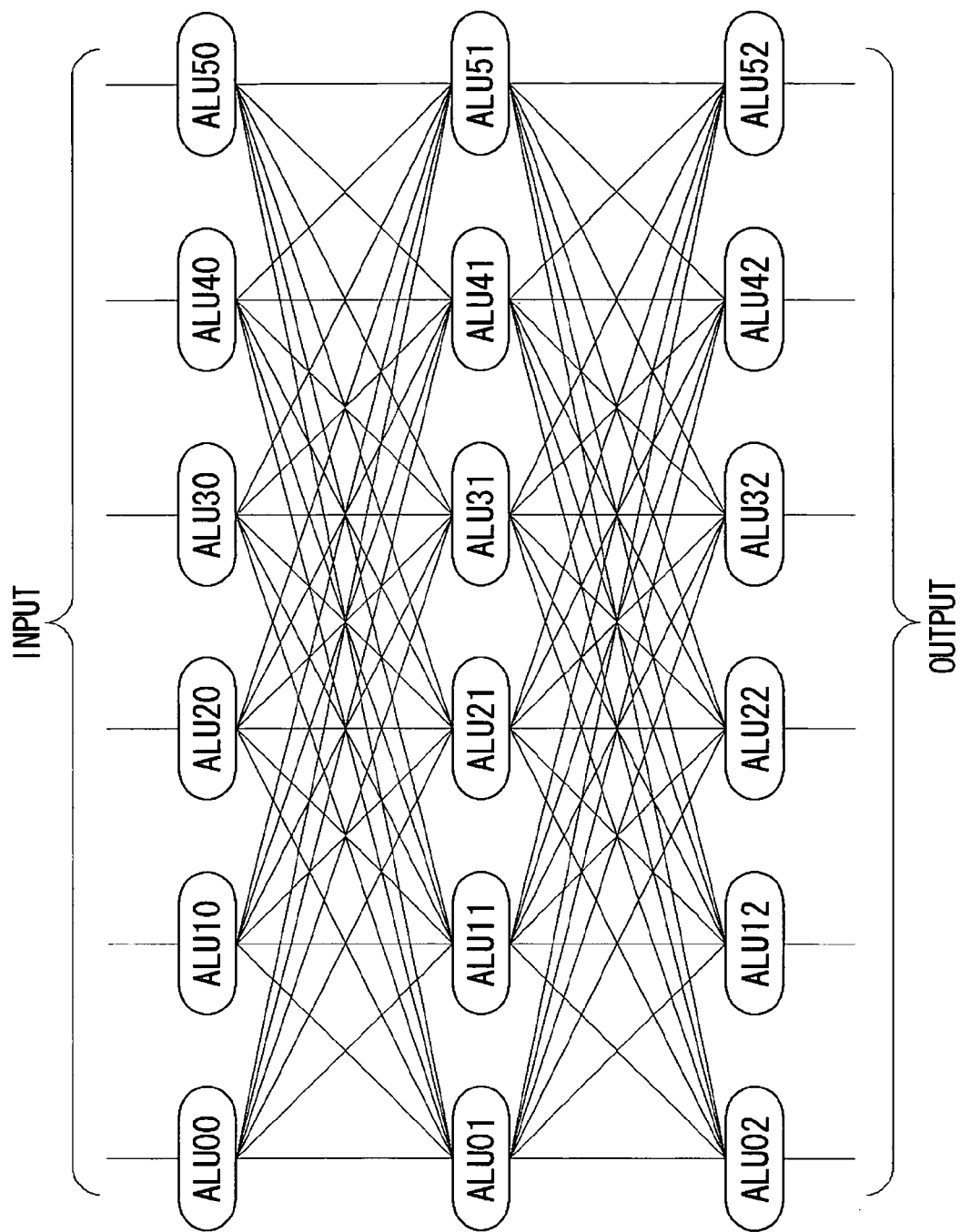
FIG. 5 is a diagram showing a connection method in which ALU-to-ALU connections skipping any stage vertically are eliminated.

FIG. 5 shows a connection method in which ALU-to-ALU connections skipping any stage vertically are eliminated. According to the connection method shown in FIG. 5, the absence of stage-skipping connections allows a reduction in circuit scale. Hereinafter, description will be given of ALU array architectures having yet smaller numbers of wires than with the connection method shown in FIG. 5.

Second Embodiment

Figure 6:
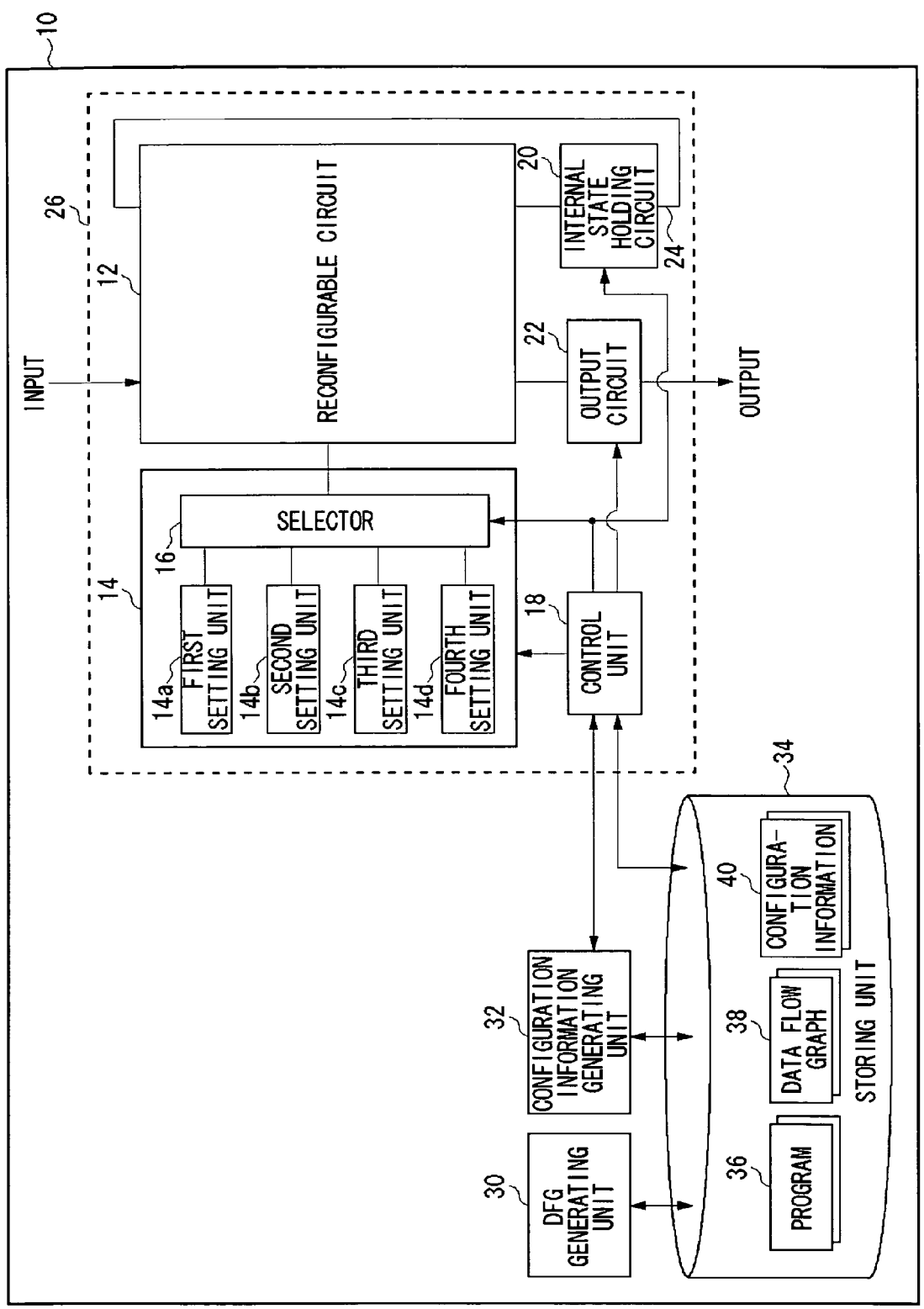
FIG. 6 is a block diagram showing a processor according to a second embodiment.

FIG. 6 is a block diagram showing a processor 10 according to a second embodiment. The processor 10 is provided with an integrated circuit device 26. The integrated circuit device 26 has the facilities of making the circuit configuration reconfigurable. The integrated circuit device 26 is formed on a single chip, and comprises a reconfigurable circuit 12, a setting unit 14, a control unit 18, an internal state holding circuit 20, an output circuit 22, and a path part 24. The reconfigurable circuit 12 allows function changes by changing settings.

The setting unit 14 has a first setting unit 14a, a second setting unit 14b, a third setting unit 14c, a fourth setting unit 14d, and a selector 16. The setting unit 14 supplies the reconfigurable circuit 12 with configuration information 40 for configuring a desired circuit. The path part 24 functions as a feedback path, connecting the outputs of the reconfigurable circuit 12 to the inputs of the reconfigurable circuit 12. The internal state holding circuit 20 and the output circuit 22 are made of sequential circuits, such as a data flip-flop (D-FF), or memories. They receive the outputs of the reconfigurable circuit 12. The internal state holding circuit 20 is connected with the path part 24. The reconfigurable circuit 12 is formed as a combinational circuit, or a sequential circuit capable of state holding such as a D-FF.

The reconfigurable circuit 12 has a structure including a plurality of groups of logic circuits capable of changing their functions, such as an ALU. The reconfigurable circuit 12 also has at least one connection unit which is arranged between the groups and is capable of establishing connection between the logic circuits of the groups selectively. Specifically, in the reconfigurable circuit 12, a plurality of ALUs capable of executing arithmetic functions selectively are arranged in a matrix. A plurality of ALUs in each stage constitute a group. The results of processing in the group of a prior stage are passed to the group of the subsequent stage according to the connections selectively established by the connection unit. Here, the connection unit is formed so that the logic circuits of one of the groups to connect are each connectable with only some of the logic circuits included in the other group. This can reduce the circuit scale significantly as compared with the connection method shown in FIG. 5. The functions of the respective logic circuits and the connections between the logic circuits are set based on the configuration information 40 supplied by the setting unit 14. The configuration information 40 is generated through the following procedure.

A program 36 to be realized by the integrated circuit device 26 is stored in a storing unit 34. The program 36 is a signal processing circuit, a signal processing algorithm, or the like, written in a high-level language such as C language. A DFG generating unit 30 performs DFG rendering. Specifically, the DFG generating unit 30 compiles the program 36 stored in the storing unit 34, converts the resultant into the data flow graph (DFG) 38, and stores it into the storing unit 34. The data flow graph 38 is a graphical representation of the operations or data flow from input data, including input variables and constants, to output data. Here, the DFG generating unit 30 generates the data flow graph 38 in accordance with the connection limitation on the groups of the logic circuits in the reconfigurable circuit 12. The details will be given later.

A configuration information generating unit 32 generates the configuration information 40 from the data flow graph 38. The configuration information 40 is data for mapping the data flow graph 38 to the reconfigurable circuit 12. The configuration information 40 determines the functions of the logic circuits and the connections between the logic circuits in the reconfigurable circuit 12. In the present embodiment, the DFG generating unit 30 has the function of generating sub DFGs for a plurality of circuits into which a single circuit is divided. Incidentally, this processing function may be achieved by the configuration information generating unit 32. In this case, the configuration information generating unit 32 generates the configuration information on a plurality of circuits by dividing the DFG that is initially generated by the DFG generating unit 30.

Figure 7:
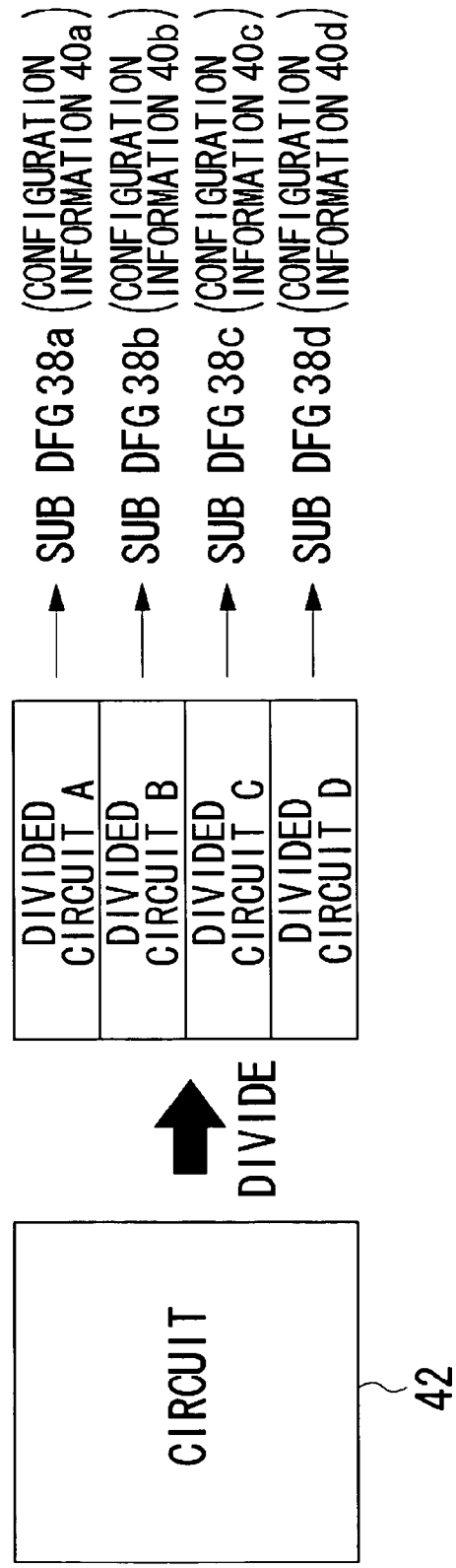
FIG. 7 is a diagram for explaining configuration information on a plurality of circuits into which a single circuit to be generated is divided.

FIG. 7 is a diagram for explaining sub DFGs 38 for a plurality of circuits into which a single circuit 42 to be generated is divided. The circuits generated by dividing the single circuit 42 will be referred to as "divided circuits." In this example, one single circuit 42 is divided into four divided circuits, i.e., a divided circuit A, a divided circuit B, a divided circuit C, and a divided circuit D. The circuit 42 is divided according to the flow of operations in the data flow graph 38 which is generated directly from the program 36. Given that the flow of operations in the initial data flow graph 38 is expressed in the direction from top down, the data flow graph 38 is sectioned at predetermined intervals from above, and the sections are set as sub DFGs. The number of sections along the flow is determined to be less than or equal to the number of stages of the logic circuits in the reconfigurable circuit 12. The circuit 42 may be divided in the horizontal direction of the data flow graph 38. The number of divisions in the horizontal direction is determined to be less than or equal to the number of logic circuits in each single state of the reconfigurable circuit 12.

In particularly, when the circuit to be generated is greater than the reconfigurable circuit 12, it is preferable that the DFG generating unit 30 divides the circuit 42 so as to be capable of being mapped to the reconfigurable circuit 12. Incidentally, this processing may be performed by the configuration information generating unit 32 in the form of re-generation of the configuration information. The DFG generating unit 30 determines the method of dividing the circuit 42 based on the array structure of the logic circuits in the reconfigurable circuit 12 and the data flow graph 38 generated directly from the program 36. The array structure of the reconfigurable circuit 12 may be informed of from the control unit 18 to the DFG generating unit 30, or stored in the storing unit 34 in advance. The control unit 18 may instruct the DFG generating unit 30 of the method of dividing the circuit 42. The sub DFGs generated thus are converted into configuration information by the configuration information generating unit 32.

As a result of execution of the foregoing procedure, the storing unit 34 stores a plurality of pieces of configuration information 40 for configuring the reconfigurable circuit 12 as a desired circuit. The plurality of pieces of configuration information 40 include configuration information 40a for configuring the divided circuit A, configuration information 40b for configuring the divided circuit B, configuration information 40c for configuring the divided circuit C, and configuration information 40d for configuring the divided circuit D. The plurality of pieces of configuration information 40 express the plurality of divided circuits into which the single circuit 42 is divided, respectively. As above, the sub DFGs 38 or the configuration information 40 of the circuit 42 to be generated is created depending on the circuit scale of the reconfigurable circuit 12. It is therefore possible to achieve a processor 10 having high versatility. From a different point of view, according to the processor 10 of the present embodiment, a desired circuit can be reconfigured by using the reconfigurable circuit 12 having a smaller circuit scale.

Figure 8:
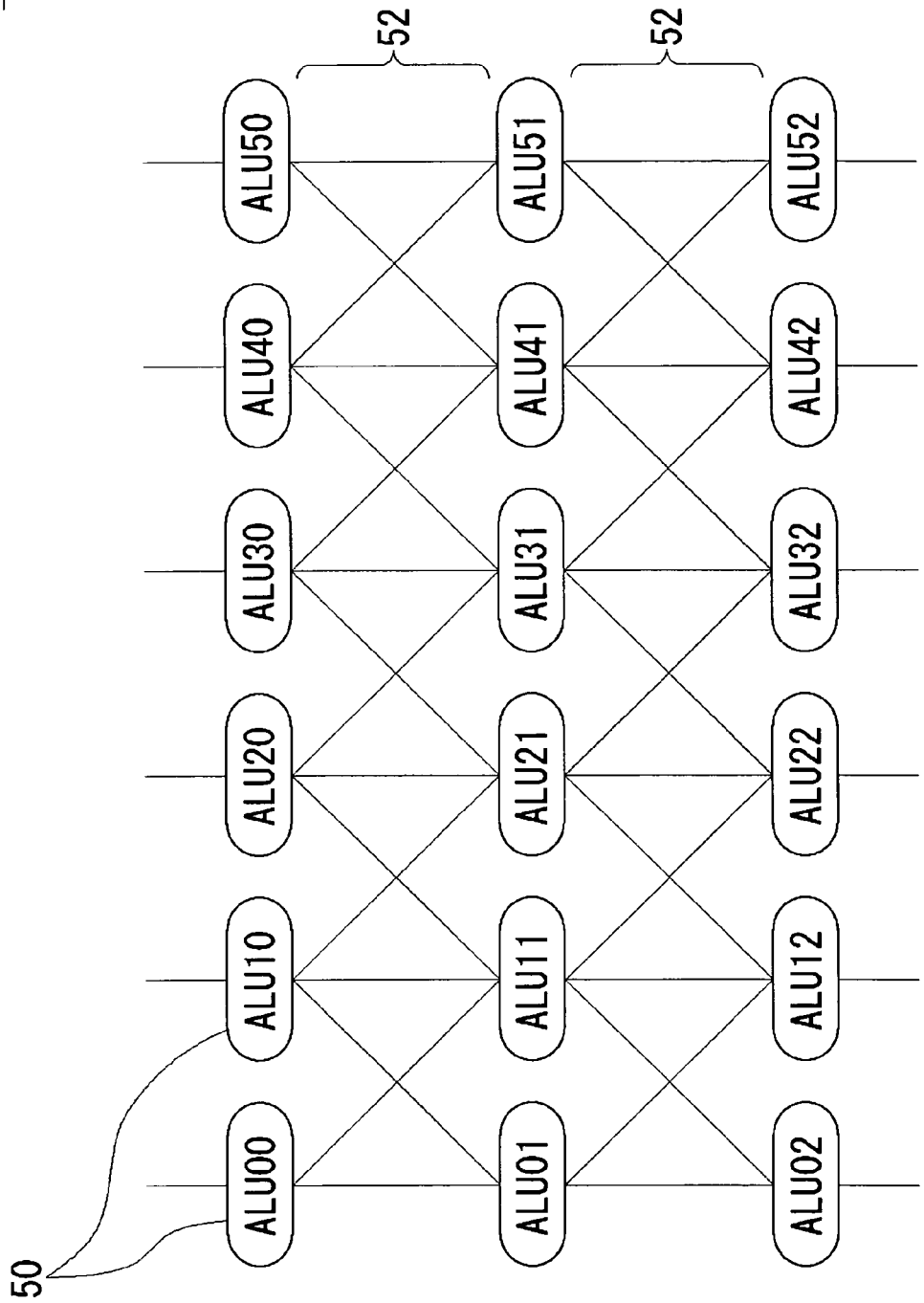
FIG. 8 is a block diagram showing the reconfigurable circuit of the connection method according to the second embodiment.

FIG. 8 is a block diagram showing the reconfigurable circuit 12 of the connection method according to the second embodiment. The reconfigurable circuit 12 has an array in which a plurality of logic circuits 50 are arranged in a plurality of stages. Connection units 52 provided for the respective stages constitute the structure that the outputs of the logic circuit rows in prior stages and the inputs of the logic circuit rows in subsequent stages can be connected depending on settings. The plurality of logic circuits 50 arranged in each single stage constitutes a group. Here, the ALUs are shown as examples of the logic circuits 50. Each of the ALUs can selectively execute a plurality of types of multi-bit operations such as logical OR, logical AND, and bit shift according to its setting. Each ALU has a selector for selecting a plurality of arithmetic functions.

The reconfigurable circuit 12 shown in FIG. 8 is configured as an ALU array having three rows and six columns of ALUs. ALU00, ALU10, ... ALU50 in the first stage receive input variables and constants, and perform predetermined operations set thereto. The outputs of the operation results are input ALU01, ALU11, ... ALU51 in the second stage according to the connections set by the connection unit 52 in the first stage. The connection unit 52 in the first stage is wired so that connections can be established between the outputs of the ALU row in the first stage and the inputs of the ALU row in the second stage with a certain connection limitation. Within that extent, desired wiring is enabled depending on the setting. The same holds for the connection unit 52 in the second stage. The ALU row in the final stage, or the third stage, outputs the final results of operation. The connection units 52 are formed between the ALU stages so as to allow connection between logic circuits that are arranged physically close to each other. This allows reduced wiring length and reduced circuit scale. As a result, it is possible to reduce the power consumption and accelerate the processing.

The reconfigurable circuit 12 shown in FIG. 8 has three stages and six columns of ALUs. The wiring from each single ALU in an upper stage is limited to three ALUs in the lower stage. As shown in the diagram, the inputs of each single ALU in a lower stage are limited to the ALU immediately above in the upper stage and the ALUs on the right and left of the ALU immediately above. The outputs of each single ALU in an upper stage are limited to the ALU immediately below in the lower stage and the ALUs on the right and left of the ALU immediately below. For example, with the ALU21, the inputs are limited to three directions, or ALU10, ALU20, and ALU30. The outputs are limited to three directions, or ALU12, ALU22, and ALU32. In the absence of corresponding ALUs on the right or left, the inputs and outputs are limited to two each. Given the configuration of three stages each having six ALUs, the number of wires between the ALUs according to such wiring and the number of wires of the connection method shown in FIG. 5 are compared as below.

(The number of wires of the ALU array shown in FIG. 5) 6×12=72

(The number of wires of the ALU array shown in FIG. 8) 3×8+2×4=32

This means a reduction of approximately 50% in the number of wires.

Figure 9:
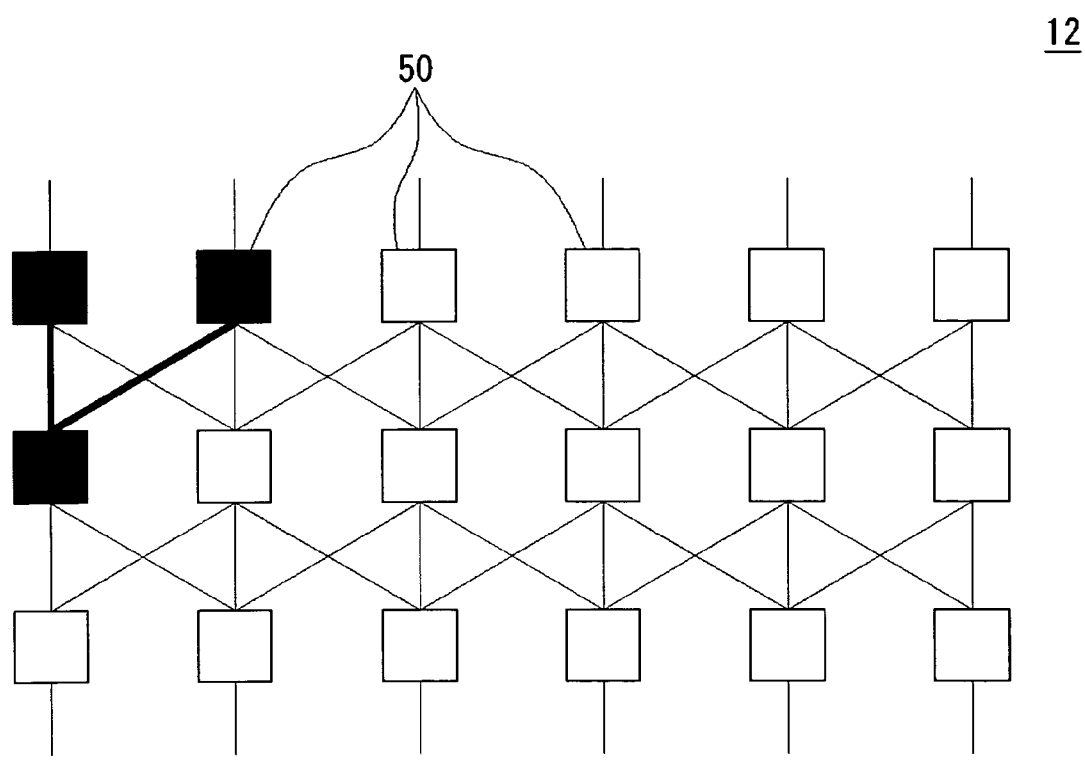
FIG. 9 shows the result of assignment of the C program shown in FIG. 2 to the ALU array shown in FIG. 8.

FIG. 9 shows the result of assignment (mapping) of the C program shown in FIG. 2 to the ALU array shown in FIG. 8. In FIG. 9, as upper ALUs as possible are used. In FIG. 9, □ represents an ALU. Filled □, or ■, represents an ALU to which an instruction (mul or add in this example) is assigned. The thick lines indicate connections between the ALUs. Hereinafter, such ALUs to which significant instructions are assigned will be expressed as nodes. Incidentally, as employed in the present embodiment and the subsequent embodiments, nodes are the concept to be used arithmetically in search processing for identifying the functions of the ALUs. Moreover, mapping (processing) covers not only the processing in which a circuit is actually formed on the reconfigurable circuit 12, but also the processing to be executed arithmetically in the search processing for identifying the functions of the ALUs. In arithmetic terms, the mapping processing may be controlled by the control unit 18, or controlled by the DFG generating unit 30 or the configuration information generating unit 32.

Figure 10:
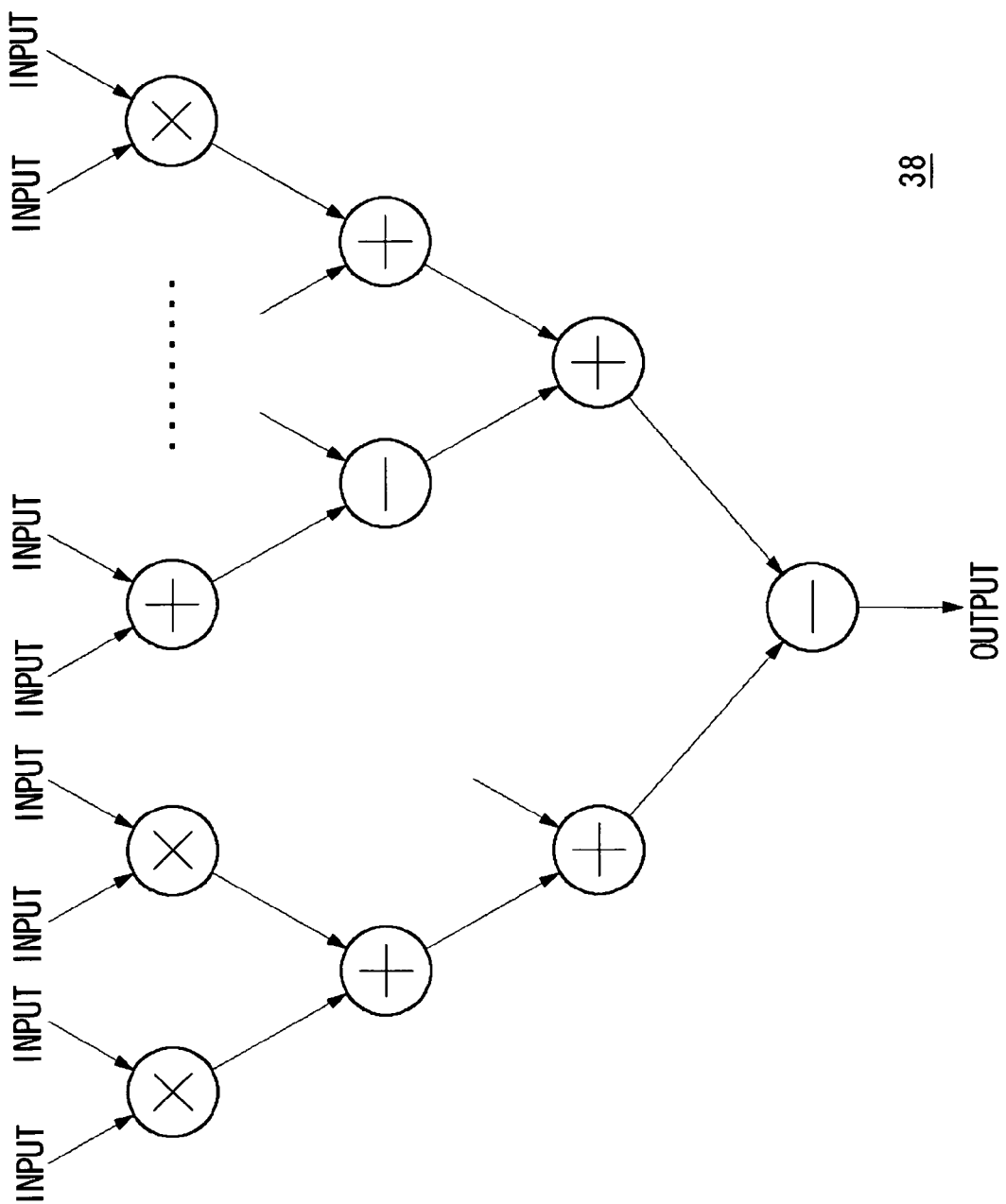
FIG. 10 is a diagram showing an example of a data flow graph.

FIG. 10 is a diagram showing an example of the data flow graph 38. The data flow graph 38 is a stepwise graphical representation of the flow of operations on input variables and constants. In the diagram, operators are shown in circles. The configuration information generating unit 32 generates the configuration information 40 for mapping this data flow graph 38 to the reconfigurable circuit 12. In the embodiment, the data flow graph 38 is divided into a plurality of areas to generate the sub DFGs 38 of or the configuration information 40 on the divided circuits particularly when the entire data flow graph 38 cannot be mapped within the reconfigurable circuit 12. To realize the flow of operations in the data flow graph 38 upon the reconfigurable circuit 12, the configuration information 40 takes the form of data for identifying the logic circuits to assign arithmetic functions to, determining the connections between the logic circuits, and defining input variables, input constants, etc. Consequently, the configuration information 40 includes select information to be supplied to the selectors for selecting the functions of the individual logic circuits 50, connection information for setting the wiring of the connection units 52, and necessary variable data and constant data.

Returning to FIG. 6, the control unit 18, at the time of circuit configuration, selects configuration information 40 for configuring a single circuit. Here, the control unit 18 shall select the configuration information 40 for configuring the circuit 42 shown in FIG. 7, i.e., the configuration information 40a on the divided circuit A, the configuration information 40b on the divided circuit B, the configuration information 40c on the divided circuit C, and the configuration information 40d on the divided circuit D. The control unit 18 supplies the selected configuration information 40 to the setting unit 14. The setting unit 14 has cache memories or other types of memories, which hold the respective pieces of configuration information 40 supplied thereto. Specifically, the control unit 18 supplies the configuration information 40a to the first setting unit 14a, the configuration information 40b to the second setting unit 14b, the configuration information 40c to the third setting unit 14c, and the configuration information 40d to the fourth setting unit 14d.

The setting unit 14 sets the selected configuration information 40 to the reconfigurable circuit 12, thereby reconfiguring the circuitry of the reconfigurable circuit 12. This makes the reconfigurable circuit 12 capable of desired operations. The reconfigurable circuit 12 uses the ALUs having high-performance arithmetic capabilities as its basic cells. Moreover, the reconfigurable circuit 12 and the setting unit 14 are formed on a single chip. The configuration can thus be achieved at high speed, such as in a single clock. The control unit 18 has a clocking function. The clock signal is supplied to the internal state holding circuit 20 and the output circuit 22. The control unit 18 may also include a counter circuit, and supply the count signal to the selector 16.

Figure 11:
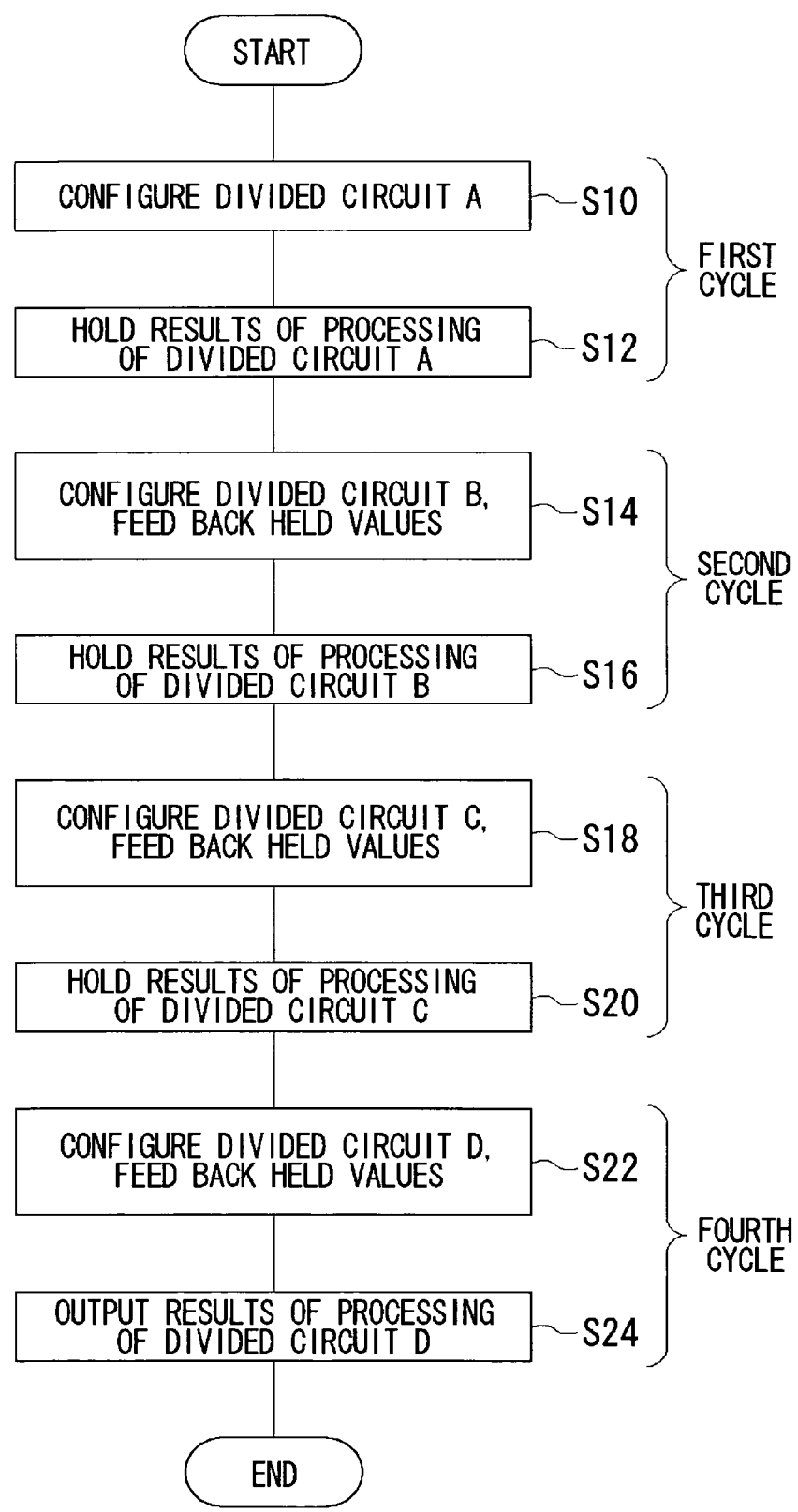
FIG. 11 is a flowchart of the signal processing.

FIG. 11 is a flowchart of the signal processing according to the embodiment. The control unit 18 controls the setting unit 14 to supply the plurality of pieces of configuration information 40, i.e., the configuration information 40a, the configuration information 40b, the configuration information 40c, and the configuration information 40d to the reconfigurable circuit 12 successively in synchronization with the count signal from the counter circuit. When the setting unit 14 supplies the plurality of pieces of configuration information 40 to the reconfigurable circuit 12 in succession, a single circuit is configured as a whole. The output circuit 22 outputs the outputs of the reconfigurable circuit 12 after the setting unit 14 configures the reconfigurable circuit 12 a plurality of times, or four times in this case. The number of times corresponds to the cycle of the configuration information 40 in use. The following describes the specific steps.

Initially, the control unit 18 controls the selector 16 to select the first setting unit 14a. The selector 16 may be controlled by the counter circuit. The first setting unit 14a supplies the configuration information 40a on the divided circuit A to the reconfigurable circuit 12, thereby configuring the divided circuit A on the reconfigurable circuit 12 (S10). Simultaneously with the configuration of the divided circuit A, input data is supplied to the divided circuit A. The divided circuit A, a combinational circuit, performs its arithmetic processing by the next clock signal.

When the control unit 18 supplies the clock signal to the internal state holding circuit 20, the internal state holding circuit 20 holds the results of processing of the divided circuit A (S12). The steps S10 and S12 will be referred to as a first cycle. At the same time, the control unit 18 controls the selector 16 to select the second setting unit 14b. The second setting unit 14b supplies the configuration information 40b on the divided circuit B to the reconfigurable circuit 12, thereby configuring the divided circuit B on the reconfigurable circuit 12. Here, the results of processing of the divided circuit A, held in the internal state holding circuit 20, are supplied to the inputs of the divided circuit B through the path part 24 (S14). The divided circuit B performs its arithmetic processing by the next clock signal.

When the control unit 18 supplies the next clock signal to the internal state holding circuit 20, the internal state holding circuit 20 holds the results of processing of the divided circuit B (S16). The steps S14 and S16 will be referred to as a second cycle. At the same time, the control unit 18 controls the selector 16 to select the third setting unit 14c. The third setting unit 14c supplies the configuration information 40c on the divided circuit C to the reconfigurable circuit 12, thereby configuring the divided circuit C on the reconfigurable circuit 12. Here, the results of processing of the divided circuit B, held in the internal state holding circuit 20, are supplied to the inputs of the divided circuit C through the path part 24 (S18). The divided circuit C performs its arithmetic processing by the next clock signal.

When the control unit 18 supplies the next clock signal to the internal state holding circuit 20, the internal state holding circuit 20 holds the results of processing of the divided circuit C (S20). The steps S18 and S20 will be referred to as a third cycle. At the same time, the control unit 18 controls the selector 16 to select the fourth setting unit 14d. The fourth setting unit 14d supplies the configuration information 40d on the divided circuit D to the reconfigurable circuit 12, thereby configuring the divided circuit D on the reconfigurable circuit 12. Here, the results of processing of the divided circuit C, held in the internal state holding circuit 20, are supplied to the inputs of the divided circuit D through the path part 24 (S22). The divided circuit D performs its arithmetic processing by the next clock signal.

When the control unit 18 supplies the next clock signal to the output circuit 22, the output circuit 22 outputs the results of processing of the divided circuit D (S24). The steps S22 and S24 will be referred to as a fourth cycle. When the processing from the first cycle to the fourth cycle is to be repeated, the control unit 18 controls the selector 16 to select the first setting unit 14a again, so that the divided circuit A is configured on the reconfigurable circuit 12 and input data is supplied thereto.

As above, the plurality of divided circuits A to D, into which a single circuit 42 is divided, are configured on the reconfigurable circuit 12 in succession. The divided circuits perform their arithmetic processing with the outputs of the respective divided circuits fed back to the inputs of the next divided circuits. The outputs of the circuit 42 are then obtained from the divided circuit D which is the last configured. The time to elapse from S10 to S24 is as much as four clocks. According to the processor 10 of the present embodiment, the efficient arithmetic processing can thus be performed within the limited circuit scale of the reconfigurable circuit 12. The small circuit scale of the reconfigurable circuit 12 also allows a reduction in power consumption.

While the control unit 18 may supply an identical clock signal to the internal state holding circuit 20 and the output circuit 22, the output circuit 22 may be supplied with a clock signal having a cycle four times that of the clock signal supplied to the internal state holding circuit 20. When an identical clock signal is supplied to the internal state holding circuit 20 and the output circuit 22, the internal state holding circuit 20 may also play the role of the output circuit 22 to allow integration into a single circuit. In this case, a circuit for extracting necessary signals is required at or after the stage of the output destination. While the four setting units, or the first setting unit 14a to the fourth setting units 14d, have been used in this example, it would be easily understood by those skilled in the art that the number of setting units also depends on the number of division of the circuit 42. The following embodiments are essentially based on the structure of the processor 10 that has been described in conjunction with the foregoing embodiment 2.

Third Embodiment

The DFG created from the C program of FIG. 2 falls within the size of the ALU array in the reconfigurable circuit 12 (in this case, three rows×six columns). A third embodiment will deal with the processing when the DFG exceeds this ALU array size. When a DFG exceeds the vertical size of the ALU array, the DFG is divided in the vertical direction of the ALU array.

Figure 12:
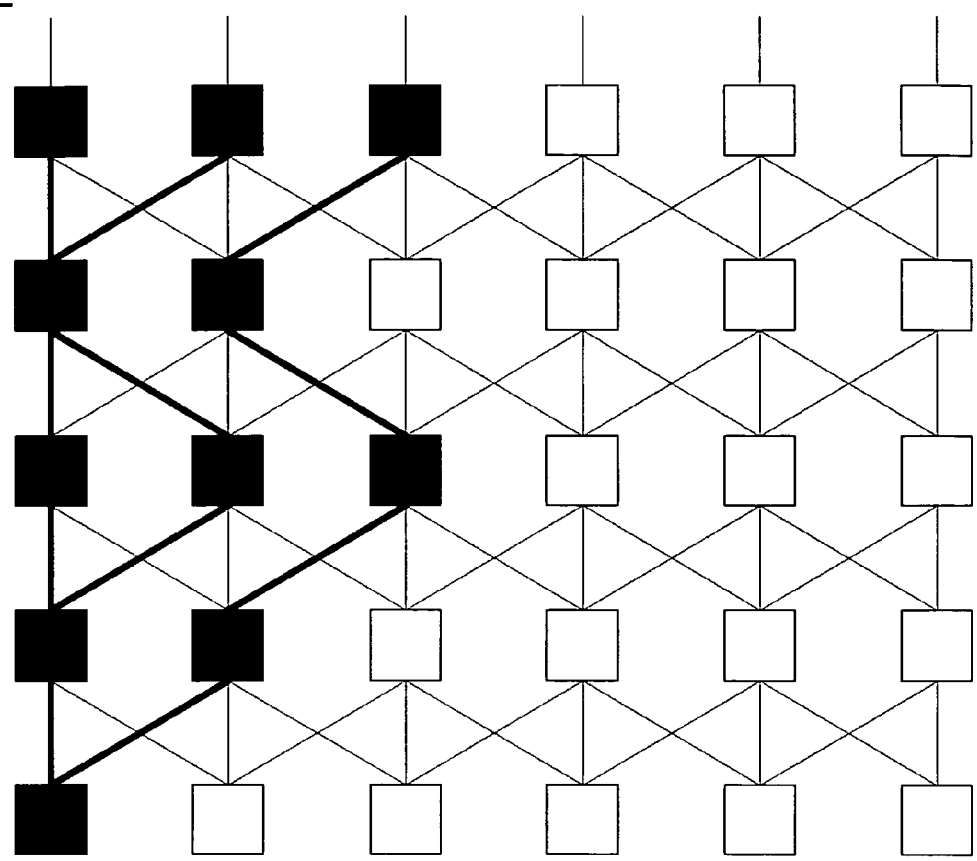
FIG. 12 is a diagram showing an example of the virtual state where a DFG exceeding the vertical size of the ALU array is mapped to the ALU array.

FIG. 12 shows an example of the virtual state where a DFG exceeding the vertical size of the ALU array is mapped to the ALU array. Since this DFG has a vertical size of 5, the DFG generating unit 30 generates two sub DFGs of divided circuits into which this DFG is divided.

Figure 13A:
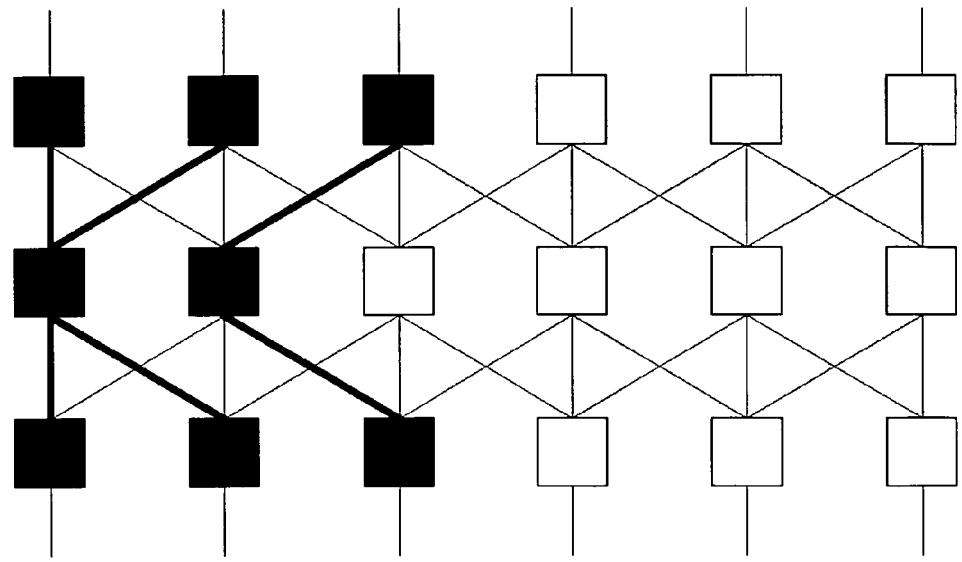
FIGS. 13(a) and 13(b) are diagrams showing the states where two sub DFGs into which the DFG of FIG. 12 is divided are mapped to the ALU array.
Figure 13B:
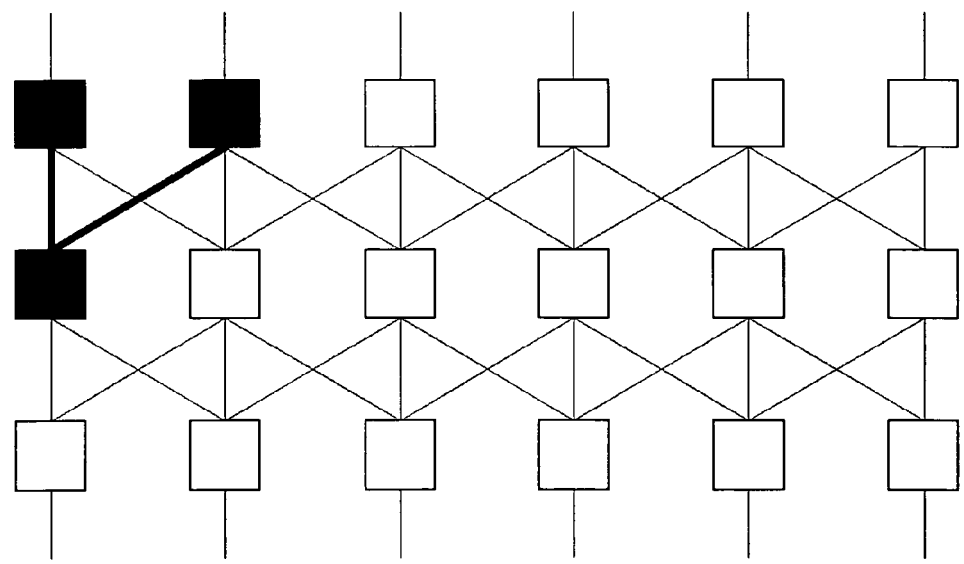

FIGS. 13(a) and 13(b) show the states where the two sub DFGs into which the DFG of FIG. 12 is divided are mapped to the ALU array. FIG. 13(a) shows the state of mapping of the ALU array for the first three stages shown in FIG. 12. FIG. 13(b) shows the state of mapping of the ALU array for the last two stages shown in FIG. 12. Here, the divided DFGs are called sub DFGs. To assign the sub DFGs to the ALU array for operation, the outputs of the third stage of the ALU array in FIG. 13(a) are once held by the internal state holding circuit 20 (see FIG. 6), and passed through the loop wiring of the path part 24 to the first stage of the ALU array in FIG. 13(b) as input data. Specifically, the control unit 18 controls the setting unit 14 so that the first setting unit 14a holds the configuration information for configuring the ALU array shown in FIG. 13(a) and the second setting unit 14b holds the configuration information for configuring the ALU array shown in FIG. 13(b). Then, the divided circuits are successively configured on the reconfigurable circuit 12 (ALU array) by using the configuration information through the selector 16. This makes it possible achieve the processing of the ALU array shown in FIG. 12. As a result, the circuit scale can be reduced to achieve a reduction in power consumption. Moreover, the ALU array in the reconfigurable circuit 12 need not be redesigned even in processing a DFG that exceeds the size of the ALU array. This improves the reusability of the circuit.

Fourth Embodiment

Now, if a DFG exceeds the horizontal size of the ALU array, the DFG is divided in the horizontal direction. This DFG division is performed by the DFG generating unit 30.

Figure 14:
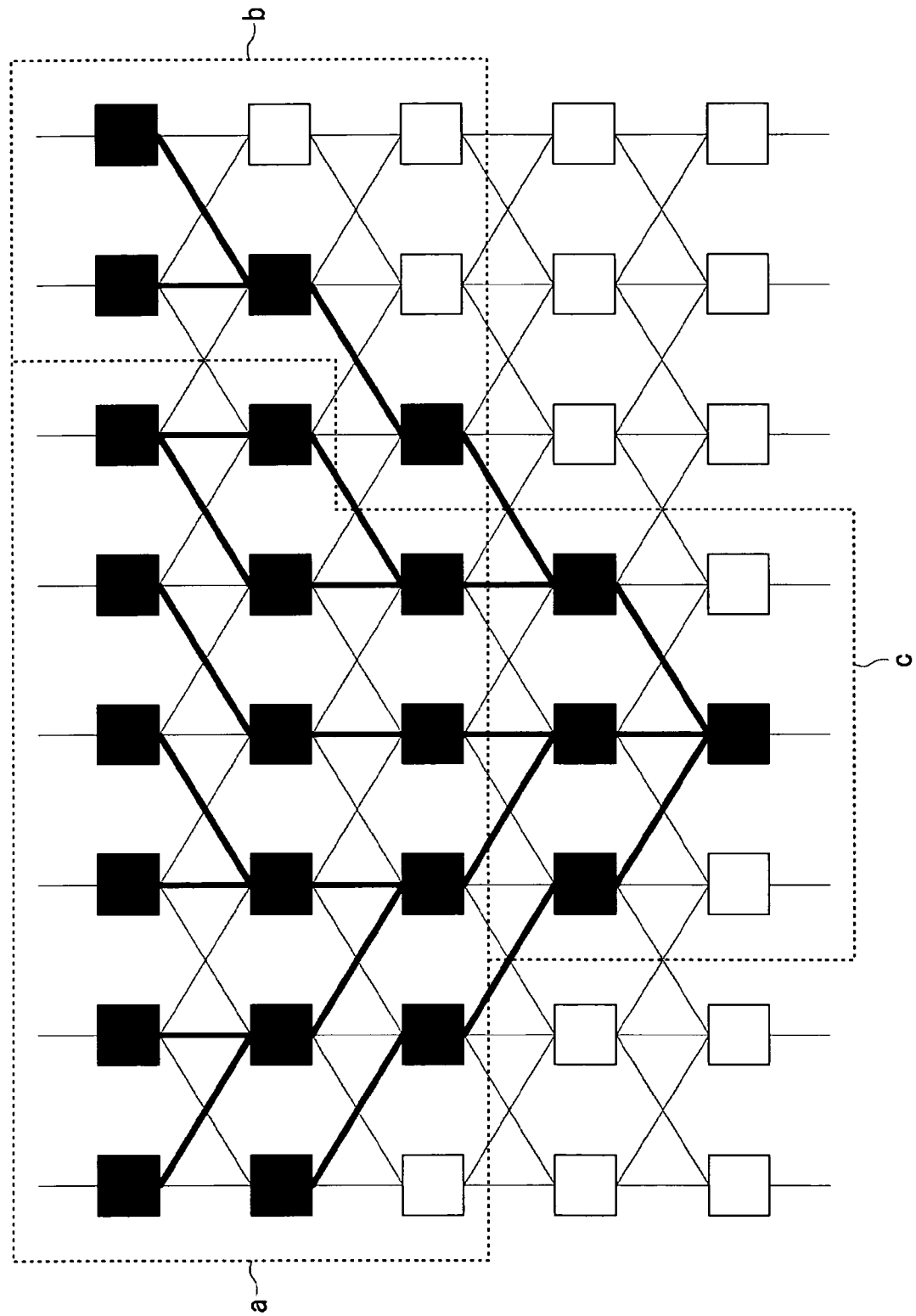
FIG. 14 is a diagram showing an example of the virtual state where a DFG exceeding both the vertical and horizontal sizes of the ALU array is mapped to the ALU array.

FIG. 14 shows an example of the virtual state where a DFG exceeding both the vertical and horizontal sizes of the ALU array is mapped to the ALU array. This DFG is expressed in a size of eight rows×five columns. Since the ALU array has a size of three rows×six columns, this DFG is divided into three sub DFGs. In FIG. 14, the three sub DFGs divided by dotted lines, or the sub DFG a, the sub DFG b, and the sub DFG c, constitute the original DFG.

Figure 15A:
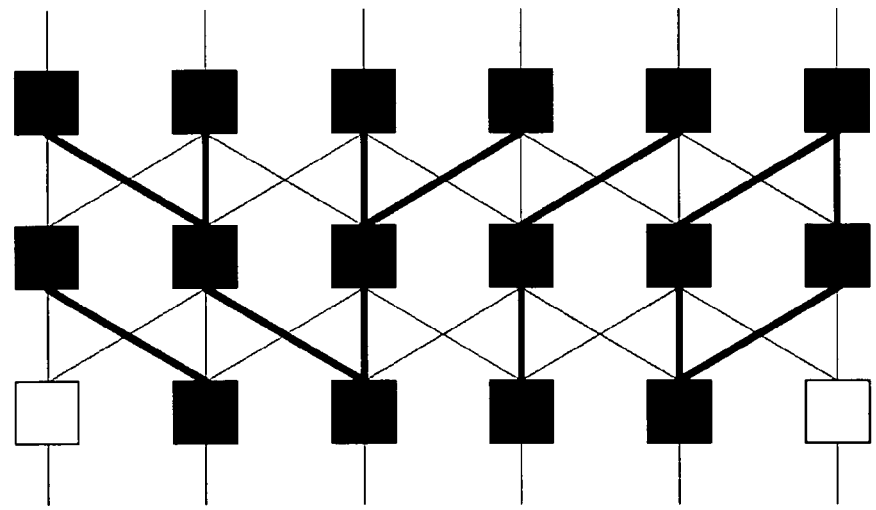
FIGS. 15(a) to 15(c) are diagrams showing the states where sub DFGs into which the DFG of FIG. 14 is divided are mapped to the ALU array, respectively.
Figure 15B:
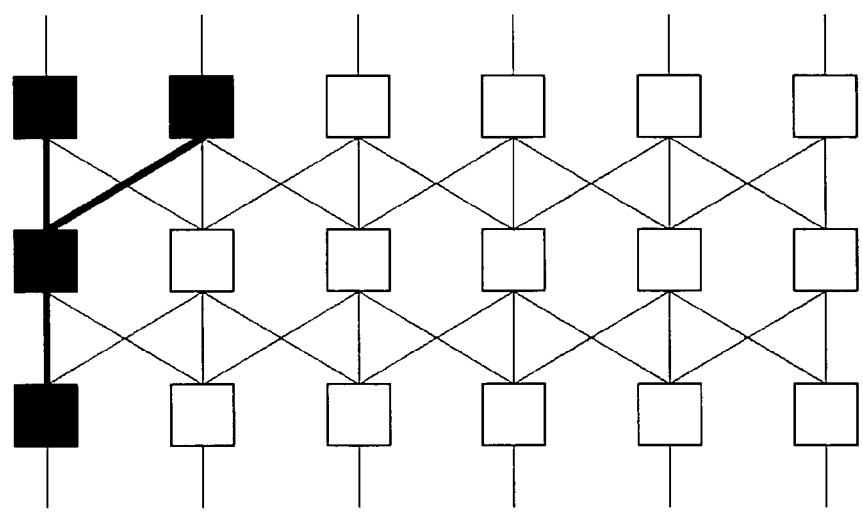
Figure 15C:
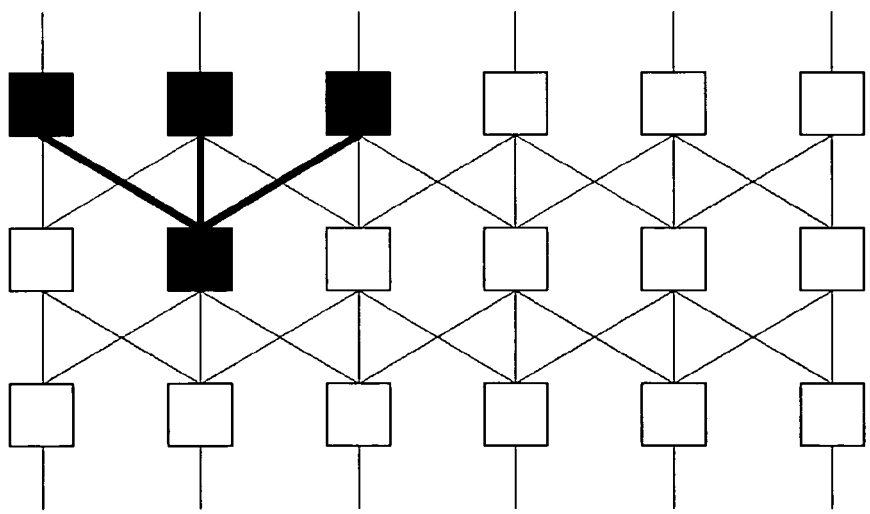

FIGS. 15(a) to 15(c) show the states where the sub DFGs into which the DFG of FIG. 14 is divided are mapped to the ALU array, respectively. FIG. 15(a) shows the mapped state of the sub DFG a, FIG. 15(b) the mapped state of the sub DFG b, and FIG. 15(c) the mapped state of the sub DFG c. The processing of the ALU array of FIG. 15(c) requires the outputs of the ALU arrays shown in FIGS. 15(a) and 15(b) as its input data. To assign the sub DFGs to the ALU array for operation, the setting unit 14 must therefore assign the pieces of configuration information to the ALU array in the following order: the configuration information on the sub DFG a, the configuration information on the sub DFG b, and the configuration information on the sub DFG c. Incidentally, the pieces of configuration information on the sub DFG a and the sub DFG b may be assigned in inverted order. The results from the divided circuits configured with the sub DFG a and the sub DFG b are stored into the internal state holding circuit 20, and read as input data at the time of assignment of the sub DFG c. As above, even in processing a DFG that exceeds the ALU array in vertical and horizontal sizes, it is possible to achieve a small-sized circuit with a reduction in power consumption. Moreover, the ALU array in the reconfigurable circuit 12 need not be redesigned even in processing the DFG that exceeds the size of the ALU array. This improves the reusability of the circuit.

Fifth Embodiment

The foregoing third and fourth embodiments have dealt with the cases where the DFG is simply divided and assigned to the ALU array as sub DFGs. A fifth embodiment will deal with the method of processing when a DFG does not comply with the connection limitation of the ALU array. This processing is performed by the DFG generating unit 30. Incidentally, the control unit 18 may take charge of this processing.

As described in conjunction with FIG. 8, if the ALU array has the connection limitation of three directions, any node having four or more inputs or outputs cannot be assigned to the ALU array directly. For inputs, it is the specific processes of the possible instructions that matter. Table 1 shows an example of the instruction set. Here, the merge instruction requires three inputs since one out of two pieces of data is selected depending on the output of a conditional statement (0 or 1). None of the instructions shown below requires more than three inputs, and all the connections for input thus fall within the limit.

Table 1

| INSTRUC-TION | NUMBER OF PIECES OF INPUT DATA | DESCRIPTION OF PROCESSING |
| --- | --- | --- |
| mov | 1 | THROUGH |
| add | 2 | ADDITION |
| sub | 2 | SUBTRACTION |
| mul | 2 | MULTIPLICATION |
| div | 2 | DIVISION |
| mod | 2 | REMAINDER |
| not | 1 | NEGATION |
| and | 2 | & (BIT BY BIT) |
| or | 2 | \| (BIT BY BIT) |
| xor | 2 | - (BIT BY BIT) |
| neg | 1 | CHANGE SIGN |
| asr | 2 | RIGHT SHIFT |
| lsl | 2 | LEFT SHIFT |
| beq | 2 | = (CONDITIONAL STATEMENT) |
| bne | 2 | != (CONDITIONAL STATEMENT) |
| bgt | 2 | > (CONDITIONAL STATEMENT) |
| bge | 2 | >= (CONDITIONAL STATEMENT) |
| merge | 3 | CONDITIONAL MERGE |

Since outputs depend on the original C program, the reconfigurable circuit 12 of the embodiment requires that the number of outputs of each node be adjusted so as not to exceed three.

Figure 17:
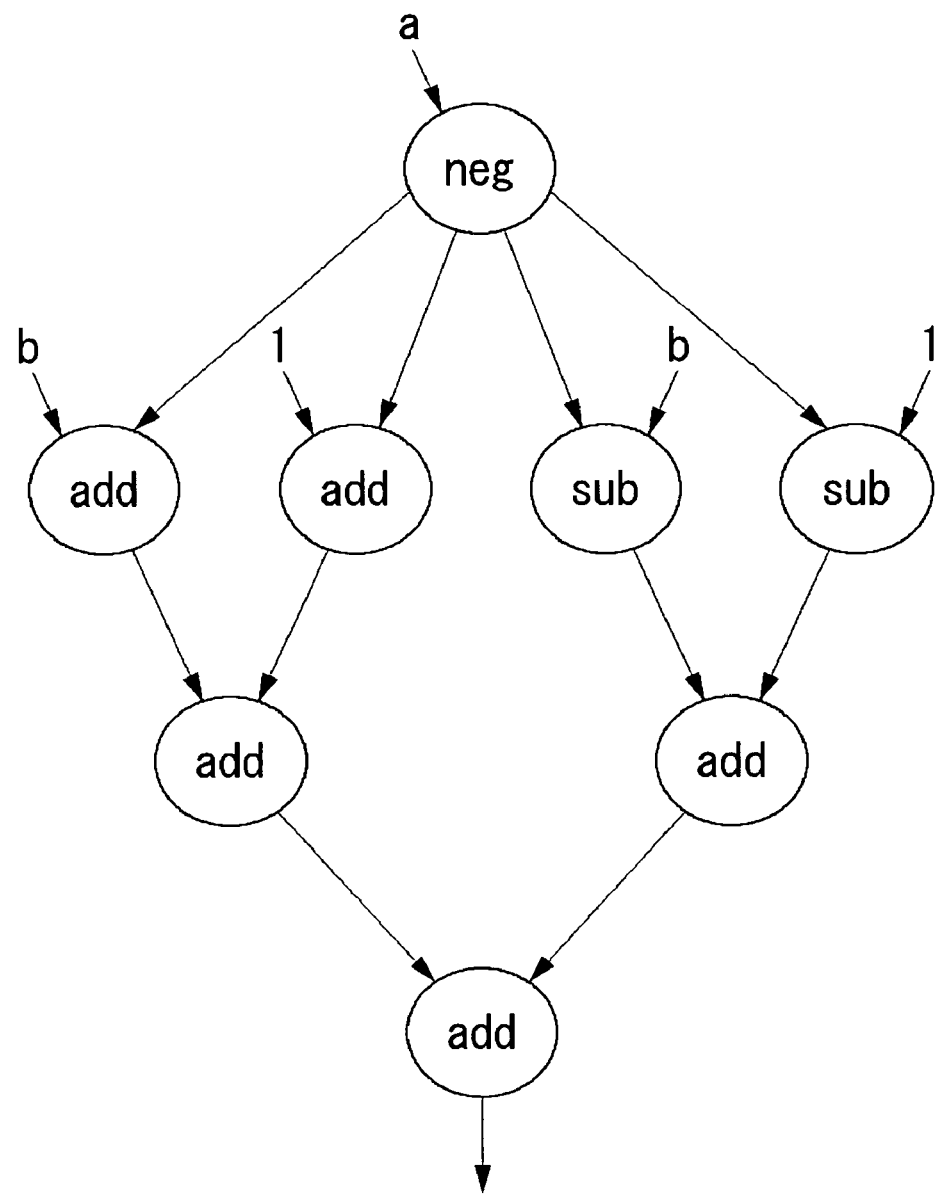
FIG. 17 is a diagram showing a DFG of the C program shown in FIG. 16.

FIG. 16 shows an example of the C program. FIG. 17 shows a DFG of the C program shown in FIG. 16. Since the neg node of FIG. 17 has four outputs, the DFG cannot be assigned to the ALU array directly. The following provides three possible methods of processing for this case.

(i) Node Copy

In a first method, the node not complying with the connection limitation is copied to distribute the outputs in number. In this processing, the node is duplicated into ones having the same inputs in the DFG so that the node outputs are distributed. In the example of FIG. 16, the neg node is copied to the same stage, and the numbers of outputs of the ALUs are limited to three and one, respectively.

Figure 18:
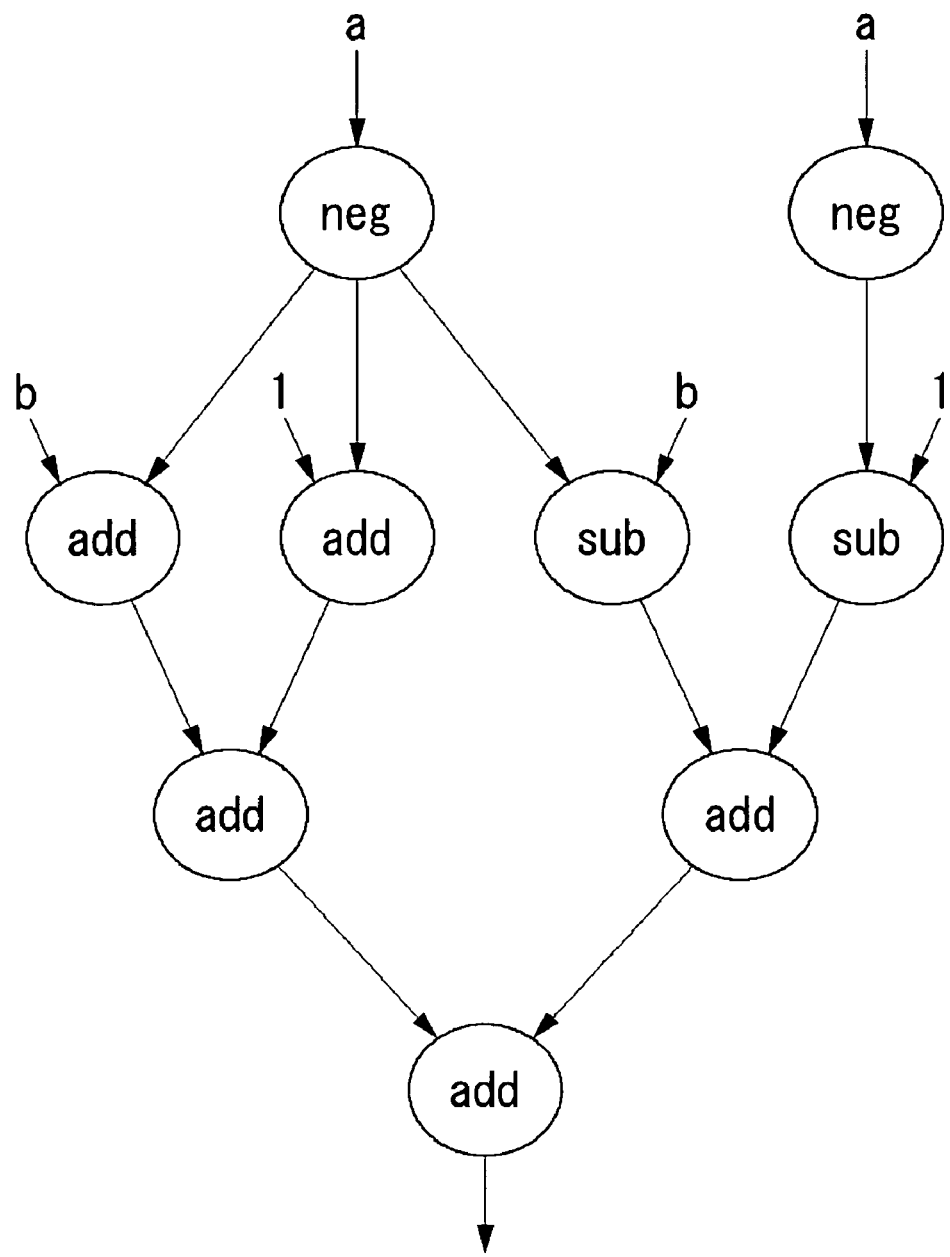
FIG. 18 is a diagram showing a DFG in which the numbers of outputs are limited to three through node copy.

FIG. 18 shows the DFG in which the numbers of outputs are to three by the node copy. The neg node in the first stage is duplicated so that the numbers of outputs are three and one. This can solve the problem of the connection limitation in the reconfigurable circuit 12. As compared to the techniques of (ii) through node insertion and (iii) DFG division to be described later, an increase in the number of stages, which is required for those techniques, can be avoided to allow processing acceleration.

Figure 19:
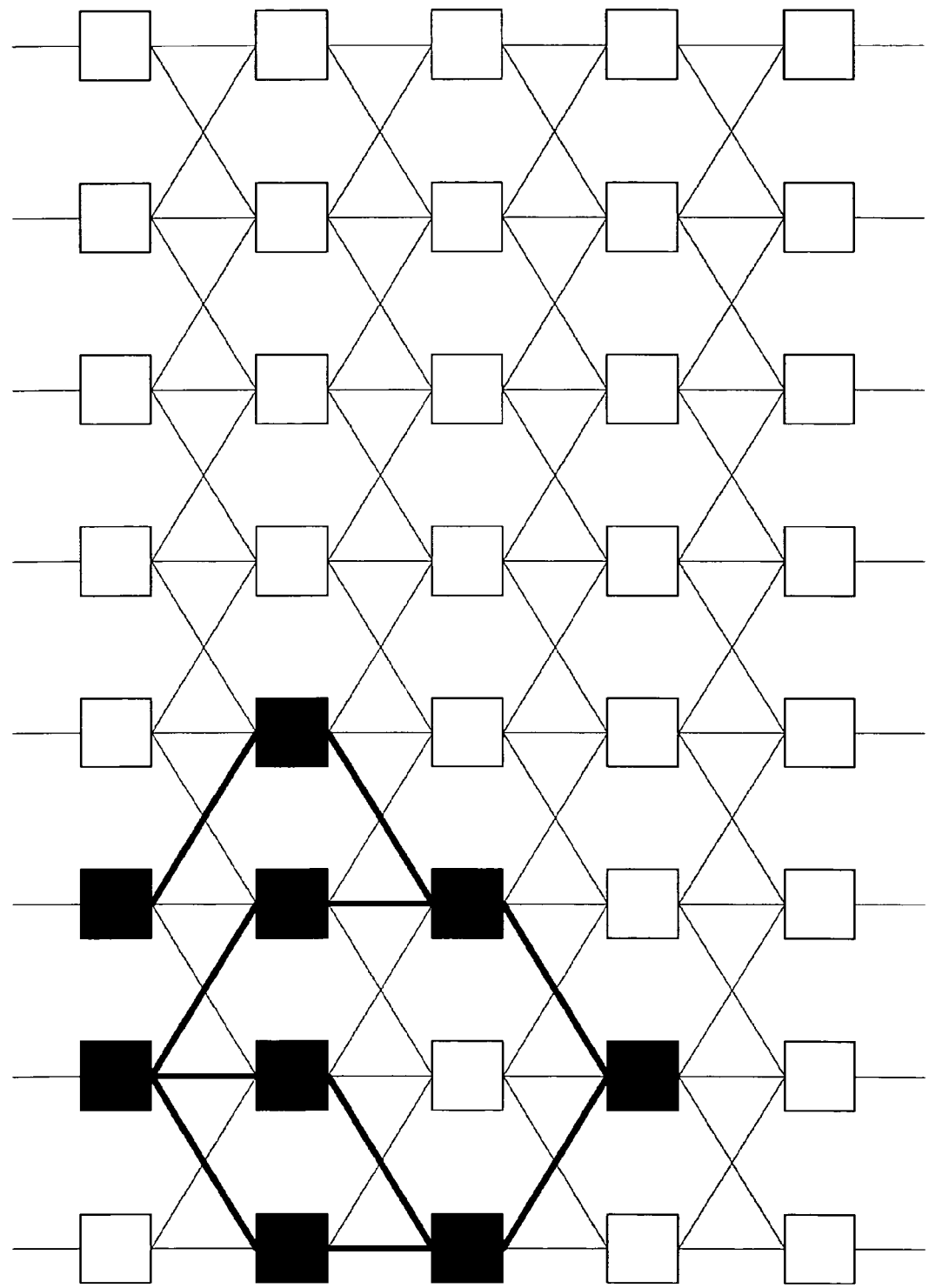
FIG. 19 is a diagram showing an ALU array to which the DFG shown in FIG. 18 is assigned.

FIG. 19 shows an ALU array to which the DFG shown in FIG. 18 is assigned. For convenience of explanation, the ALU array is shown in eight rows and five columns. As described previously, however, this ALU array will be divided into ALU arrays of six rows and three columns.

(ii) Through Node Insertion

In a second method, through nodes are inserted between nodes so that the DFG is transformed into one suited to the wiring between adjoining ALUs. Here, in the DFG, a through node is added so as to be in connection with the node in question along with some of the output nodes of the node. The rest of the output nodes are arranged after the through node, thereby distributing the node outputs. The through node uses the mov instruction in Table 1. This node does not perform any operation.

Figure 20:
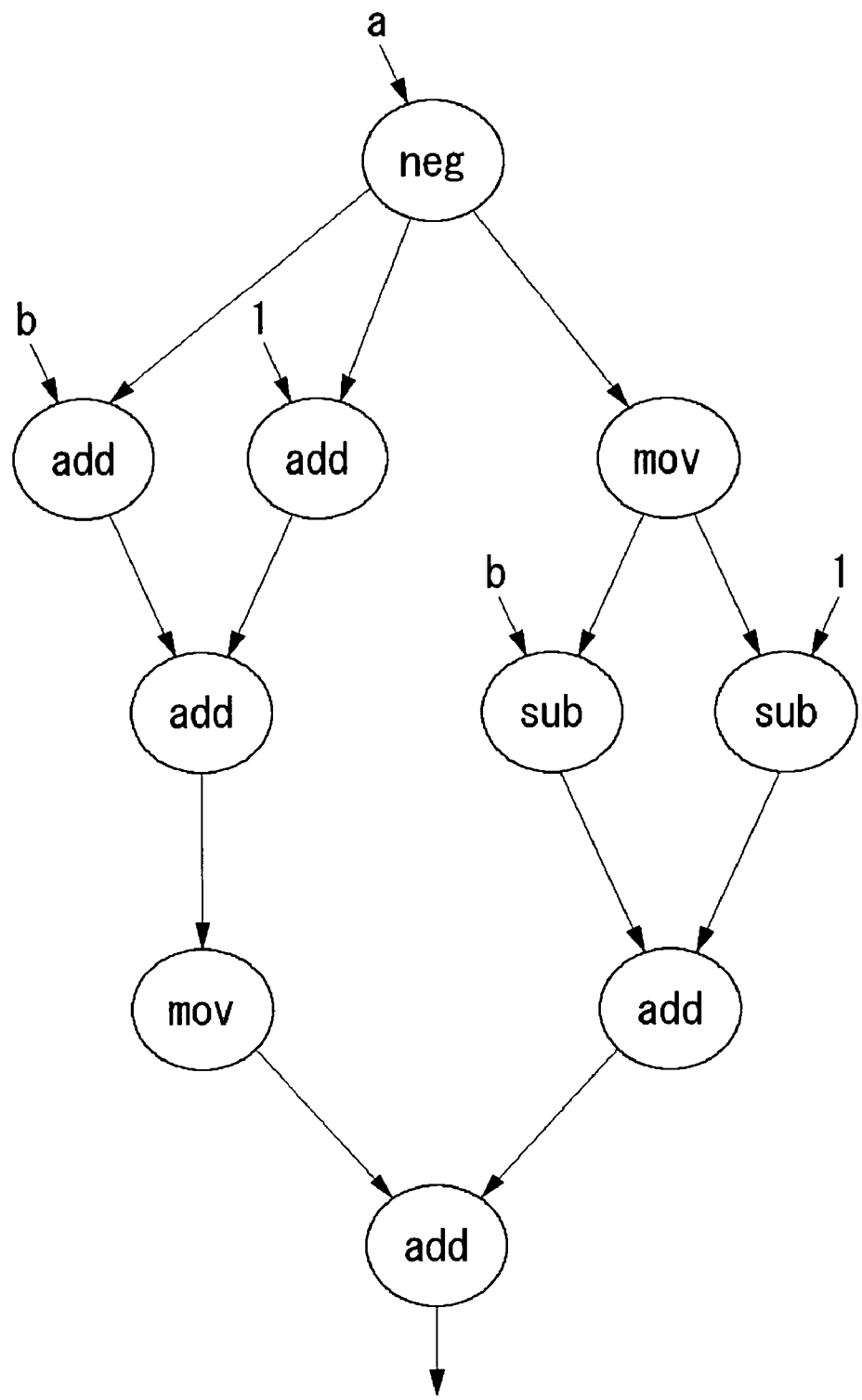
FIG. 20 is a diagram showing a DFG with inserted through nodes.

FIG. 20 shows the DFG with inserted mov nodes. Here, part of the processing that uses the output of the neg node in the second stage of FIG. 17 is shifted to the third stage by using through nodes. The DFG is thus configured so that the four processes are performed in the second and third stages separately. This can solve the problem of the connection limitation in the reconfigurable circuit 12. In addition, as compared to the technique of (iii) DFG division to be described later, the processing can be realized by a single DFG. This allows processing acceleration.

Figure 21:
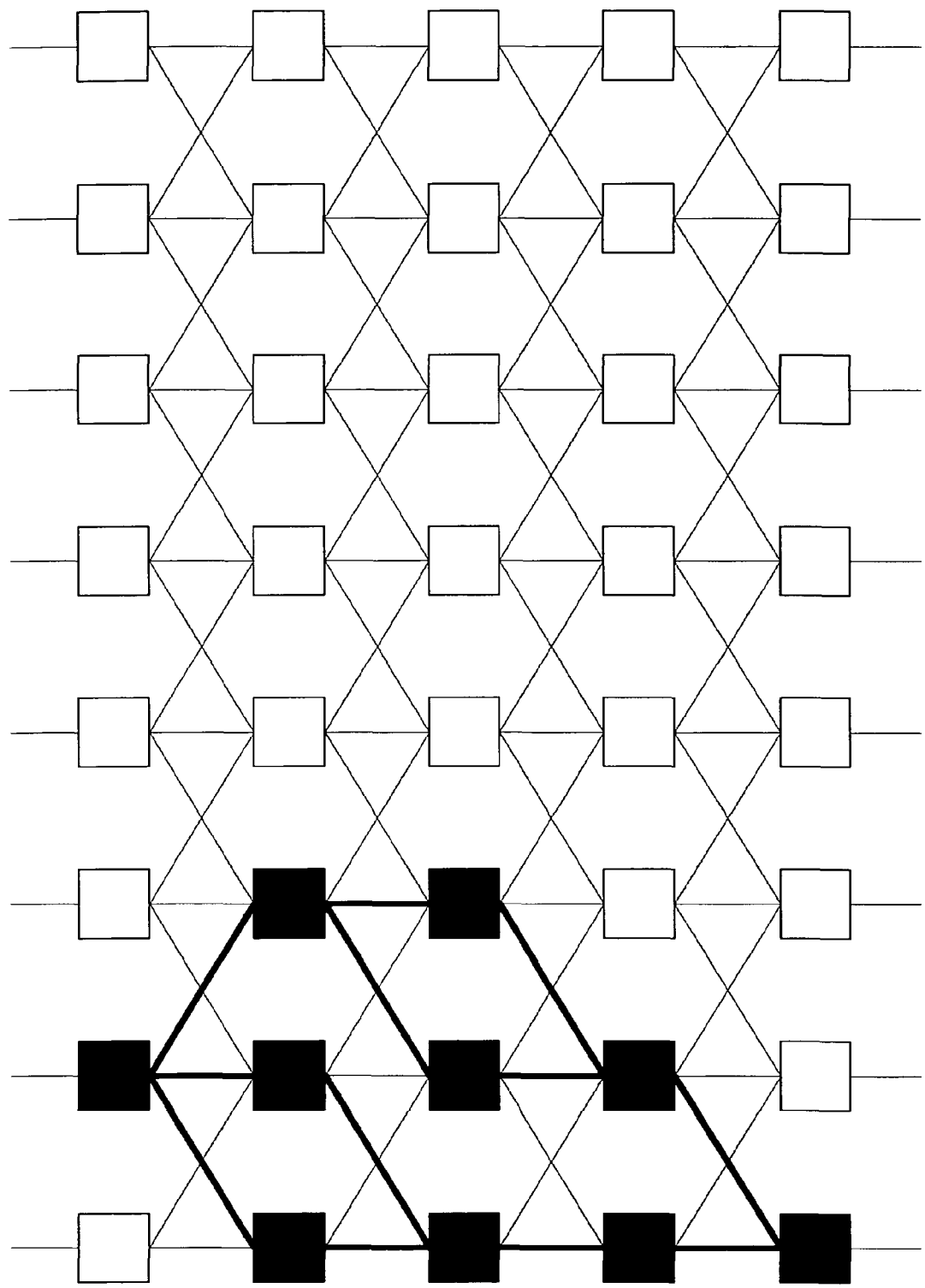
FIG. 21 is a diagram showing an ALU array to which the DFG shown in FIG. 20 is assigned.

FIG. 21 shows an ALU array to which the DFG shown in FIG. 20 is assigned. For convenience of explanation, the ALU array is shown in eight rows and five columns. As described previously, however, this ALU array will be divided into ALU arrays of six rows and three columns.

(iii) DFG Division

In a third method, nodes connected to the node not complying with the connection limitation are arranged as many as the possible number of outputs, and extracted as a sub DFG. The rest of the nodes are formed into another sub DFG.

In the case of FIG. 17, the two add nodes and one sub node in connection with the neg node are formed into an identical sub DFG. Since the remaining one sub node and the subsequent ones including the output add node thereof cannot be assigned, they are formed into another sub DFG.

Figure 22:
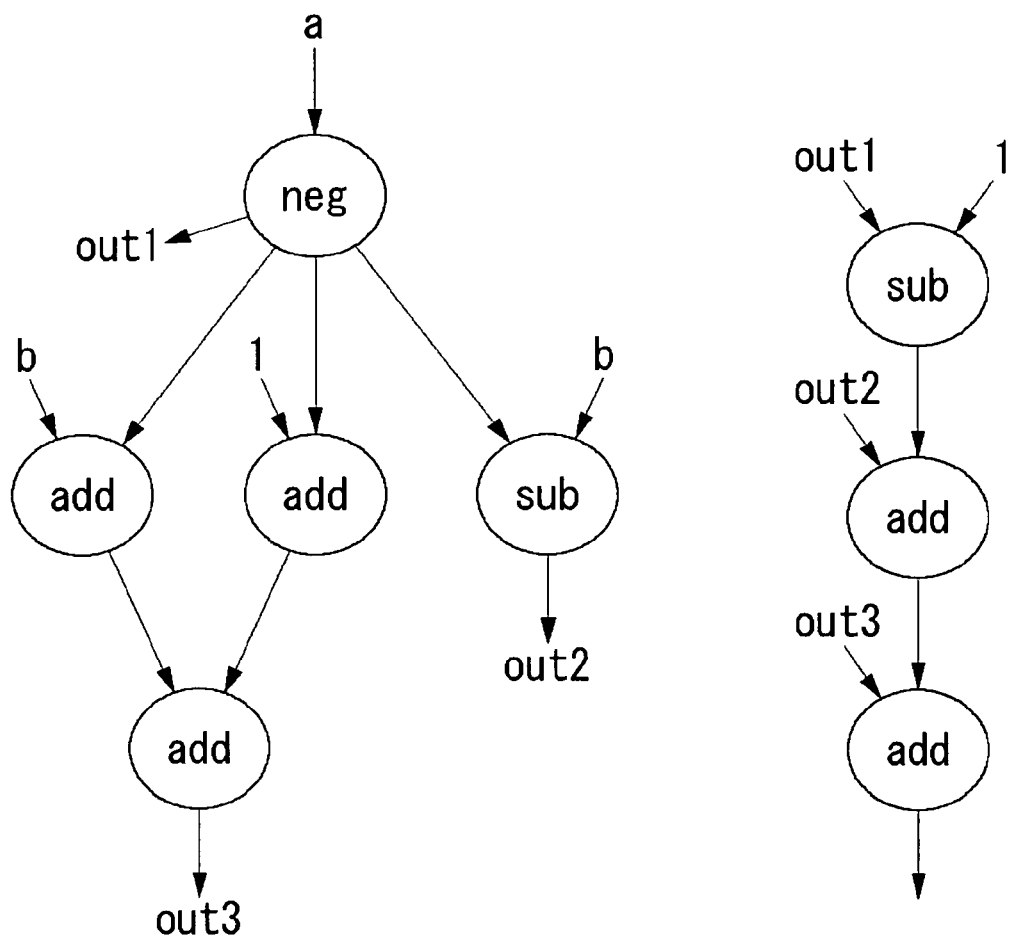
FIG. 22 is a diagram showing two divided sub DFGs.
Figure 23A:
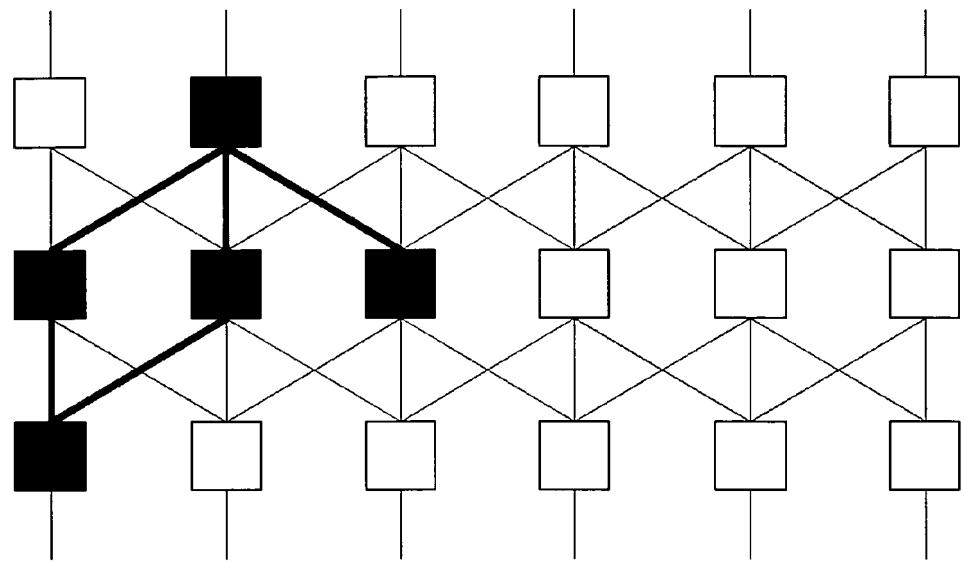
FIGS. 23(a) and 23(b) are diagrams showing the ALU array to which the sub DFGs shown in FIG. 22 are assigned.
Figure 23B:
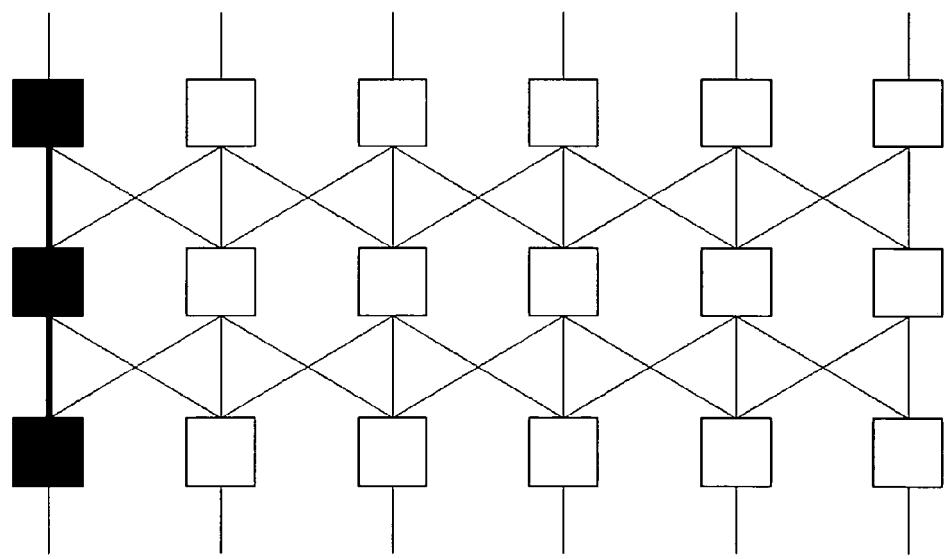

FIG. 22 shows the two divided sub DFGs. FIGS. 23(*a*) and 23(*b*) show the ALU arrays to which the sub DFGs shown in FIG. 22 are assigned. The DFG division will be detailed later.

Sixth Embodiment

Next, description will be given of the method of processing for situations where a DFG cannot be assigned to the ALU array because of the mode of node connection of the DFG.

Figures 24, 25:
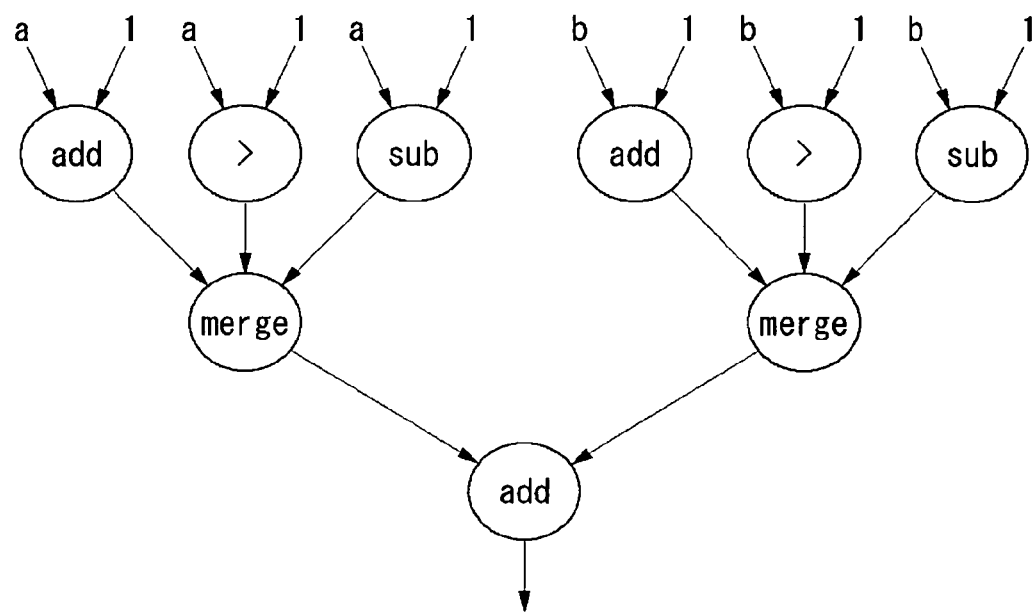
FIG. 24 is a diagram showing an example of a C language program containing conditional statements.
FIG. 25 is a diagram showing a DFG corresponding to the C program shown in FIG. 24.

FIG. 24 shows an example of a C program containing conditional statements. FIG. 25 shows a DFG corresponding to the C program of FIG. 24. In DFGs corresponding to conditional statements, a merge node is generated for each conditional statement. Depending on whether the output of the conditional statement is true or false, one out of two inputs of the merge node is selected. The merge node thus has three inputs.

Figure 26:
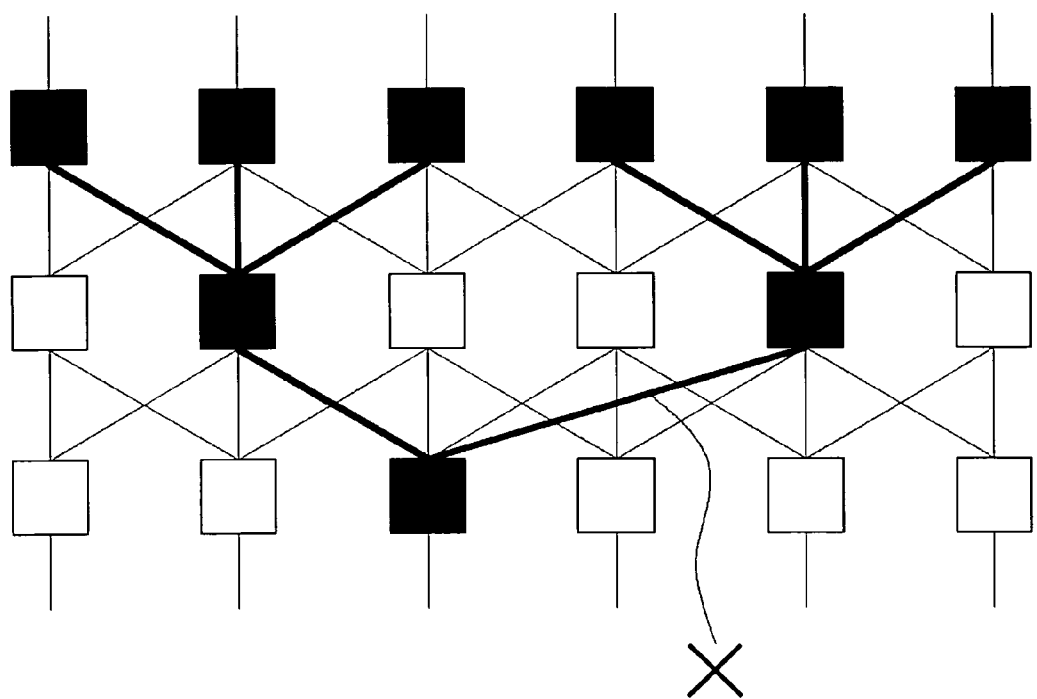
FIG. 26 is a diagram showing the ALU array to which the DFG of FIG. 25 is assigned simply.

FIG. 26 shows an ALU array to which the DFG of FIG. 25 is assigned simply. As shown in FIG. 26, the two merge nodes are associated with ALU11 and ALU41 (see FIG. 8), respectively. Nevertheless, the connection limitation prevents the ALU11 and ALU41 from outputting to an identical destination in the subsequent stage. Consequently, in the DFG of FIG. 25, the add node cannot be associated with the ALU array. In this case, the foregoing method of DFG division is used.

In FIG. 25, the area covering up to the left merge node and the area covering the rest of the nodes are formed into two divided sub DFGs. FIGS. 27(*a*) and 27(*b*) show the ALU arrays to which the sub DFGs generated thus are assigned. Consequently, even if the DFG does not comply with the connection limitation of the ALU array, DFG division allows processing using the connection-limited ALU array.

Seventh Embodiment

As described above, the DFG must be assigned to the ALU array with consideration given to the size and connection limitation of the ALU array. A seventh embodiment will deal with the method of locating ALUs for the individual nodes in the DFG to be assigned to, i.e., the method of determining the functions of the logic circuits in the connection-limited reconfigurable circuit 12. Here, a DFG in which the connections between the nodes are identified based on the input and output variables between individual instructions will be referred to as a DFG in an initial state. From this state, the DFG is assigned to the ALU array by the following steps:
(1) Determine the height of node positions;
(2) Remove fly paths;
(3) Optimize nodes having four or more outputs;
(4) Determine the horizontal positions of the nodes, divide the DFG; and
(5) Combine sub DFGs.

Incidentally, the mapping processing for associating the individual nodes of the DFG with logic circuits of the reconfigurable circuit 12 may be performed by the control unit 18 or by the DFG generating unit 30. This mapping processing is not intended to configure a circuit on the reconfigurable circuit 12 actually, but corresponds to that performed arithmetically for the sake of acquiring final sub DFGs and configuration information for constituting the circuit.

In the step (1), already known algorithms are applied to determine the height of the node positions.

In the step (2), through nodes are inserted when the connections between nodes skip any stage.

In the step (3), nodes having four or more outputs are copied to reduce the numbers of outputs to three or less.

In the step (4), nodes are searched horizontally to determine the horizontal positions of the nodes. Divide the DFG if the nodes cannot be arranged. The divided DFGs are called sub DFGs.

In the step (5), any of a plurality of sub DFGs that are capable of both parallel operation and integral arrangement on the ALU array are combined.

The horizontal search in the step (4), when fully performed on each stage, requires an enormous amount of time. For example, when the ALU array having six ALUs per stage is searched for the horizontal positions of the nodes of a DFG that has three stages each including three nodes, the position search must be performed $$(_6P_3)^3 = (6 \times 5 \times 4)^3 = 120^3 = 1,728,000 \text{ (times)}.$$

Moreover, even if this search is performed for all the patterns, it is not always possible to arrange all the nodes, and the division into sub DFG may be needed. An efficient method of search is thus desired.

Figure 28:
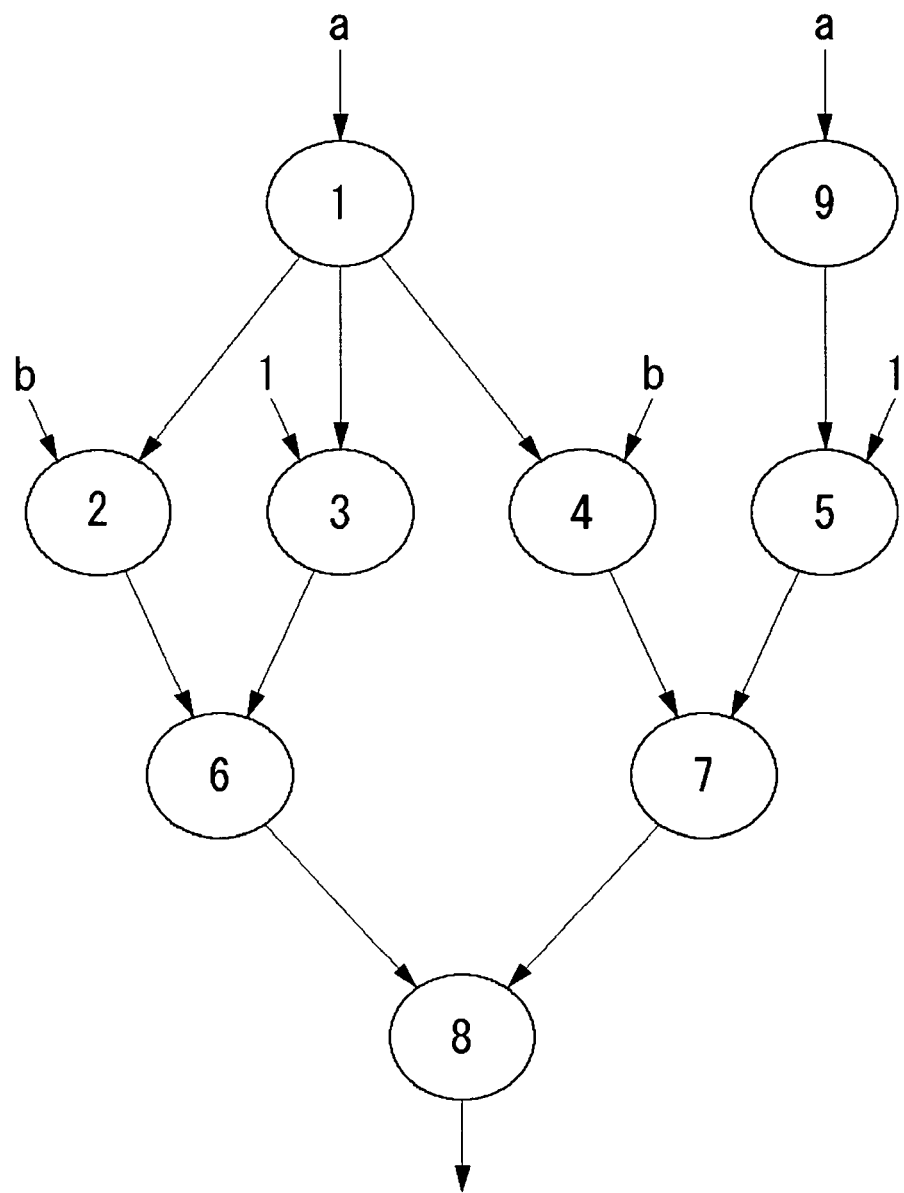
FIG. 28 is a diagram showing the state where node numbers are assigned to the individual nodes of the DFG shown in FIG. 18.
Figure 29:
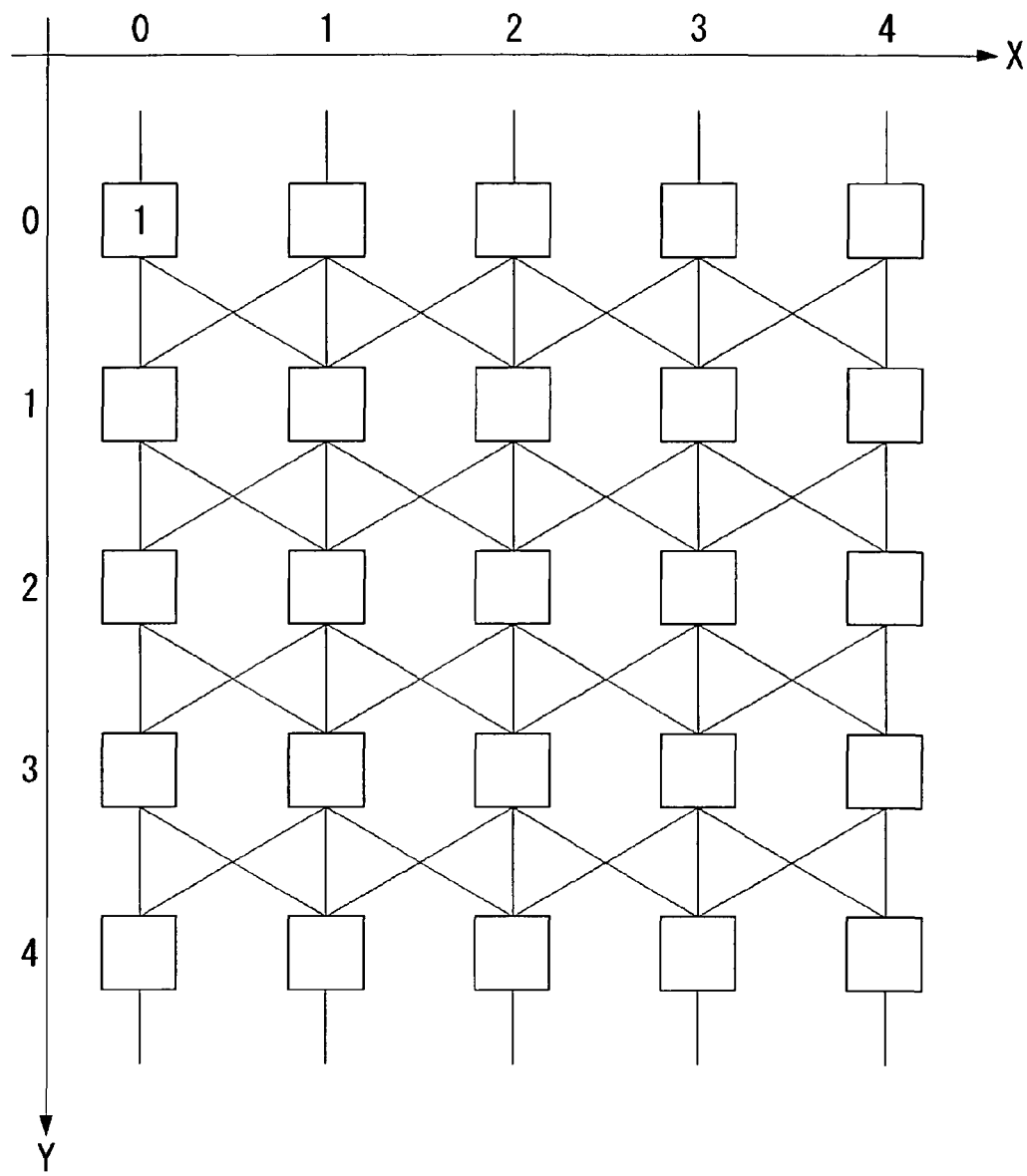
FIG. 29 is a diagram showing the state where the node 1 is arranged.

FIG. 28 shows the state where node numbers are assigned to the individual nodes of the DFG shown in FIG. 18. The node numbers may be assigned by any method. In this example, ascending numbers are assigned basically in a left-to-right fashion. Initially, one node is selected from the top stage, and arranged at the top left in the ALU array. If there are a plurality of nodes, any one of these may be selected. In the shown example, the one having the smallest node number is selected (specifically, the node 1 is selected). FIG. 29 shows the state where the node 1 is arranged at the top left. For convenience of explanation, the following description will be given with an example of an ALU array that has a greater number of stages than the ALU array of the reconfigurable circuit 12 shown in FIG. 8 has. As stated previously, the actual assignment to the ALU array of FIG. 8 will require circuit division.

Figure 30:
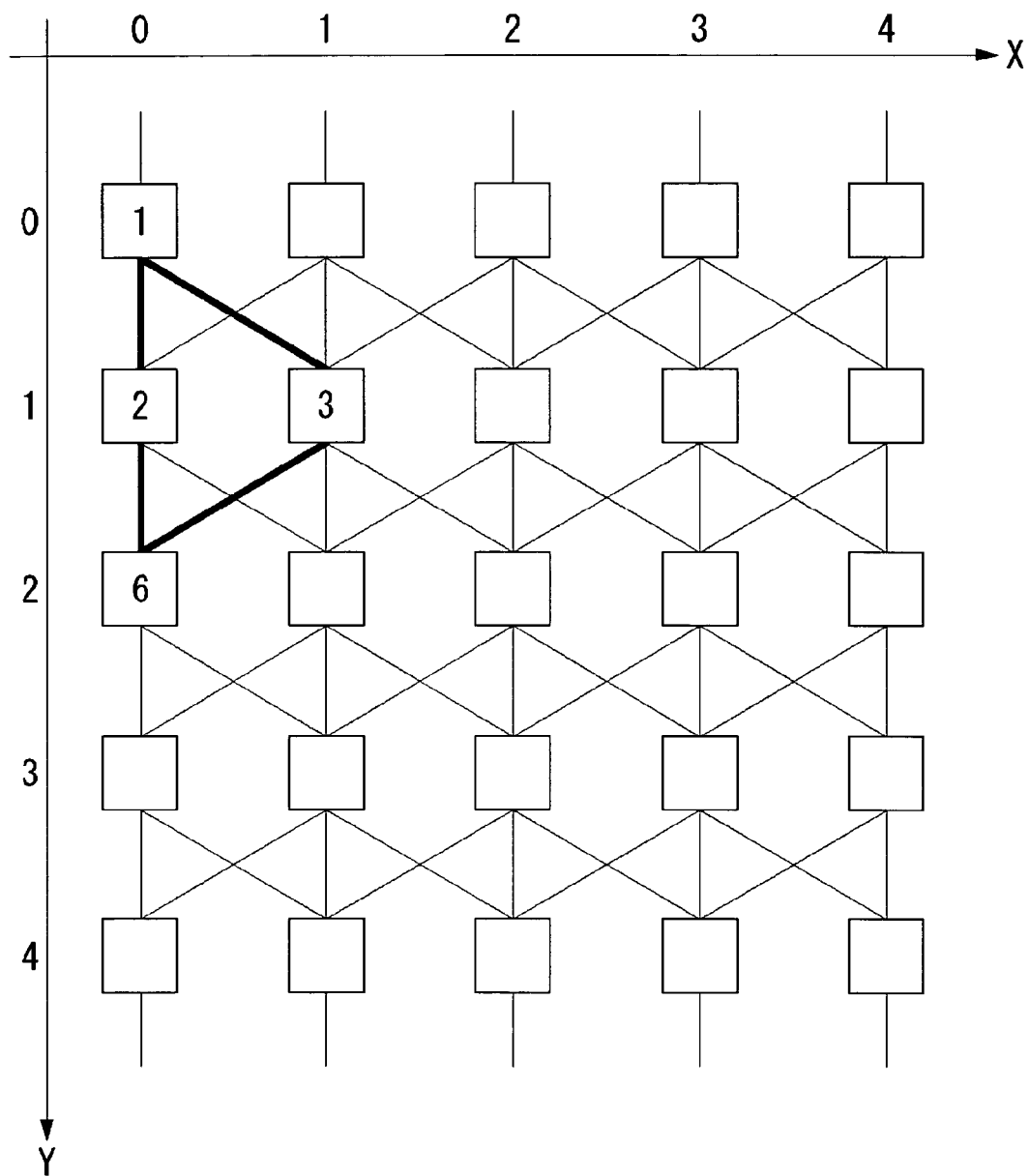
FIG. 30 is a diagram showing the state where a plurality of nodes are arranged.

Next, nodes that input the outputs of the arranged node are selected one by one, and arranged at the lower left, immediately below, and the lower right of the arranged node in order if possible. Here, the nodes 2, 3, and 4 input the outputs of the node 1. In the shown example, the nodes are selected in ascending order of the node numbers. Hereinafter, positions shall be expressed as (X,Y). Since the node 1 lies in the position of (0,0), searches for a possible position of the node 2 are made in order of (−1,1), (0,1), and (1,1). Negative values are unacceptable, and the node 2 is thus arranged in (0,1). Next, it is examined if the node 2 inputs any other node than the node 1. If any, the input node(s) is/are arranged. Since there is no other than the node 1, this step is skipped here. Next, the node 6, which inputs the output of the node 2, is arranged in (0,2) in the same way. The node 6 inputs the unarranged node 3, which is then arranged. Searches for a possible position of the node 3 are made in order of the upper left, immediately above, and the upper right of the node 6. Here, the node 3 is arranged in (1,1) since the node 2 is already arranged in (0,1) immediately above. The node 3 also inputs the node 1. The node 1 falls on the upper left of the node 3, and can thus be merged. FIG. 30 shows the state of arrangement up to this point.

Figure 31:
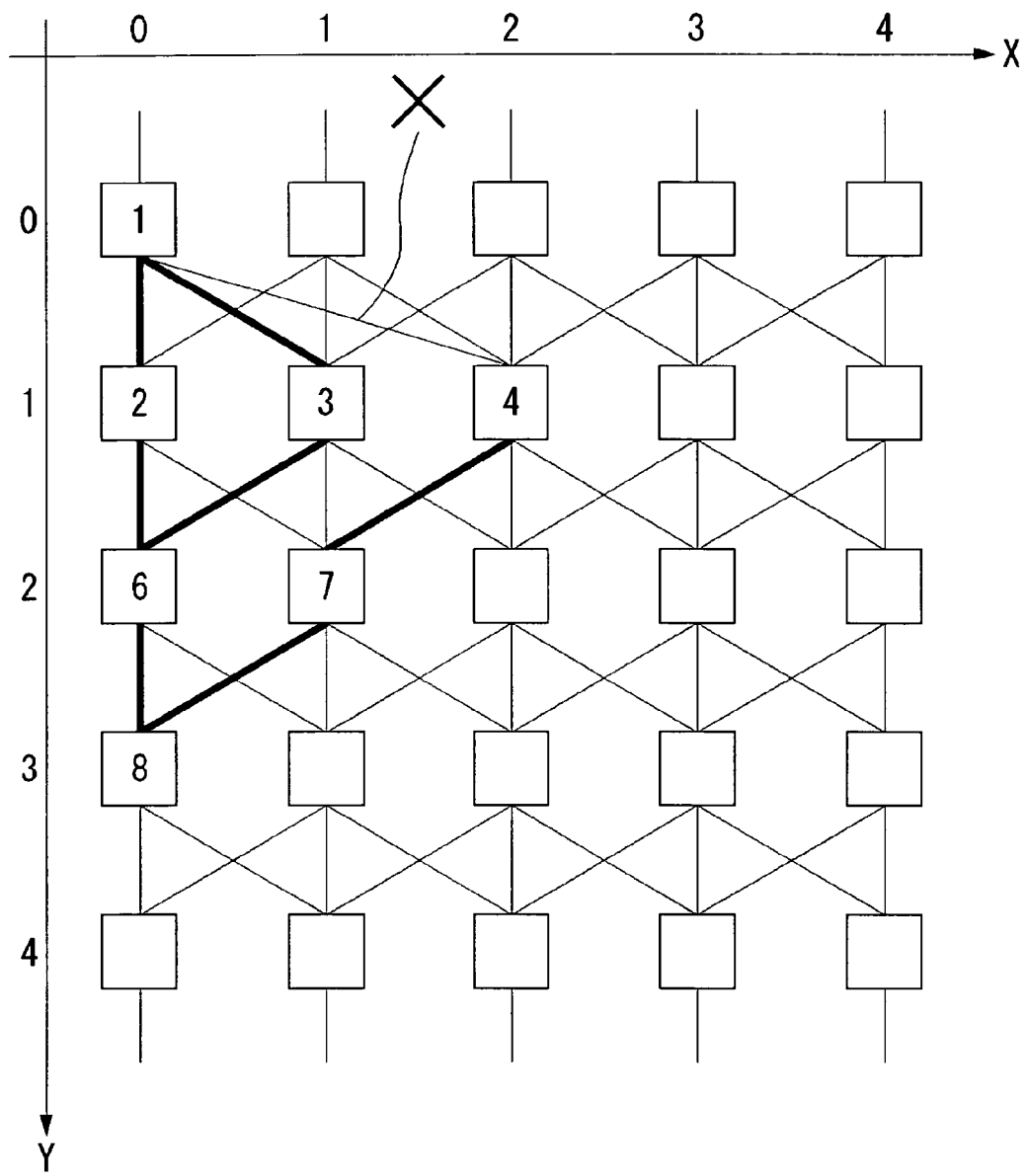
FIG. 31 is a diagram showing the state where the node 8 is placed in (0,3)
Figure 32:
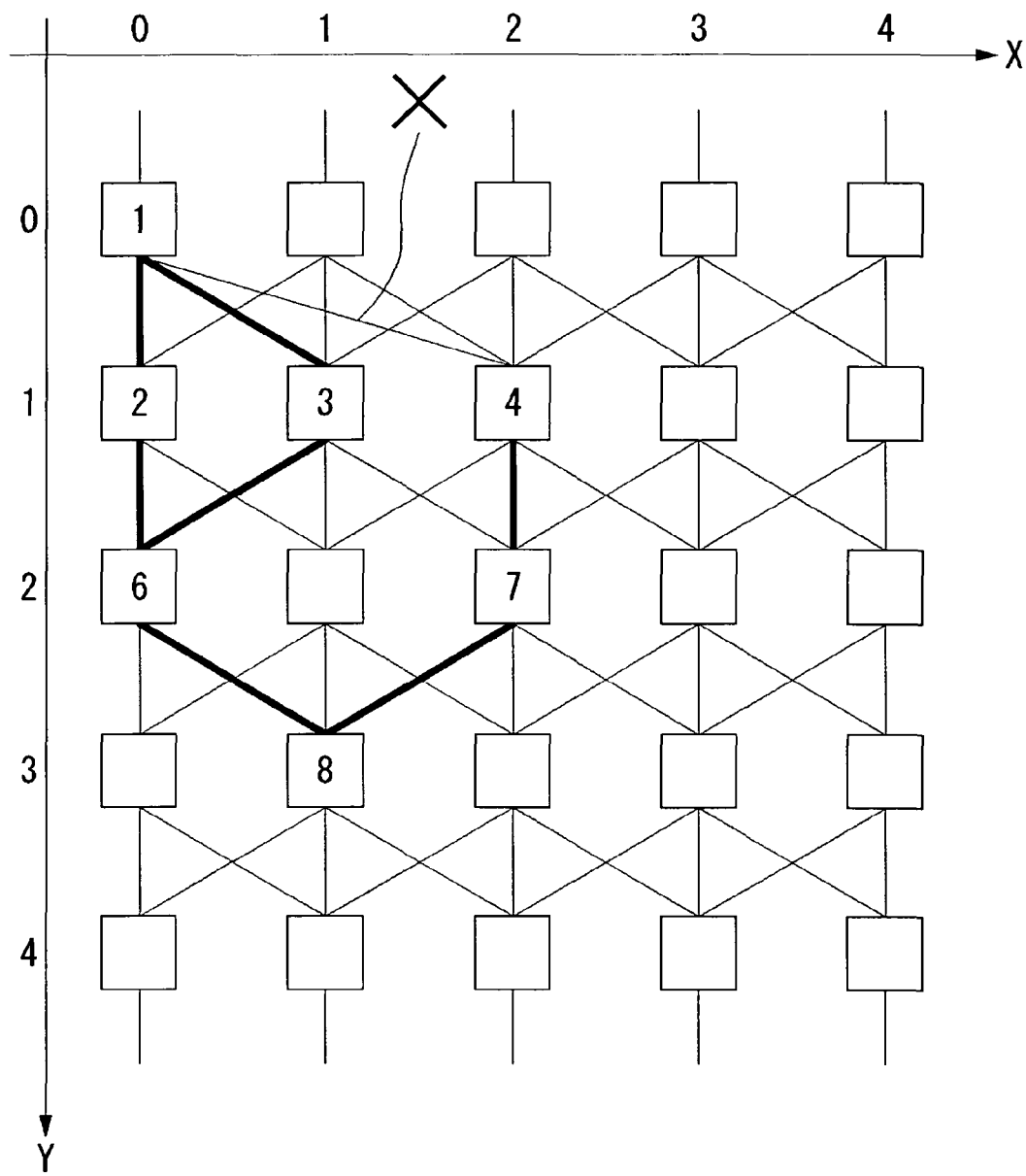
FIG. 32 is a diagram showing the state where the node 8 is placed in (1,3)

In the same manner, the node 8, which inputs the output of the node 6, is arranged. The node 8 is shifted to immediately below and to the lower left in succession, searching for all possible positions of arrangement of the node 8. FIG. 31 is a diagram in which the node 8 is placed in (0,3). FIG. 32 is a diagram in which the node 8 is placed in (1,3). As shown in FIGS. 31 and 32, irrespective of which the node 7 is placed in, (1,2) or (2,2), the input node 4 must be arranged in (2,1) and cannot be merged with its input, the node 1. At this point, it is shown that the arrangement of the node 8 is inappropriate. The horizontal positions of the nodes 8, 7, and 4 are thus deleted.

Figure 33:
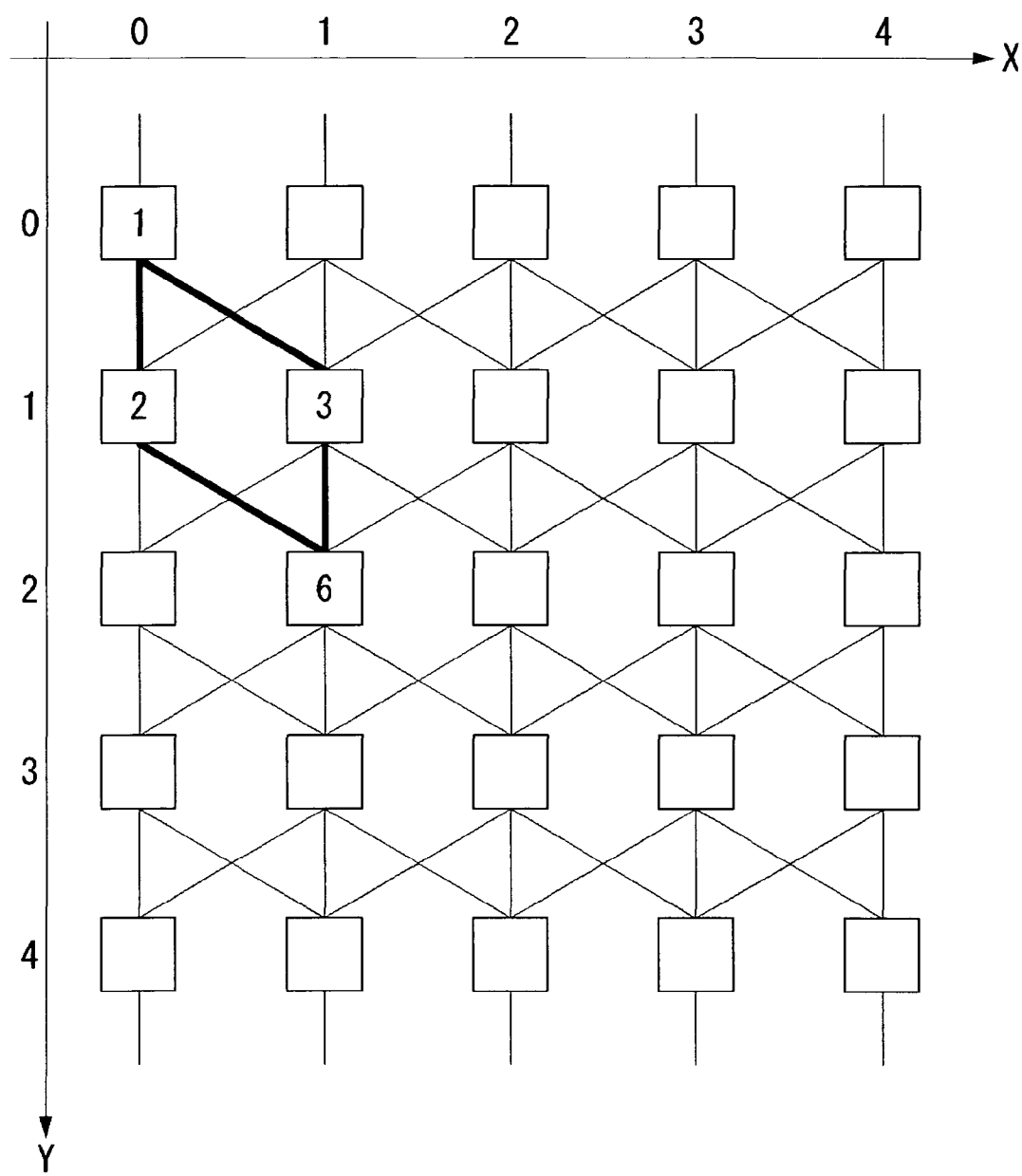
FIG. 33 is a diagram showing the state where the node 6 is placed in (1,2)

Next, as shown in FIG. 33, the node 6 is shifted to (1,2), followed by searches for the arrangement of the node 8. Even in this case, the foregoing search processing is repeated to find that the node 4 has no other choice than being arranged in (2,1). Then, the node 4 cannot be merged with its input, the node 1. Such search processing is repeated successively. The node 2 is then shifted from (0,1) to (1,1) for the same search. If not arrangeable in any case, the processing returns to the step of arranging the node 1, and the position of the node 1 is changed from (0,0) to (1,0), (2,0), . . . (5,0) for search. In this example, all the nodes can be arranged finally when the position of the node 1 is shifted to (1,0). As is evident from this processing algorithm, it is possible to reduce the number of searches significantly as compared to the case where full searches are performed on each stage.

Figure 34:
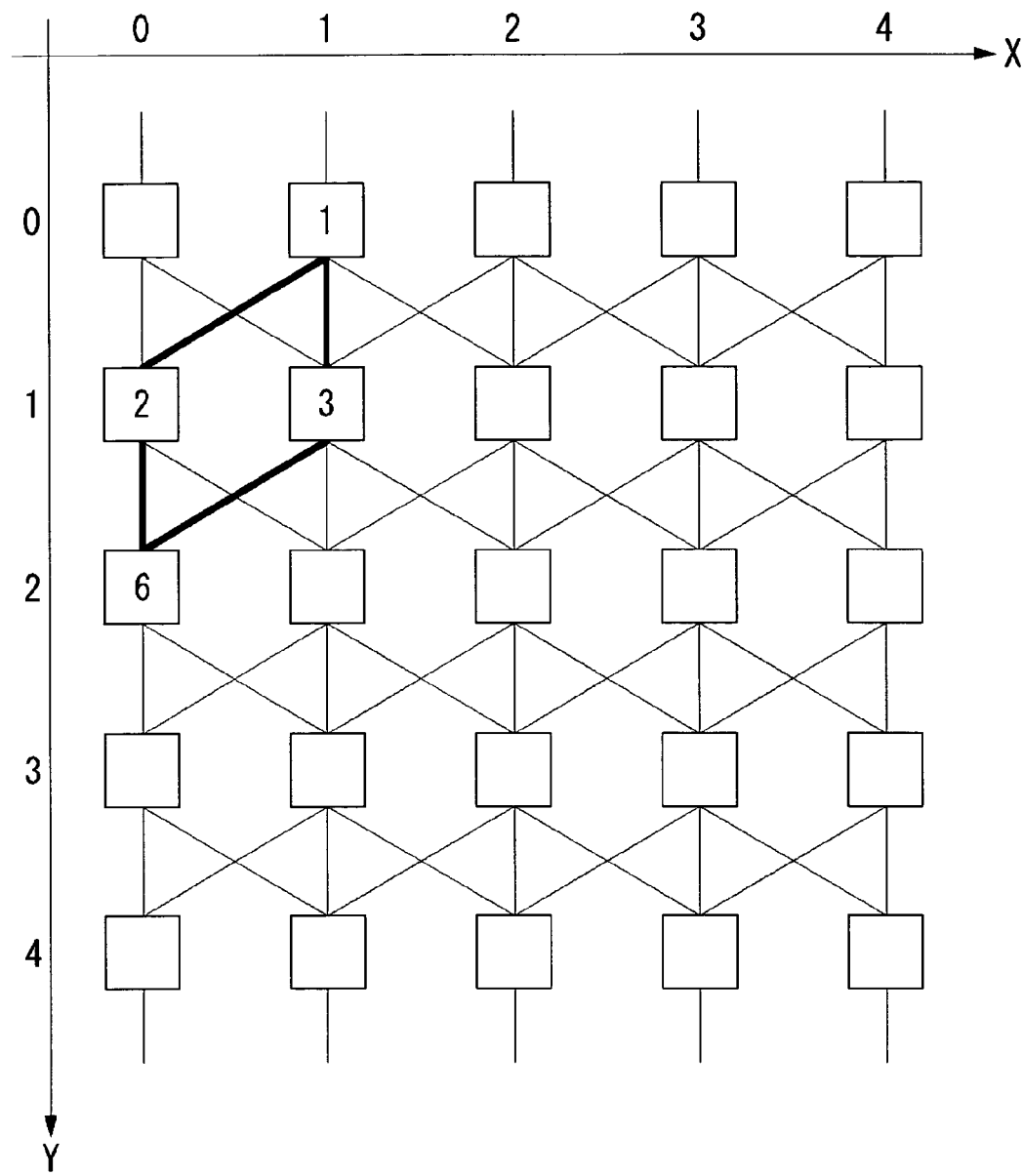
FIG. 34 is a diagram showing the state where the node 1 is arranged in (1,0), and the arrangement of the nodes 2, 6, and 3 is determined in this order.
Figure 35:
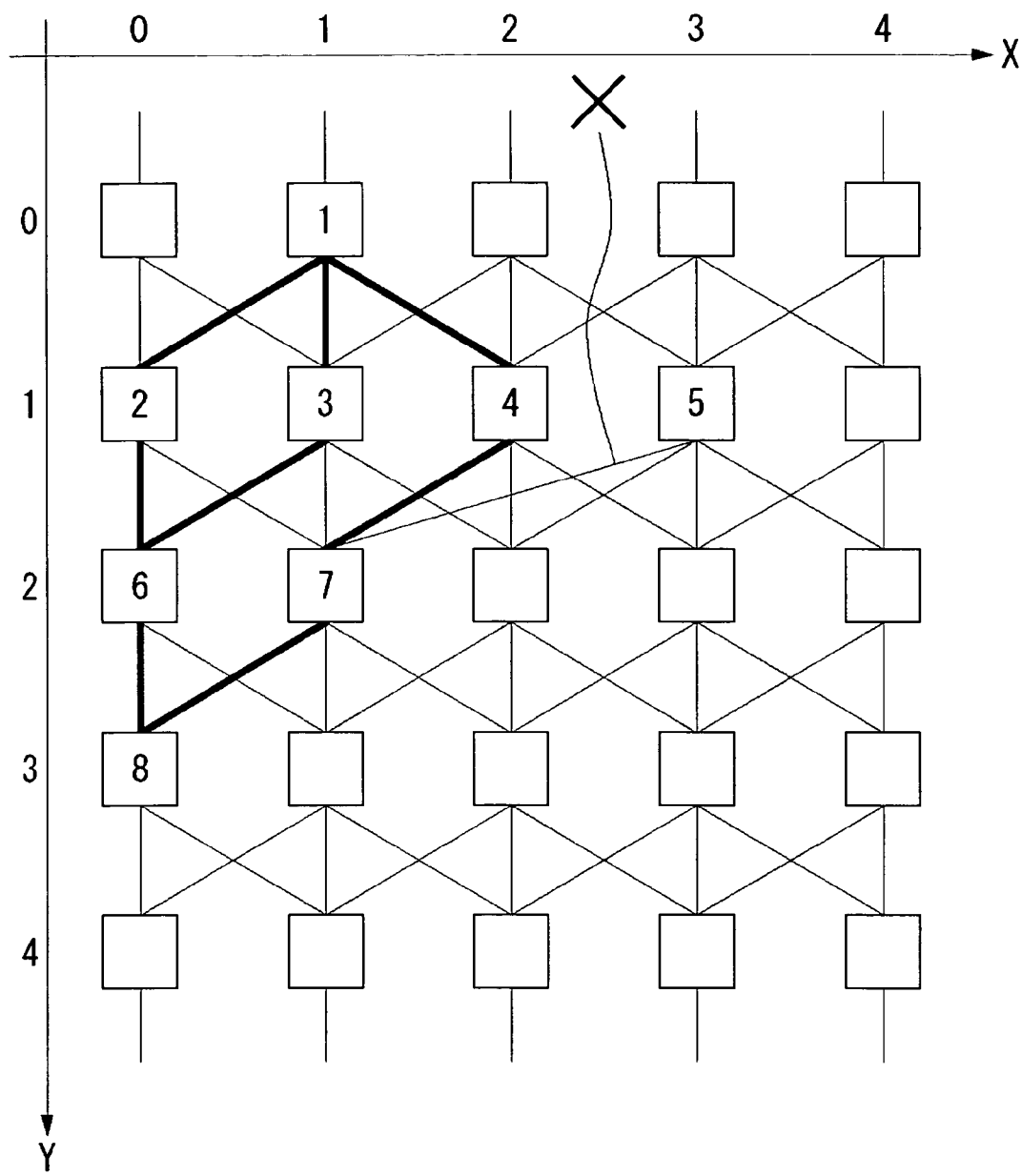
FIG. 35 is a diagram showing the state where the arrangement of the nodes 8, 7, and 4 is determined with reference to the node 6.
Figure 36:
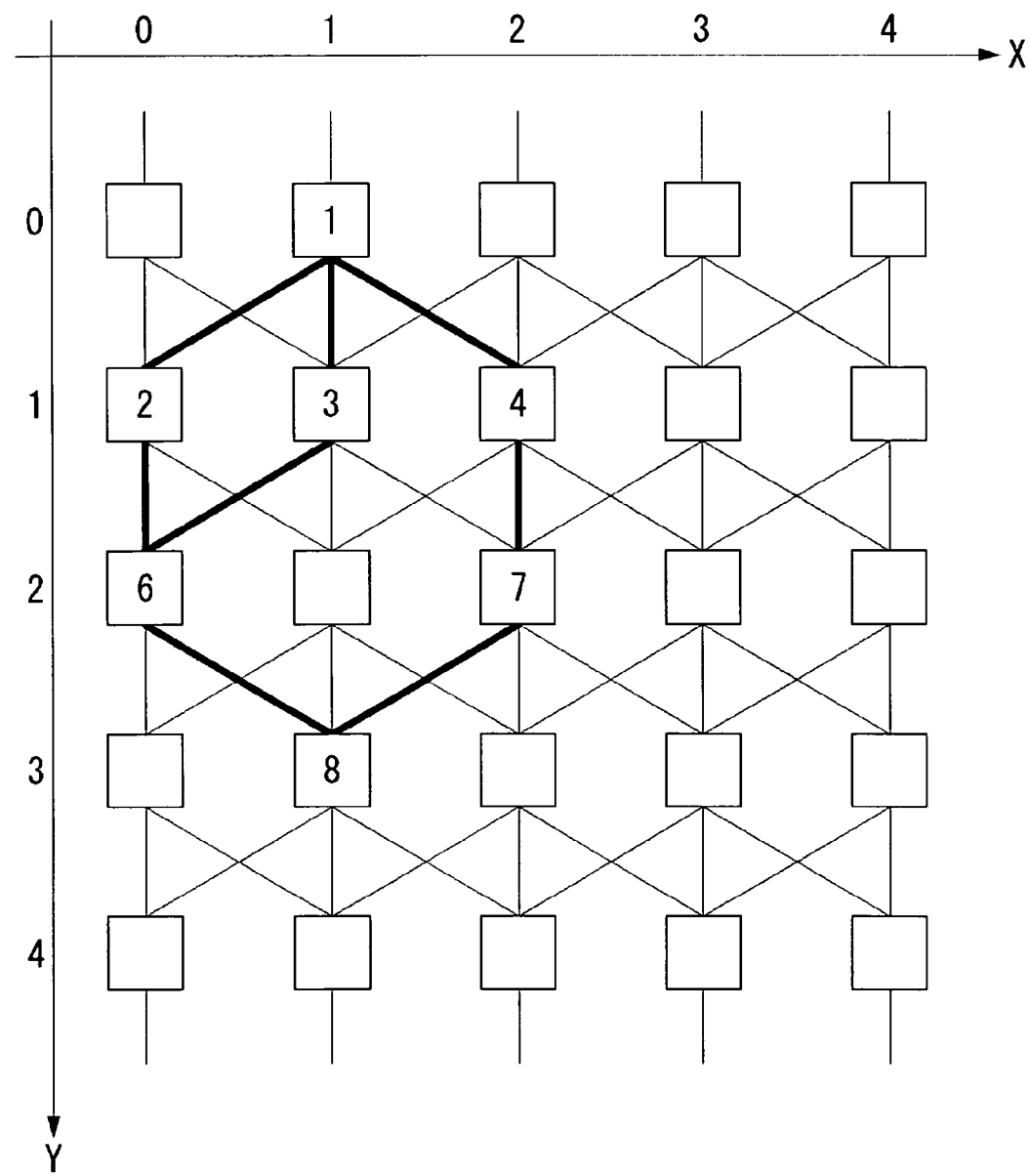
FIG. 36 is a diagram showing the state where the node 7 is placed in (2,2)
Figure 37:
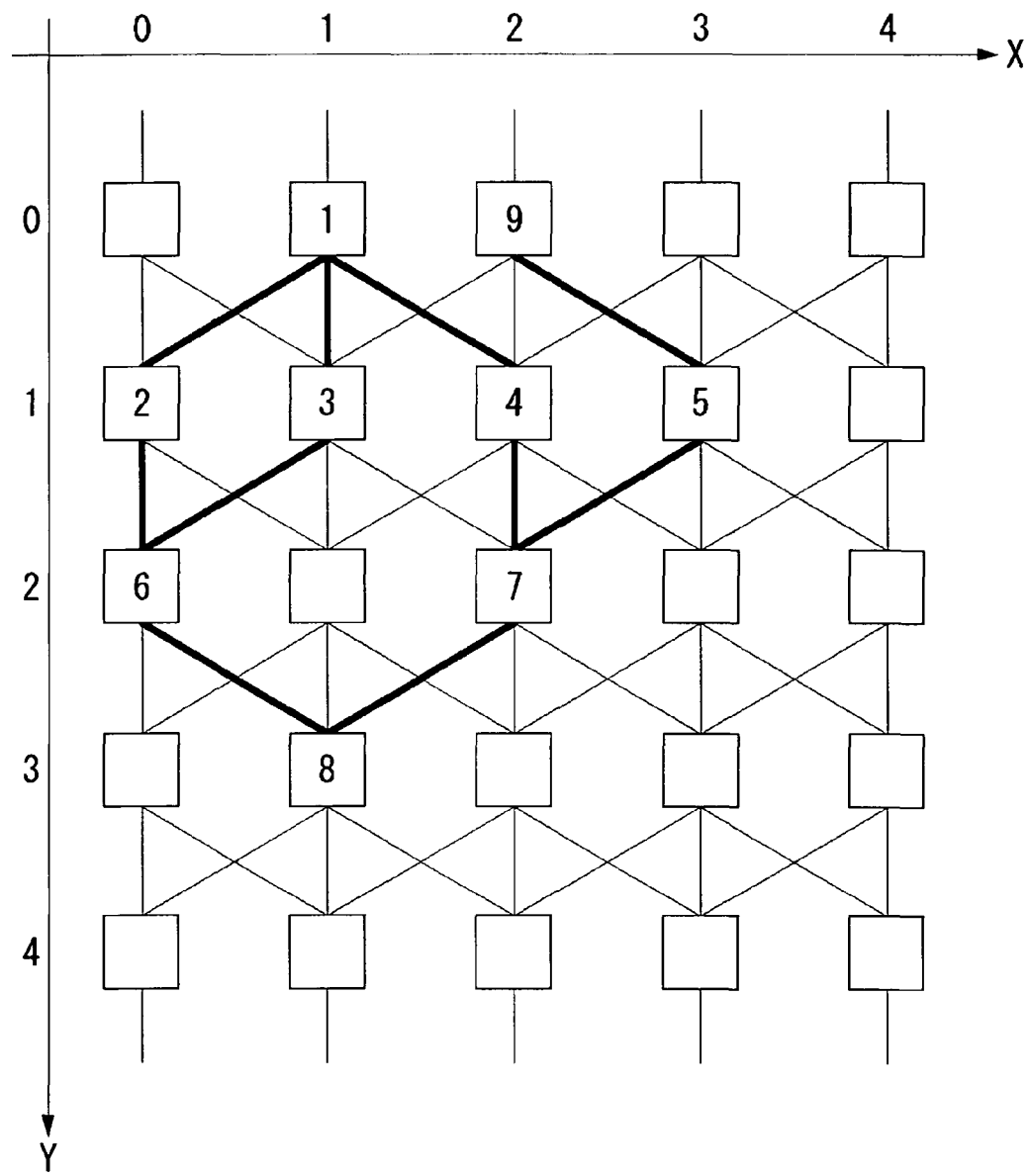
FIG. 37 is a diagram showing the state where the arrangement of all the nodes on the ALU array is determined.

FIG. 34 shows the state where the node 1 is arranged in (1,0), and the arrangement of the nodes 2, 6, and 3 is determined in this order. Subsequently, as shown in FIG. 35, the arrangement of the nodes 8, 7, and 4 is determined with reference to the node 6. In this case, however, the node 5 cannot be arranged in connection with the node 7. Thus, the position of the node 8 is shifted to the right by one, followed by arrangement. Consequently, as shown in FIG. 36, the node 7 can be arranged in (2,2). The node 5 can thus be arranged in (3,1). As shown in FIG. 37, this settles the arrangement in the connection-limited ALU array.

Hereinafter, the method of arranging nodes in the connection-limited ALU array will be described with reference to FIGS. 38 to 41. Nodes represent the functions of logic circuits (ALUs), and determining the node arrangement is equivalent to determining the functions of the logic circuits in the ALU array. The following description will deal with the case of mapping the DFG shown in FIG. 28 to the ALU array.

Figure 38:
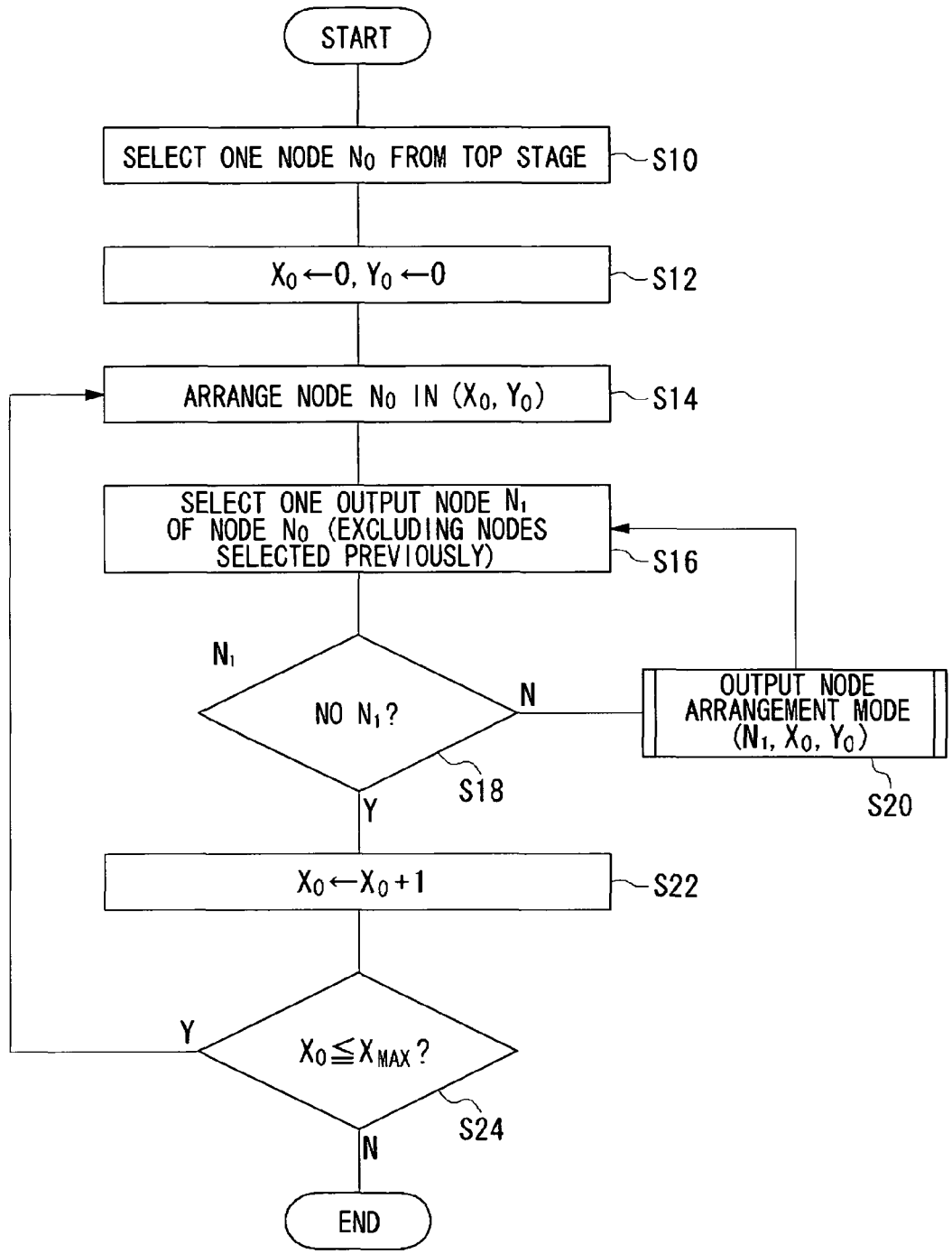
FIG. 38 is a main flowchart of the node arrangement.

FIG. 38 shows the main flow of the node arrangement. In FIG. 38, one node $N_0$ is selected from the top stage of the DFG (S10). Here, the node 1 shall be selected. $X_0$ and $Y_0$ both are initialized to zero (S12), and the node $N_0$ is arranged in (0,0) (S14). This state appears in FIG. 29.

Next, one output node $N_1$ of the node $N_0$ is selected (S16). Here, previously selected nodes are excluded if any. Referring to FIG. 28, the node 1 has the nodes 2, 3, and 4 as its output nodes. The node 2 shall be selected here. If there is any output node $N_1$ (N at S18), the processing enters an output node arrangement mode (S20). Note that ($N_1$, $X_0$, $Y_0$) are passed as arguments to the processing flow of the output node arrangement mode.

Figure 39:
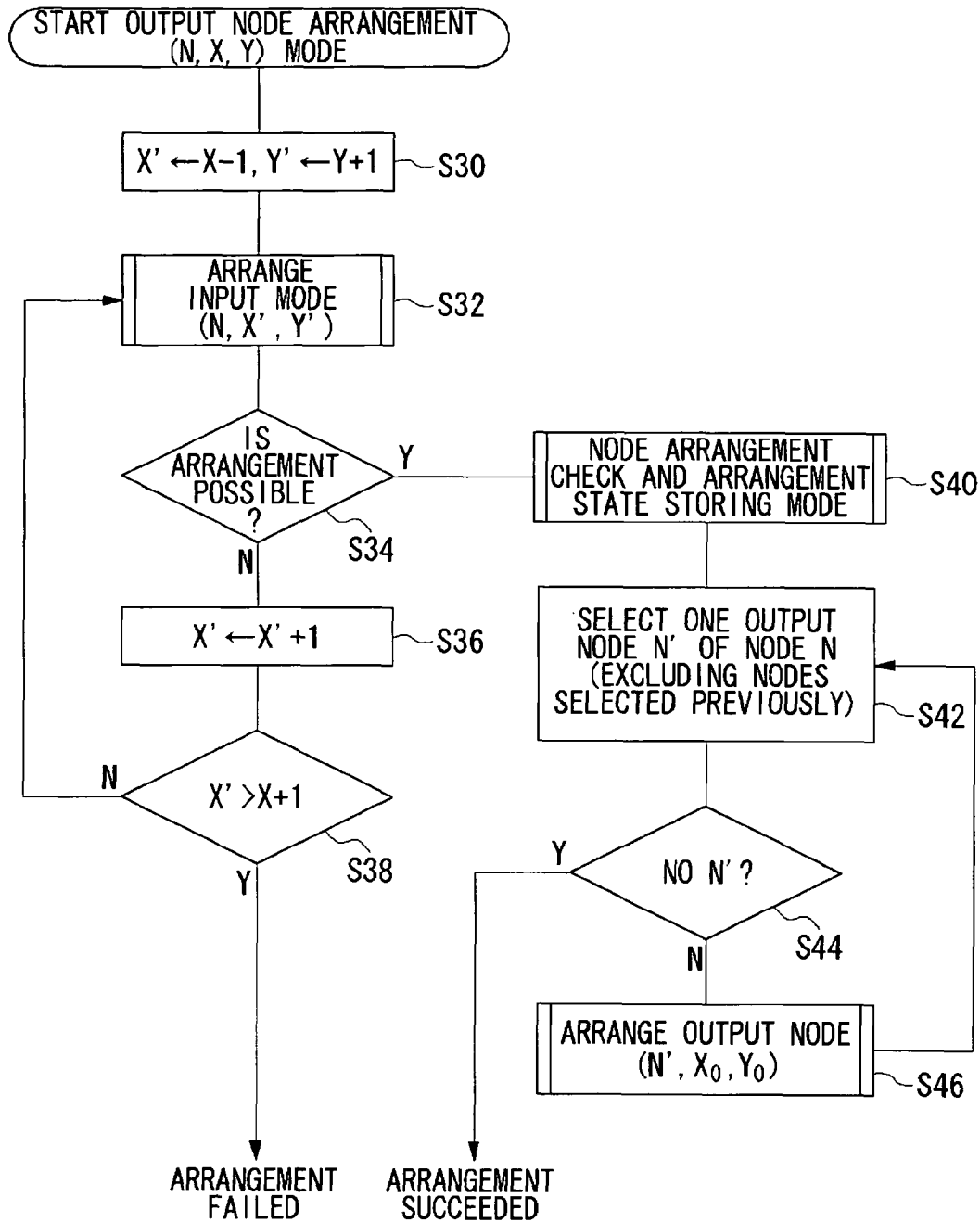
FIG. 39 is a processing flowchart in an output node arrangement mode.

FIG. 39 shows the processing flow of the output node arrangement mode. In the output node arrangement mode, the stage is initially lowered by one (Y'←Y+1), and the column is shifted to the left by one (X'←X−1) (S30). As a result, the coordinates (0,0) are transformed into the coordinates (−1,1). The reason for lowering the stage by one is that the output node lies in the stage immediately below. The reason for shifting the column to the left by one is that the ALU array of the present embodiment has the limitation that output nodes lie in three possible directions, i.e., directly below and on the right and left thereof. Whether or not a node can be arranged to the lower left is examined initially, and then examinations are made successively as to the cases of arranging the node directly below and to the lower right. In this state, the processing enters an input node arrangement mode (S32). Here, (N, X', Y') are passed as arguments to the processing flow of the input node arrangement mode.

Figure 40:
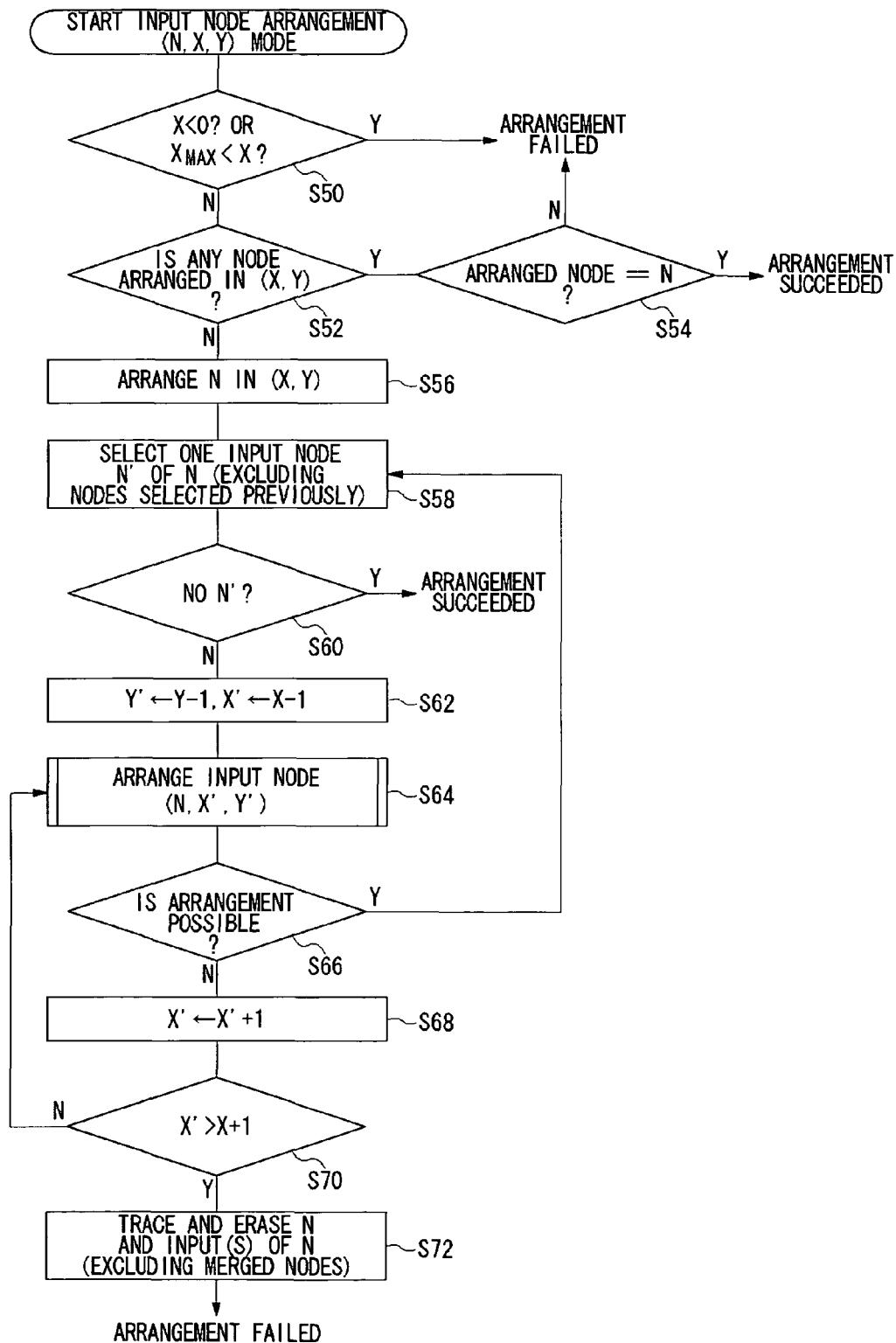
FIG. 40 is a processing flowchart in an input node arrangement mode.

FIG. 40 shows the processing flow of the input node arrangement mode. In the input node arrangement mode, if X<0 or $X_{MAX}$<X (Y at S50), the arrangement is regarded as failed and the input node arrangement mode is terminated. The processing moves to the S34 in FIG. 39. Here, $X_{MAX}$ is a value determined by subtracting one from the number of ALUs in a single stage of the ALU array. In the example shown in FIG. 8, the number of ALUs in the horizontal direction is six, and $X_{MAX}$ is five. When $0 \leq X \leq X_{MAX}$ (N at S50) and any node is already arranged in (X,Y) (Y at S52), the arrangement is regarded as succeeded if the arranged node is itself (Y at S54). If not, the arrangement is regarded as failed (N at S54). After the determination at S54, the processing moves to S34 in FIG. 39. In the concrete example of mapping the DFG of FIG. 28, (−1,1) are initially passed as the arguments. At S50, it is determined that X<0, and the processing returns to S34 of FIG. 39 because of failed arrangement.

At S34 of FIG. 39, since the arrangement is failed (N at S34), X' is incremented by one (S36). This processing is the step of searching for output nodes from the lower left to directly below, and to the lower right in succession. In this example, validity check will be conducted for the case where the node is arranged directly below. Specifically, the increment by one sets the coordinates (X',Y') to (0,1). Unless X' exceeds (X+1) (N at S38), it is possible to return to the input node arrangement mode (S32). The case that X' exceeds (X+1) (Y at S38) corresponds to searching for output nodes on the right of the lower right. Since the present embodiment is predicated on the imposition of the limitation on the connections of the logic circuits, the arrangement to second or farther right nodes (or left nodes) from directly below is excluded.

At S32, the processing enters the input node arrangement mode again. This time, at S50, X (=0) has a value no smaller than zero and no greater than $X_{MAX}$ (N at S50). Besides, no node is previously arranged in (X,Y), or (0,1) in concrete terms (N at S52). Thus, the node N (the node 2 in this case) is arranged in (X,Y) (S56). Consequently, the node 1 is arranged in (0,0) and the node 2 is arranged in (0,1).

Subsequently, one input node N' of the node N is selected from the DFG (S58). Note that previously selected input nodes shall be excluded. Here, the node 1 (selected previously) is the only one input node of the node 2. In the absence of any other input node, it is determined that there is no input node N' (Y at S60). Since the arrangement up to this point is regarded as succeeded, the processing exits the input node arrangement mode and moves to S34 in FIG. 39. Since the arrangement is possible at S34 (Y at S34), the processing enters a node arrangement check and arrangement state storing mode (hereinafter, referred to as "node arrangement check mode") (S40).

Figure 41:
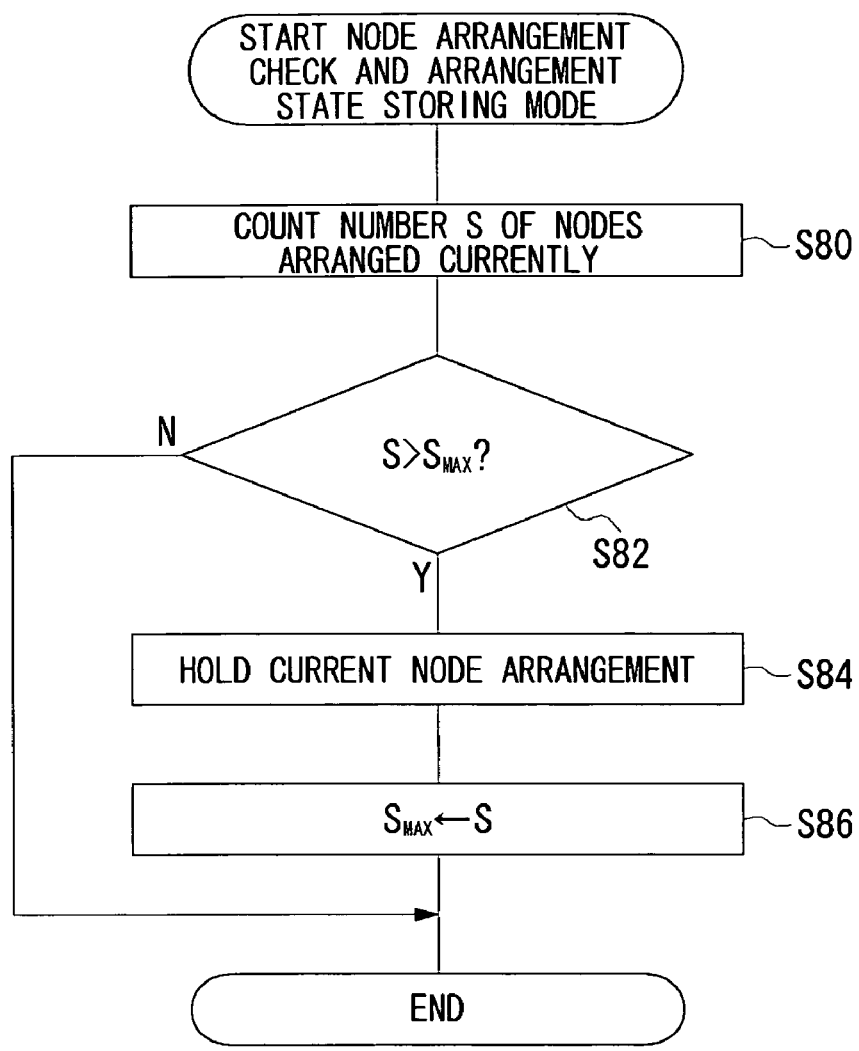
FIG. 41 is a processing flowchart in a node arrangement check mode.

FIG. 41 shows the processing flow of the node arrangement check mode. In this node arrangement check mode, a state where a maximum number of nodes can be arranged is checked for and the state of arrangement is stored. The state of arrangement is stored not only when all the nodes can be arranged but also when only some of the nodes can be arranged. The state of arrangement may be stored, for example, in the form of data on a plurality of sub DFGs. Consequently, at the time of configuration of the ALU array afterward, the sub DFGs can be combined to generate the circuit to be generated even if the circuit to be generated cannot be created from a single DFG.

In the node arrangement check mode, the number S of nodes arranged currently is counted initially (S80). The number S of nodes is compared with $S_{MAX}$. $S_{MAX}$ is initialized to zero in advance. If the number S of nodes is greater than $S_{MAX}$ (Y at S82), the node arrangement at that time is held (S84) and S is set at $S_{MAX}$ (S86). If the number S of nodes is smaller than or equal to $S_{MAX}$ (N at S82), the node arrangement check mode is ended and the processing moves to S42 in FIG. 39.

At S42, one output node N' of the node N is selected from the DFG. In the concrete example, the output node 6 of the node 2 is selected. If there is no output node N' (Y at S44), the arrangement up to this point is regarded as succeeded. On the other hand, if there is any output node N' (N at S44), the output node arrangement mode is called recursively (S46).

In the output node arrangement mode called recursively, at S30, the stage immediately below is searched for a possible position of arrangement of the node 6. In this output node arrangement mode, the arrangement of the node 6 will be determined with reference to the node 2 which is arranged in (0,1). The coordinates of the node 6 are then determined as (0,2) with reference to the node 2 as is the case where the coordinates of the node 2 are determined as (0,1) with reference to the coordinates (0,0) of the node 1. The coordinate determination is conducted at S56 in FIG. 40.

Subsequently, at S58, the input node 3 of the node 6 is selected. Incidentally, the node 2 is another input node of the node 6, whereas it is selected previously and thus will not be selected again at S58. In the presence of the node 3 (N at S60), the stage is raised by one (Y'←Y−1) and the column is shifted to the left by one (X'←X−1) so as to check the arrangement of this node 3 (S62). Here, the input node arrangement mode is called recursively (S64) to check if the node 3 can be arranged in (X−1, Y−1), or (−1,1) in concrete terms. Since X<0 (Y at S50), the node 3 cannot be arranged in the coordinates (−1,1) (N at S66). X' is incremented by one (S68). Unless X' exceeds (X+1) (N at S70), it is checked if the node 3 can be arranged in the next coordinates, or (0,1) (S64). Since the node 2 is arranged in (0,1) already (Y at S52, N at S54), it is impossible to arrange the node 3 (N at S66). X' is further incremented by one (S68), and it is checked if the node 3 can be arranged in (1,1) (S64). Since $0 \leq X \leq X_{MAX}$ (N at S50) and (1,1) is vacant (N at S52), the node 3 is arranged in (1,1) (S56). Subsequently, since the node 3 has no input node other than the node 1 (Y at S60), the arrangement up to this point is regarded as succeeded and the processing exits the input node arrangement mode. This state appears in FIG. 30. Incidentally, if X' exceeds (X+1) at S70 (Y at S70), N and the input(s) of N are traced and erased (S72). In this case, the processing returns to S34 in FIG. 39.

Subsequently, since the arrangement in the input node arrangement mode (S32) is succeeded (Y at S34), the node arrangement check mode (S40) is performed, followed by the steps of S42 to S46. Consequently, the node 8 which inputs the output of the node 6 will be arranged in the same manner as described above. At S56, the node 8 can be arranged in (0,3) or (0,1). FIG. 31 shows the state where the node 8 is arranged in (0,3). FIG. 32 shows the state where the node 8 is arranged in (1,3). Subsequently, the node 7, an input node of the node 8, is selected at S58. The node 7 is arranged in (1,2) or (2,2) (S64). Furthermore, the node 4, an input node of the node 7, can be selected (S58) and arranged in (2,1). The node 4 arranged in (2,1), however, cannot be linked to the node 1 arranged in (0,0) due to the connection limitation. As a result, this arrangement is found to be failed.

Returning to the main flow of FIG. 38, an optimum state of arrangement is searched for in this way, starting the node 1 from (0,0). The search processing is performed with the setting that the node $N_0$ in the top stage is arranged in (0,0), until there is no output node $N_1$ finally (Y at S18). After the completion of the search processing, at S22, $X_0$ is incremented by one. The coordinates of the node 1 are thus set at (1,0) to redo searching. Incidentally, if all the nodes can be arranged with the node 1 arranged in (0,0), the main flow may be ended at this point. The searches are repeated while $X_0$ is smaller than or equal to $X_{MAX}$ (Y at S24). When $X_0$ exceeds $X_{MAX}$ (N at S24), this search processing is ended. As above, it is possible to reduce the number of searches significantly as compared to the case where full searches are performed on each stage. In addition, the nodes are assigned so as to be included in a sub DFG as many as possible. This allows efficient processing.

Eighth Embodiment

An eighth embodiment will deal with the processing of dividing a DFG.

Figure 27A:
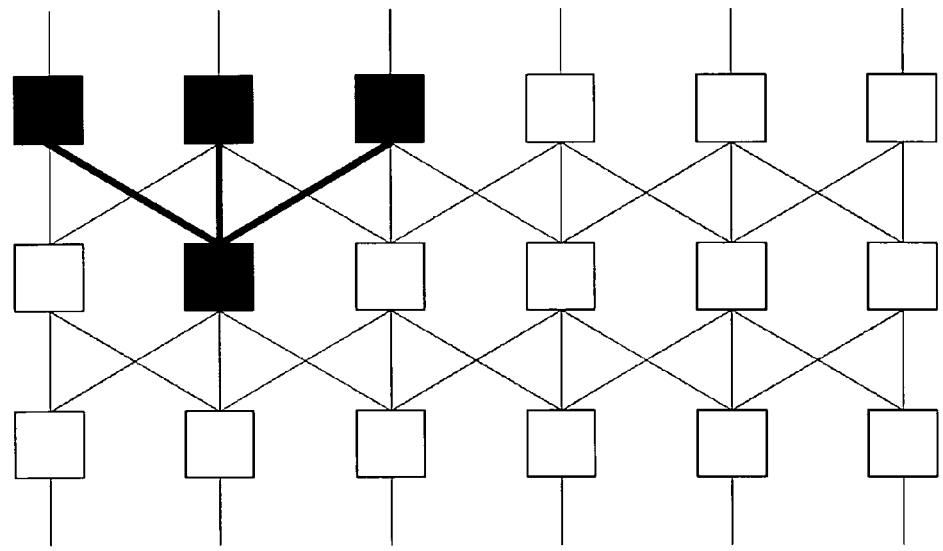
FIGS. 27(a) and 27(b) are diagrams showing the ALU array to which sub DFGs generated are assigned.
Figure 42:
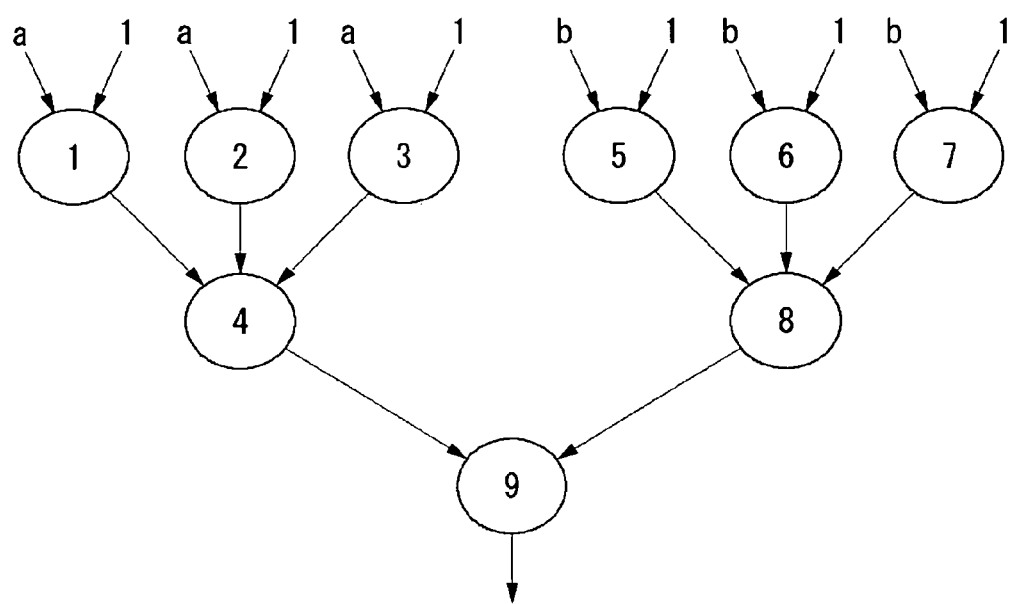
FIG. 42 is a diagram showing the state where node numbers are assigned to the individual nodes in FIG. 25.

FIG. 42 shows the state where node numbers are assigned to the individual nodes in FIG. 25. Initially, the nodes 1 to 4 shown to the left in FIG. 42 are assigned to the ALU array as shown in FIG. 27(a). The horizontal position of the node 9 which inputs the output of the node 4 is searched for in order of the lower left, directly below, and the lower right of the node 4. At each of the positions, the node 8 is arranged in the stage above the node 9, followed by the search as to the arrangement of its inputs, or the nodes 5 to 7. This search processing is the same as described in the seventh embodiment.

Figure 27B:
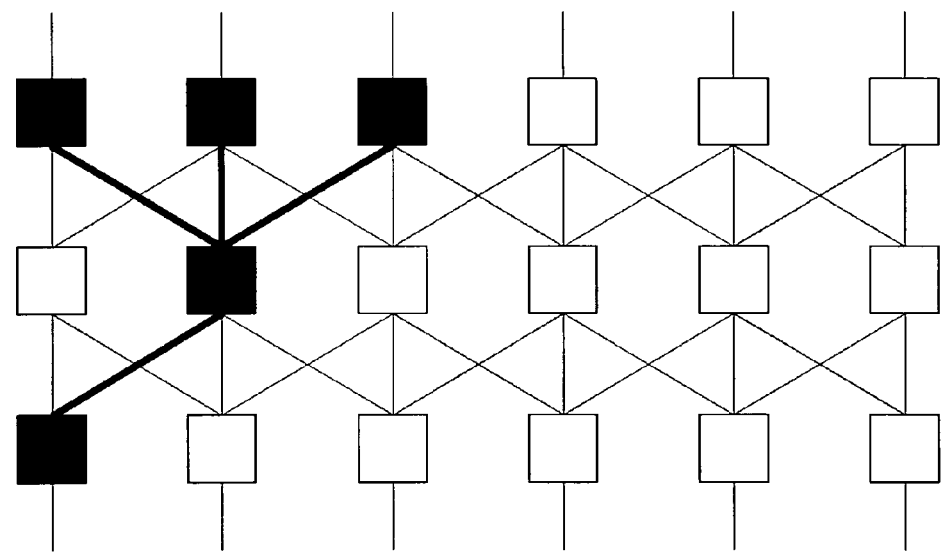

In this example, not all the input nodes 5 to 7 can be arranged with the node 9. Then, at the point when the arrangement of the node 9 is failed, the DFG is once cut out without the node 9. The remaining DFG is then subjected to assignment again. FIG. 27(b) shows the ALU array to which the remaining DFG is assigned. DFG division can be achieved thus. The divided sub DFGs may be ones stored in the node arrangement check mode which has been described in conjunction with FIG. 41 in the seventh embodiment. As stated previously, the state of arrangement with a maximum possible number of nodes arranged is held at S84. Based on this, the sub DFGs (or configuration information thereof) can be created. Incidentally, this state of arrangement is stored into the storing unit 34 (see FIG. 6) at S84. Through the use of such a dividing technique, nodes can be divided so as to be included in a sub DFG as many as possible. This allows efficient processing. Moreover, when the dividing technique is combined with the technique of combining sub DFGs to be described later, it is possible to reduce the number of sub DFGs as a whole.

Ninth Embodiment

Figure 43:
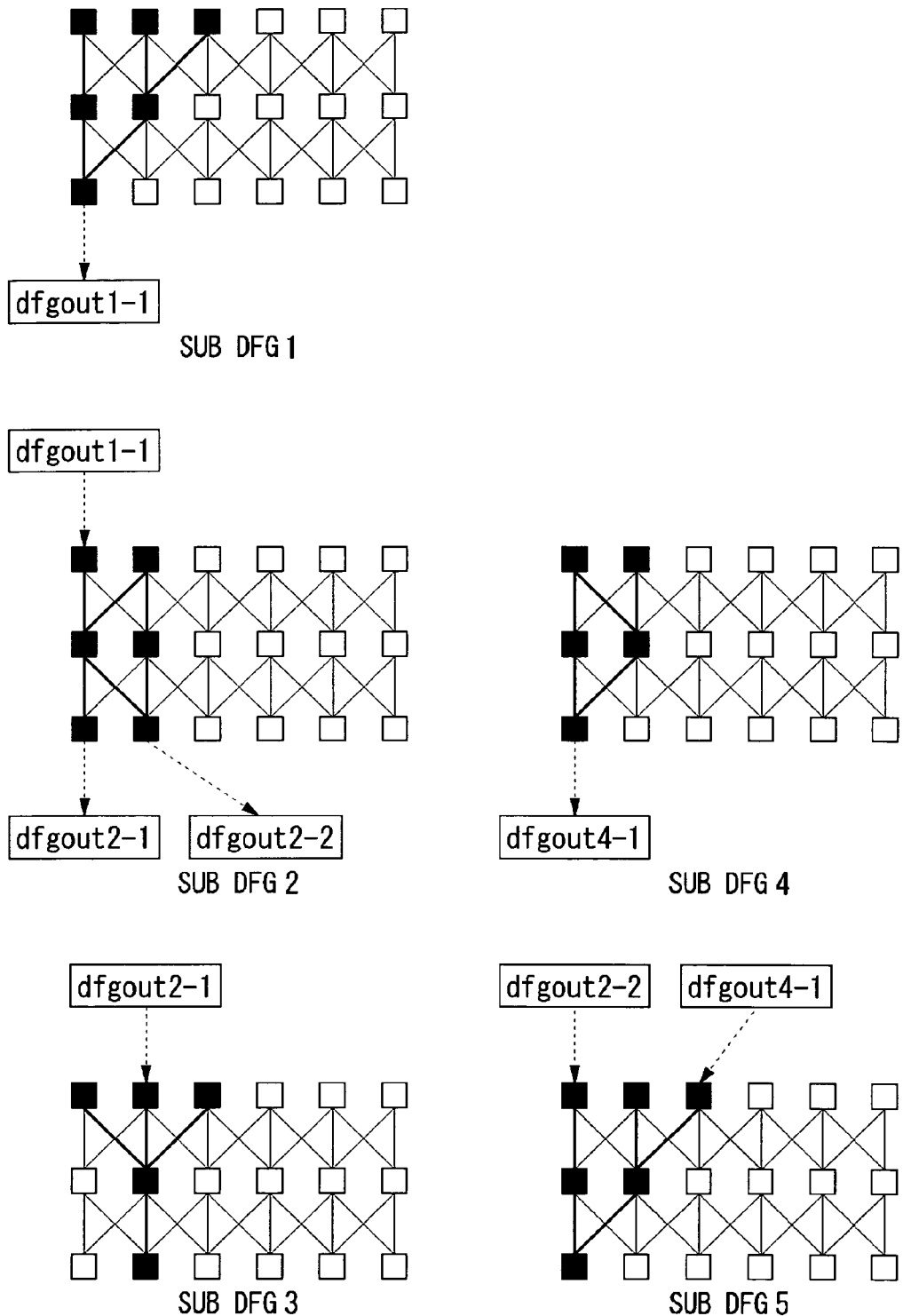
FIG. 43 is a diagram showing examples of sub DFGs obtained by division.

Next, the combination of sub DFGs will be described in conjunction with examples. FIG. 43 shows examples of sub DFGs obtained through division. As shown in FIGS. 3, 10, and others repeatedly, actual DFGs express the flows of processing indicating nodes and connections. For convenience of explanation, however, the DFGs shown here will be handled as equivalent to those mapped on the ALU array. In FIG. 43, "dfgoutx-x" represents output data of a sub DFG. For example, the output data dfgout1-1 of a sub DFG 1 is input to a sub DFG 2. The outputs dfgout2-1 and dfgout2-2 of the sub DFG 2 are input to sub DFGs 3 and 5, respectively. In the state after division, many ALUs having no node assigned thereto lie on the right of the ALU array. If a plurality of sub DFGs can be combined and processed integrally, the ALUs in use improve in parallelism, allowing speedup. It is impossible, however, to combine sub DFGs that input and output data mutually. For this reason, whether sub DFGs are combinable or not is judged initially, and if combinable, actual combination processing is performed. Whether sub DFGs are combinable or not may be judged by expressing the sub DFGs as a single node each and creating a DFG with the flow of input/output data as the data flow.

Returning to FIG. 6, the DFG generating unit 30 searches for sub DFGs corresponding to a plurality of circuits capable of simultaneous execution, and combines the same into a new DFG. The condition necessary for combinable sub DFGs is that they have independent inputs and outputs. The configuration information generating unit 32 generates configuration information from the combined DFG, and stores it into the storing unit 34. The control unit 18 supplies this configuration information to the reconfigurable circuit 12 through the setting unit 14. As a result, the plurality of circuits capable of simultaneous execution are formed on the reconfigurable circuit 12 at the same time.

Figure 44:
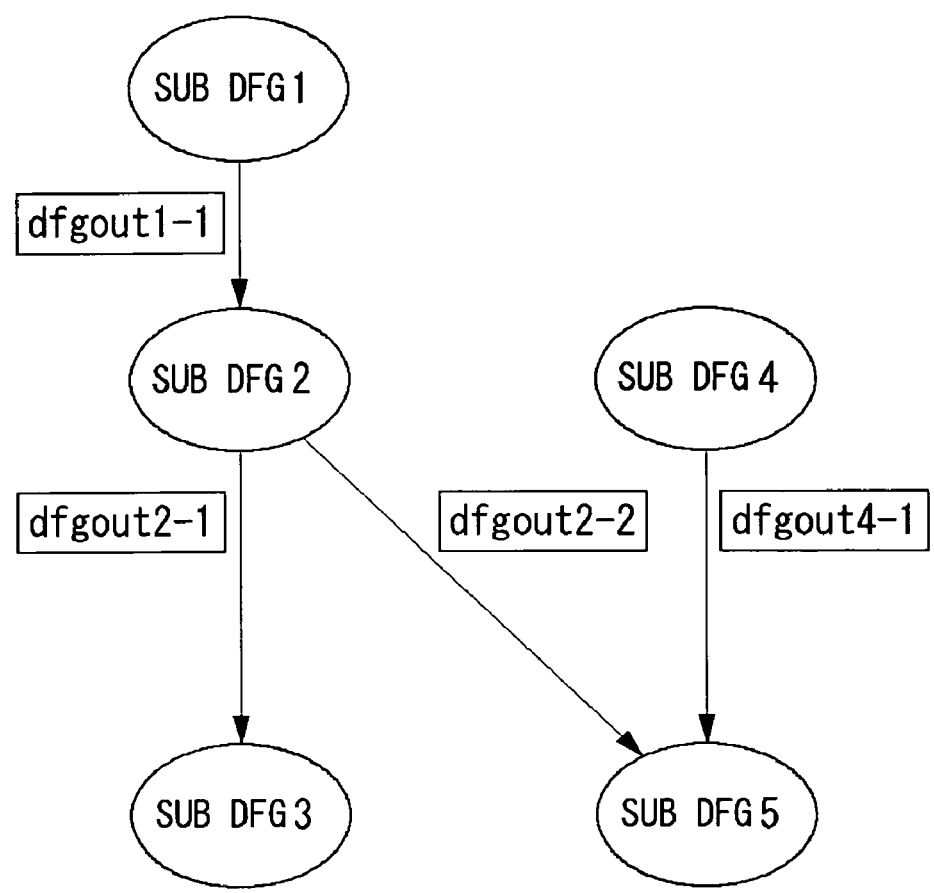
FIG. 44 is a diagram showing the data flow among the sub DFGs.

FIG. 44 shows the data flow among the sub DFGs. The DFG generating unit 30 searches for combinable sub DFGs based on the data flow of FIG. 44. It is impossible to combine the sub DFG 1 with the sub DFGs 2, 3, and 5 which receive the output of the sub DFG 1 directly or indirectly. In contract, the sub DFG 1 and the sub DFG 4 have no relationship with each other as to the reception of input/output data, and thus can be combined without problem.

Figure 45:
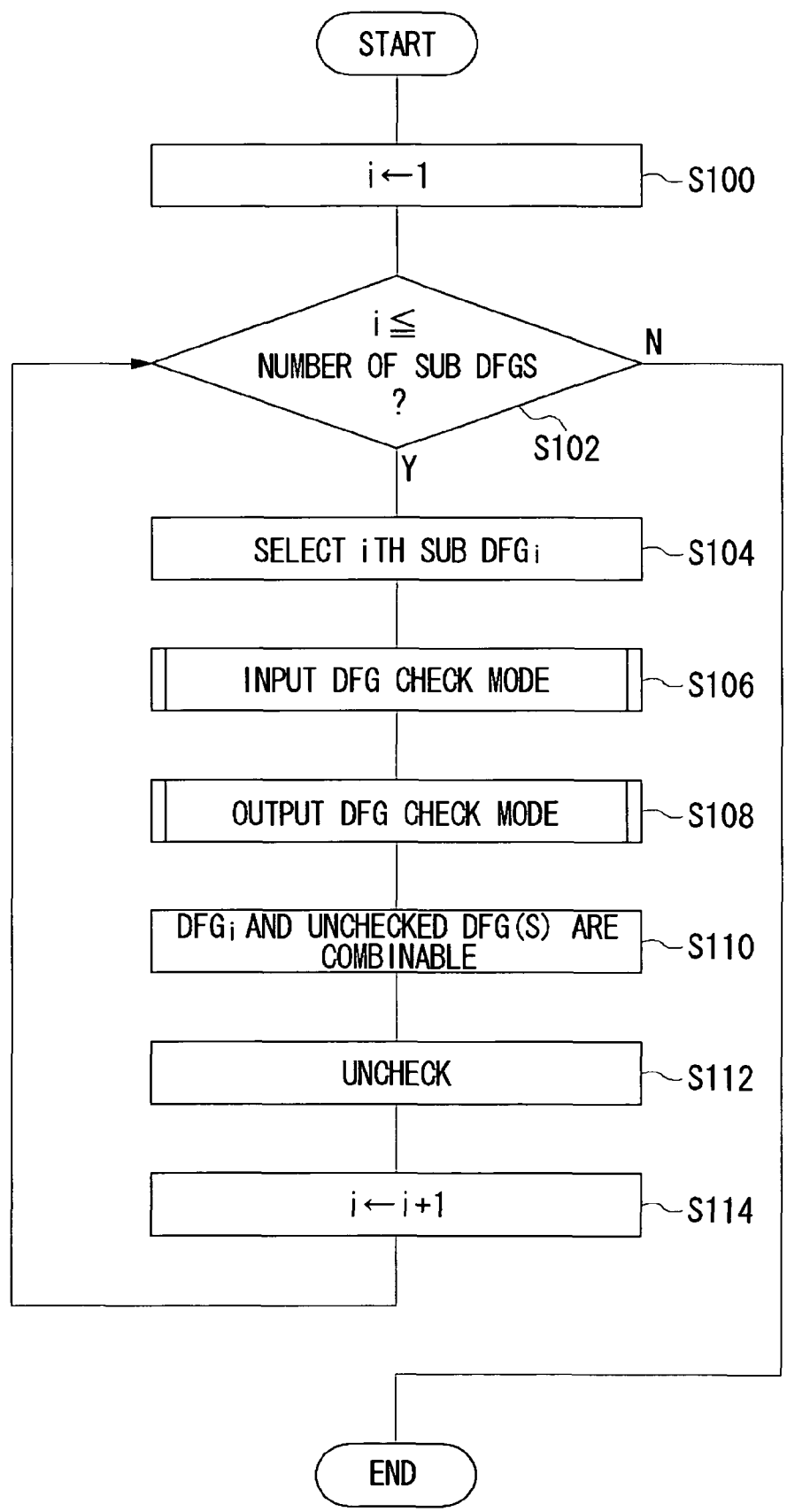
FIG. 45 is a flowchart for performing a combination judgment.

FIG. 45 is a flowchart for combination judgment. Initially, i is set at 1 (S100). If i is smaller than or equal to the number of sub DFGs (Y at S102), the ith sub DFGi is selected (S104). This sub DFGi is subjected to the processing in an input DFG check mode (S104) and an output DFG check mode (S108).

Figure 46:
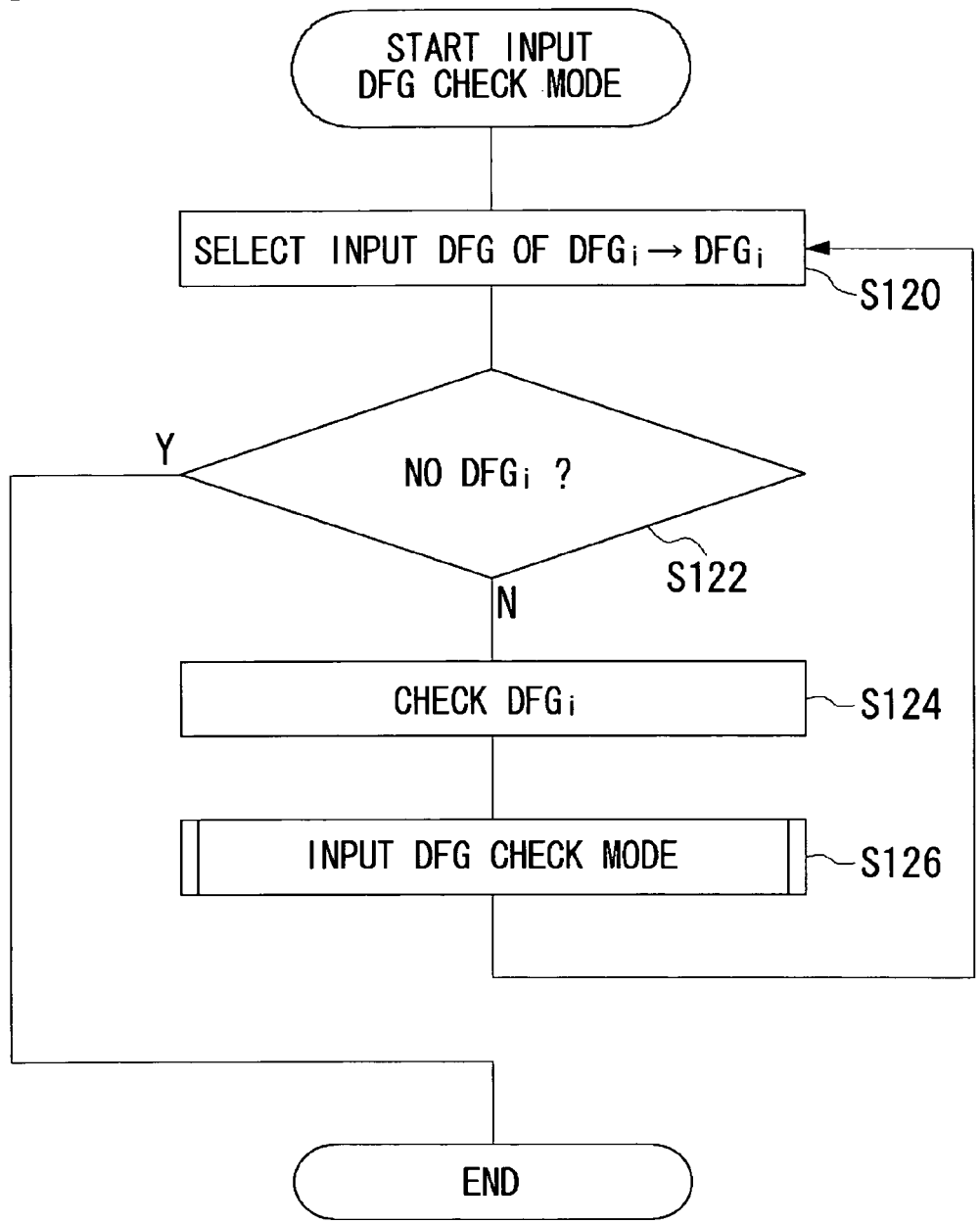
FIG. 46 is a processing flowchart in an input DFG check mode.

FIG. 46 is a processing flowchart in the input DFG check mode. Initially, an input DFG of the sub DFGi is selected (S120). The selected DFG is defined as a DFGi in the following flow. If there is no DFGi (Y at S122), it is determined that the sub DFGi selected at S104 has no input. Then, the processing in the input DFG check mode is ended. On the other hand, if there is any input DFGi (N at S122), the DFGi is checked (S124) before the processing in the input DFG check mode is repeated recursively (S126). This recursive processing is ended when there is no more input DFGi (Y at S122).

Figure 47:
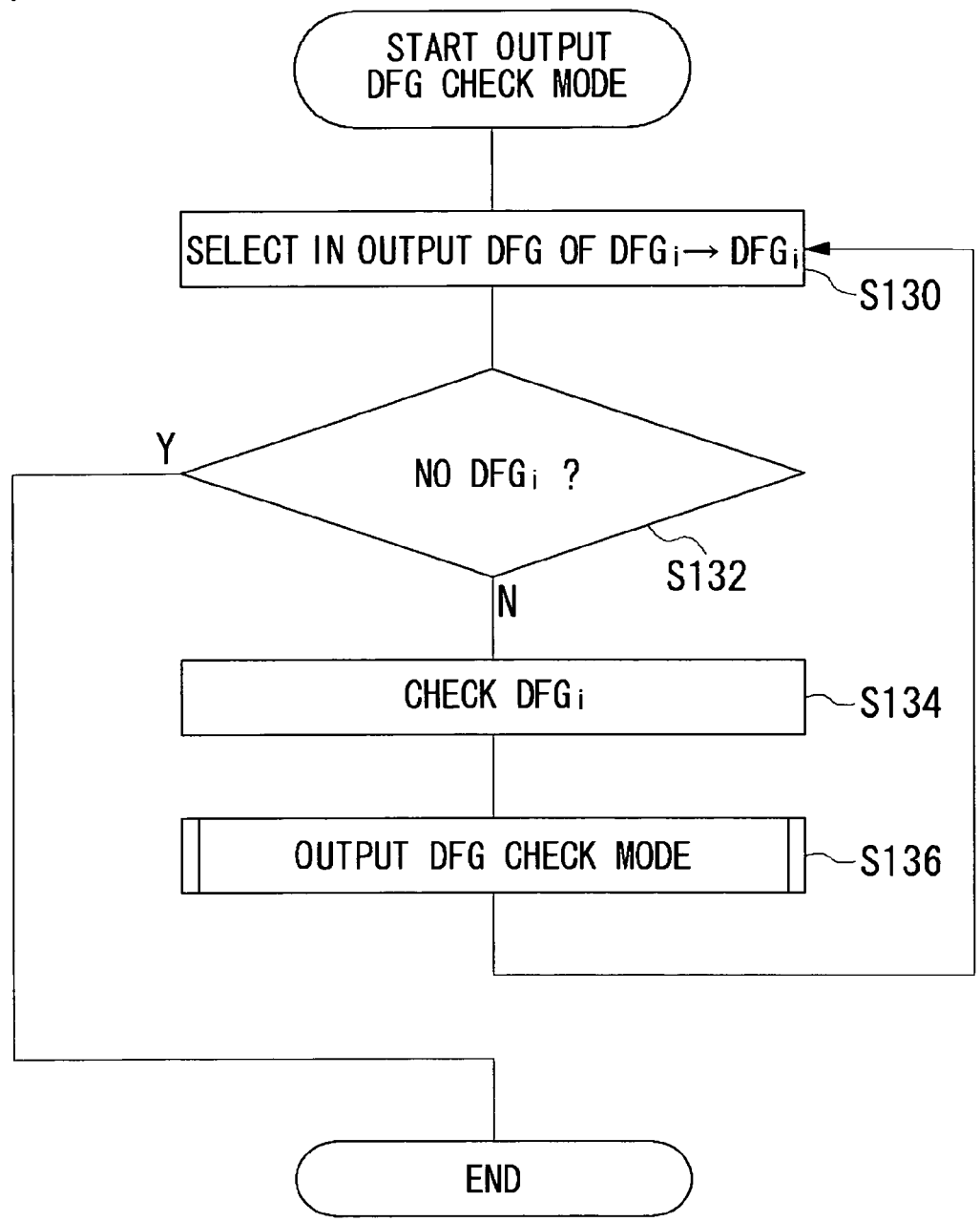
FIG. 47 is a processing flowchart in an output DFG check mode.

FIG. 47 is a processing flowchart in the output DFG check mode. Initially, an output DFG of the sub DFGi is selected (S130). The selected DFG is defined as a DFGi in the following flow. If there is no DFGi (Y at S132), it is determined that the sub DFGi selected at S104 has no output. Then, the processing in the output DFG check mode is ended. On the other hand, if there is any output DFGi (N at S132), the DFGi is checked (S134) before the processing in the output DFG check mode is repeated recursively (S136). This recursive processing is ended when there is no more output DFGi (Y at S132).

Returning to FIG. 45, it is found that DFGi can be combined with an unchecked sub DFG or DFGs (S110). That is, it is shown that the sub DFG(s) not checked in the input DFG check mode nor in the output DFG check mode and the sub DFGi have no effect on each other's processing. That is, the sub DFGi does not supply any input data to the unchecked sub DFG(s) directly or indirectly, nor require any output data from the unchecked sub DFG(s) directly or indirectly. The combinable sub DFG(s) is/are stored in association with the sub DFGi. Subsequently, all the sub DFGs are unchecked (S112), i is incremented by one (S114), and the processing for combination judgment is executed again. When i exceeds the number of sub DFGs (N at S102), this combination judgment processing is ended.

By using the foregoing flow, it can be seen that the sub DFG 1 and the sub DFG 4 are combinable in the example of FIG. 44. In the example of FIG. 44, it is also found that the combination of the sub DFG 2 and the sub DFG 4, the combination of the sub DFG 3 and the sub DFG 4, and the combination of the sub DFG 3 and the sub DFG 5 are possible. In this way, a plurality of sub DFGs can be combined into a single DFG. This increases the parallelism and allows speedup.

Up to this point, the present invention has been described in conjunction with the plurality of embodiments thereof. It should be noted that the present invention is not limited to these embodiments, and various modifications made thereto are also applicable as aspects of the present invention. In particular, while the present invention has been illustrated as the first to ninth embodiments, these embodiments may be used by themselves or in combination without departing from the scope of the present invention. For example, the foregoing embodiments have dealt with the method of determining the functions of logic circuits in the reconfigurable circuit 12. This method of determining functions is not limited to the reconfigurable circuit, but may be used for circuit design of other circuits such as fixed hardware. After circuit packaging, fixed hardware will not make such processing as dividing the DFG into a plurality of sections and regenerating circuits. Nevertheless, when the technique of the present invention is used in the stage of circuit design prior to the stage of device formation, it is possible to determine the functions and arrangement of circuit elements efficiently and form the circuit elements having the determined functions in the determined positions, thereby generating desired circuits. The determination of the circuit functions of the reconfigurable circuit 12 has involved the processing of associating DFG nodes with a plurality of ALUs. In the case of generating a fixed hardware circuit, the positions of arrangement of circuit elements onboard, such as the order of arrangement with other circuit elements, must also be determined since there is no ALU array. The rest of the processing is the same as in the foregoing embodiments. Consequently, it is possible to generate a desired circuit easily.

What is claimed is:
1. A processor comprising:
a reconfigurable circuit including:
a plurality of groups of logic circuits capable of changing functions; and
at least one connection unit arranged between the plurality of groups, being capable of establishing connection between the logic circuits of the plurality of groups selectively, wherein
a plurality of logic circuits are arranged in a matrix, and the plurality of logic circuits arranged in stages constitute respective groups of logic circuits so that a result of processing of a group in a prior stage is passed to a group of a subsequent stage in accordance with connection established selectively by the connection unit; and
logic circuits of the group in the subsequent stage that are capable of being connected with an output of a logic circuit in the prior stage are limited to a first circuit arranged in same column as the logic circuit in the prior stage, a second circuit arranged on the right of the first circuit, and a third circuit arranged on the left of the first circuit;
the processor further comprising:
a setting unit which supplies the reconfigurable circuit with configuration information for configuring a desired circuit;
a control unit which controls the setting unit to supply the reconfigurable circuit with configuration information; and
a path part which uni-directionally connects an output of a logic circuit in a final stage and an input of a logic circuit in a first stage of the identical reconfigurable circuit, wherein
no bi-directional bus connection is provided between the output of the logic circuit in the final stage and the input of the logic circuit in the first stage, and
the control unit controls the setting unit to supply the reconfigurable circuit with a plurality of pieces of configuration information in a plurality of cycles in succession, whereby the output of a circuit configured on the reconfigurable circuit based on a piece of configuration information is supplied to the input of a circuit configured based on a next piece of configuration information through the path part.

2. The processor according to claim 1, wherein a logic circuit of the group in the first stage is capable of being connected with an output of a first circuit arranged in the same column as the logic circuit in the final stage, a second circuit arranged on the right of the first circuit and a third circuit arranged on the left of the first circuit.

3. A processor comprising:
a reconfigurable circuit including:
a plurality of logic circuits capable of changing functions, arranged in stages constitute respective groups of logic circuits, and
a connection unit arranged between the stages, being capable of establishing connection between the logic circuits of the prior stage and the subsequent stage;
a processor further comprising a path part which uni-directionally connects an output of a logic circuit in a final stage and an input of a logic circuit in a first stage of the identical reconfigurable circuit, no bi-directional bus connection being provided between the output of the logic circuit in the final stage and the input of the logic circuit in the first stage.

* * * * *